(12) United States Patent
Umezaki

(10) Patent No.: US 9,899,101 B2
(45) Date of Patent: Feb. 20, 2018

(54) SEMICONDUCTOR DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 115 days.

(21) Appl. No.: 14/659,798

(22) Filed: Mar. 17, 2015

(65) Prior Publication Data
US 2015/0270011 A1 Sep. 24, 2015

(30) Foreign Application Priority Data
Mar. 19, 2014 (JP) .................................. 2014-055824

(51) Int. Cl.
*G11C 19/00* (2006.01)
*G11C 19/28* (2006.01)

(52) U.S. Cl.
CPC ..... *G11C 19/28* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 4,855,623 A * | 8/1989 | Flaherty | ................ | H03K 5/023 326/32 |
| 5,128,974 A | 7/1992 | Maekawa | | |
| 5,412,334 A | 5/1995 | Katsura | | |
| 5,883,529 A * | 3/1999 | Kumata | .................... | G06F 1/06 326/83 |
| 6,879,313 B1 * | 4/2005 | Kubota | ................ | G09G 3/3688 345/100 |

(Continued)

FOREIGN PATENT DOCUMENTS

| CN | 001722305 A | | 1/2006 |
|---|---|---|---|
| CN | 104269145 | * | 1/2015 |

(Continued)

OTHER PUBLICATIONS

US 8,983,022, 03/2015, Umezaki (withdrawn)
(Continued)

*Primary Examiner* — Tuan T Lam
(74) *Attorney, Agent, or Firm* — Fish & Richardson P.C.

(57) ABSTRACT

To reduce power consumption of a shift register. A semiconductor device includes a shift register. The shift register includes a plurality of stages. Any one of the stages includes first to fourth switches and a sequential circuit. The first switch and the second switch are electrically connected to each other in parallel between a first wiring and a second wiring. The third switch and the fourth switch are electrically connected to each other in series between a third wiring and the second wiring. The first wiring has a function of transmitting a clock signal. The third wiring has a function of transmitting a potential corresponding to a high or low level of the clock signal. A signal of the second wiring or a signal in accordance with the signal of the second wiring is input to a sequential circuit.

16 Claims, 37 Drawing Sheets

(56) References Cited

U.S. PATENT DOCUMENTS

| | | | |
|---|---|---|---|
| 7,768,329 B2* | 8/2010 | Kimura | G09G 3/20 |
| | | | 327/199 |
| 8,314,765 B2 | 11/2012 | Umezaki | |
| 8,774,347 B2 | 7/2014 | Umezaki | |
| 2001/0011987 A1* | 8/2001 | Kubota | G09G 3/3677 |
| | | | 345/98 |
| 2003/0174115 A1* | 9/2003 | Washio | G09G 3/3688 |
| | | | 345/98 |
| 2005/0259778 A1 | 11/2005 | Kimura | |
| 2006/0013352 A1 | 1/2006 | Lin et al. | |
| 2009/0121998 A1* | 5/2009 | Ohkawa | G09G 3/3688 |
| | | | 345/100 |
| 2010/0327955 A1 | 12/2010 | Umezaki | |
| 2016/0189797 A1* | 6/2016 | Yamamoto | G11C 19/28 |
| | | | 377/64 |

FOREIGN PATENT DOCUMENTS

| | | | |
|---|---|---|---|
| CN | 104361853 | * | 2/2015 |
| EP | 1056069 | A | 11/2000 |
| JP | 03-147598 | A | 6/1991 |
| JP | 03-198520 | A | 8/1991 |
| JP | 04-068714 | A | 3/1992 |
| JP | 2000-339984 | A | 12/2000 |
| JP | 2001-216796 | A | 8/2001 |
| JP | 2006-012389 | A | 1/2006 |
| JP | 2006-031908 | A | 2/2006 |
| KR | 10-0210335 | | 7/1999 |
| KR | 2001-0083157 | A | 8/2001 |
| KR | 10-0381063 | | 4/2003 |

OTHER PUBLICATIONS

Computer Engineer Hardward Design, by Morris Mano,1988, pp. 120-125.*
English translation of CN104269145, Jan. 7, 2015 by Yin et al.*
International Search Report (Application No. PCT/IB2015/051718) dated Jun. 9, 2015.
Written Opinion (Application No. PCT/IB2015/051718) dated Jun. 9, 2015.

* cited by examiner

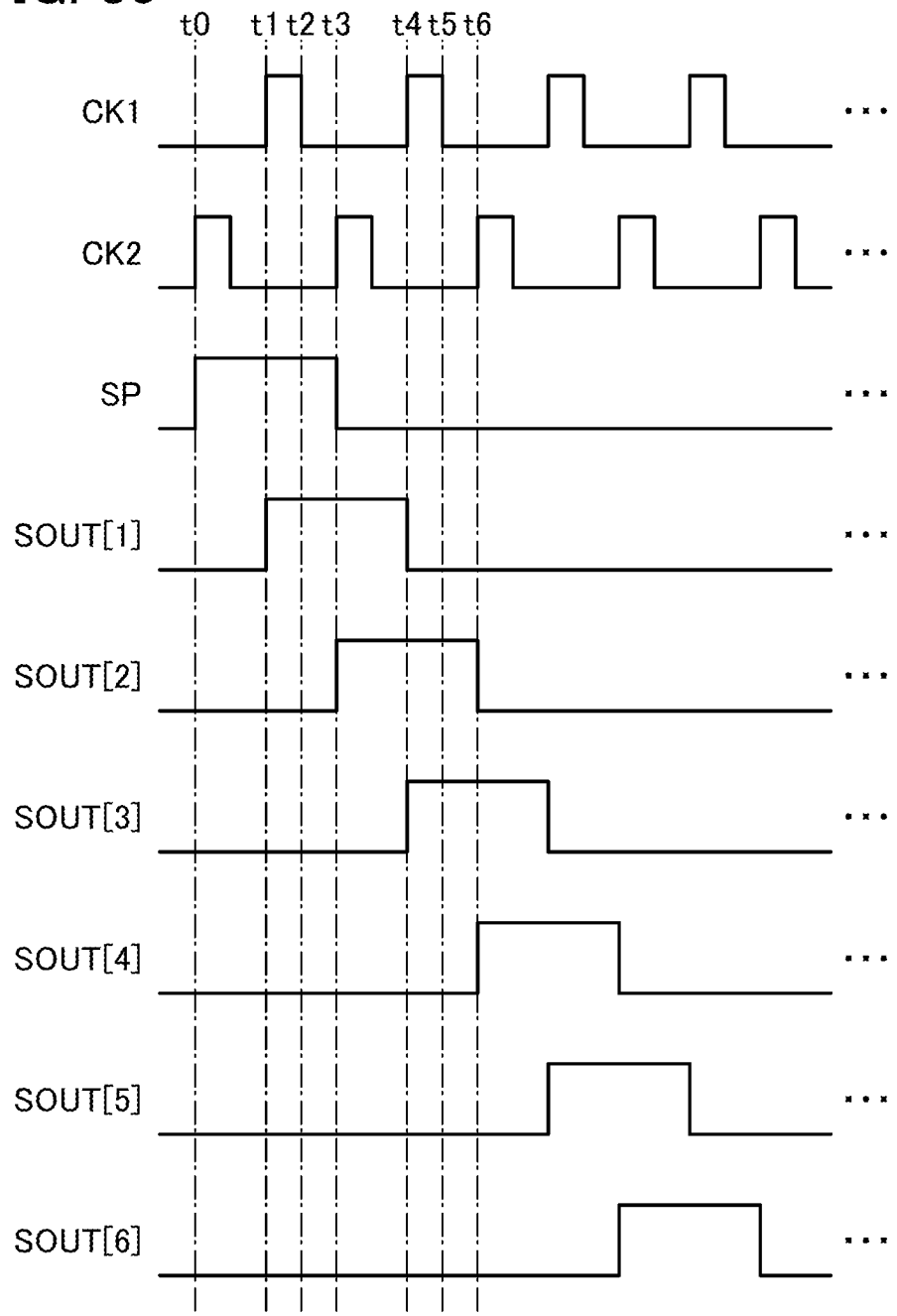

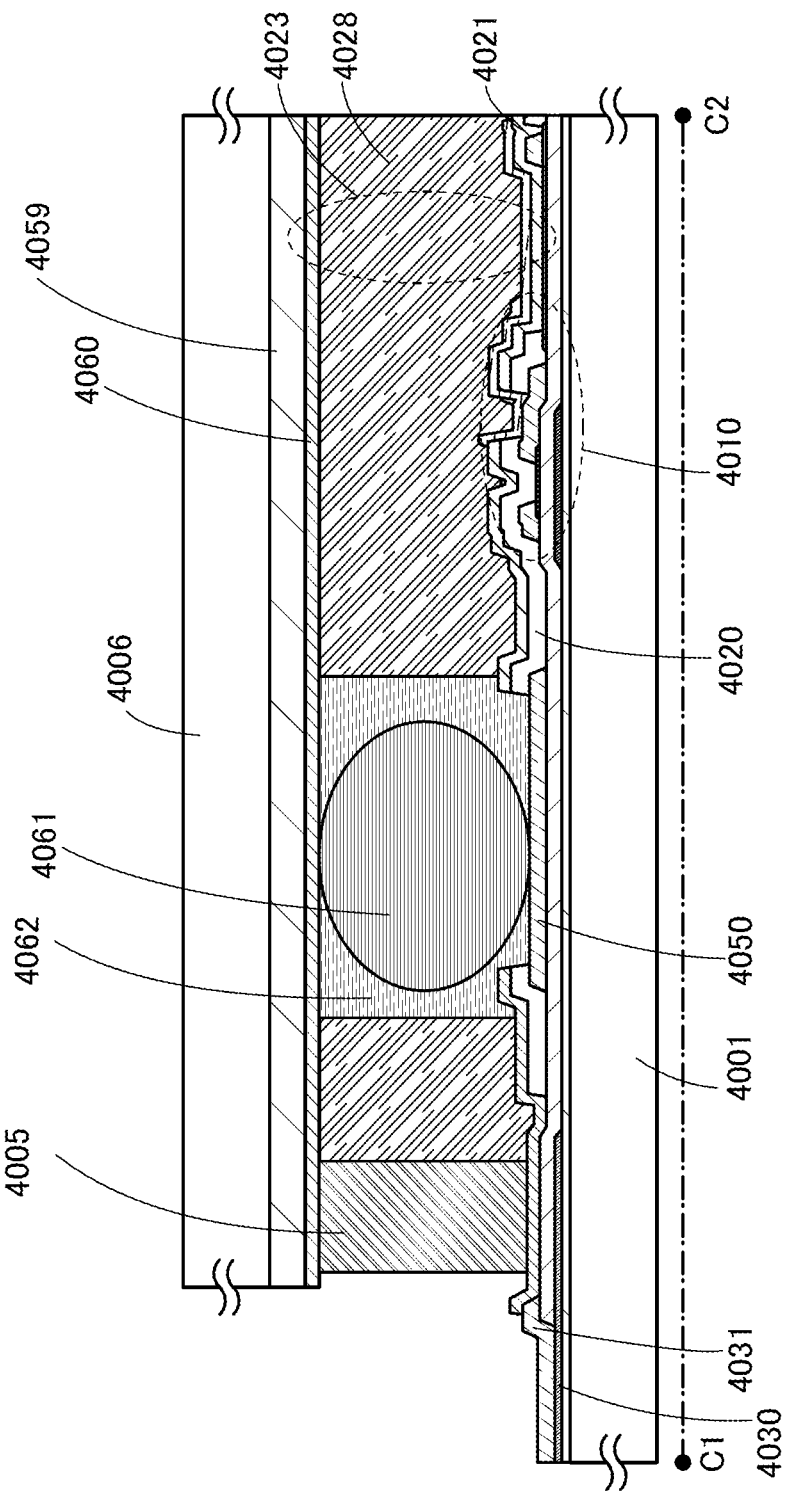

SEMICONDUCTOR DEVICE

TECHNICAL FIELD

One embodiment of the present invention relates to a semiconductor device, a display device, a display module, and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A shift register is disclosed in Patent Document 1. The shift register disclosed in Patent Document 1 obtains an output signal by sequentially shifting a start pulse in synchronization with a clock signal.

REFERENCE

Patent Document

[Patent Document 1] Japanese Published Patent Application No. 2006-031908

DISCLOSURE OF INVENTION

In general, in the case where a clock signal is directly input to a gate of a transistor in a shift register, a load of a wiring to which the clock signal is input becomes high, increasing power consumption.

An object of one embodiment of the present invention is to reduce power consumption or to provide a configuration capable of achieving it. Another object of one embodiment of the present invention is to reduce a load of a wiring or to provide a configuration capable of achieving it. Another object of one embodiment of the present invention is to provide a novel configuration, in particular, to provide a novel configuration that can be applied to a shift register. Another object of one embodiment of the present invention is to reduce the number of switching on/off states of a transistor or to provide a configuration capable of achieving it.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device of one embodiment of the present invention includes a shift register. The shift register includes a plurality of stages. Any one of the stages includes first to fourth switches and a sequential circuit. The first switch and the second switch are electrically connected to each other in parallel between a first wiring and a second wiring. The third switch and the fourth switch are electrically connected to each other in series between a third wiring and the second wiring. The first wiring has a function of transmitting a clock signal. The third wiring has a function of transmitting a potential corresponding to a high or low level of the clock signal. A signal of the second wiring or a signal in accordance with the signal of the second wiring is input to a sequential circuit.

In the above embodiment of the present invention, the sequential circuit may include a first circuit. The signal of the second wiring or the signal in accordance with the signal of the second wiring is input to a terminal that determines whether an output of the first circuit is set at a high level.

In the above embodiment of the present invention, the sequential circuit may include a logic circuit. To the logic circuit, at least the signal of the second wiring or the signal in accordance with the signal of the second wiring is input.

In the above embodiment of the present invention, an output signal of a previous stage or a signal in accordance with the output signal of a previous stage may be input to a terminal that controls the on/off state of the first switch.

In the above embodiment of the present invention, an output signal of a subsequent stage or a signal in accordance with the output signal of a subsequent stage may be input to a terminal that controls the on/off state of the second switch.

In the above embodiment of the present invention, an output signal of a previous stage or a signal in accordance with the output signal of a previous stage may be input to a terminal that controls the on/off state of the third switch.

In the above embodiment of the present invention, an output signal of a subsequent stage or a signal in accordance with the output signal of a subsequent stage may be input to a terminal that controls the on/off state of the fourth switch.

In the above embodiment of the present invention, the shift register may include fifth to eighth switches. A first terminal of the fifth switch is electrically connected to a fourth wiring. A first terminal of the sixth switch is electrically connected to a fifth wiring or the third wiring. A second terminal of the sixth switch is electrically connected to a second terminal of the fifth switch. A first terminal of the seventh switch is electrically connected to a sixth wiring. A first terminal of the eighth switch is electrically connected to a seventh wiring or the third wiring. A second terminal of the eighth switch is electrically connected to a second terminal of the seventh switch. An output signal of the sequential circuit or a signal in accordance with the output signal of the sequential circuit is input to a terminal that controls the on/off state of the fifth switch. An output signal of the sequential circuit or a signal in accordance with the output signal of the sequential circuit is input to a terminal that controls the on/off state of the sixth switch. An output signal of the sequential circuit or a signal in accordance with the output signal of the sequential circuit is input to a terminal that controls the on/off state of the seventh switch. An output signal of the sequential circuit or a signal in accordance with the output signal of the sequential circuit is input to a terminal that controls the on/off state of the eighth switch. The fourth wiring has a function of transmitting a second clock signal. The fifth wiring has a function of transmitting a potential corresponding to a high or low level of the second clock signal. The sixth wiring has a function of transmitting a third clock signal. The seventh wiring has a function of transmitting a potential corresponding to a high or low level of the third clock signal.

One embodiment of the present invention can reduce power consumption. One embodiment of the present invention can reduce a load of a wiring. One embodiment of the present invention can provide a novel configuration. One embodiment of the present invention can reduce the number of switching on/off states of a transistor.

Note that the descriptions of these effects do not disturb the existence of other effects. One embodiment of the present invention does not necessarily have all the effects. Other effects will be apparent from and can be derived from the description of the specification, the drawings, the claims, and the like.

BRIEF DESCRIPTION OF DRAWINGS

FIG. 30 illustrates operations of a device.
FIG. 36 is a cross-sectional view of a liquid crystal display device.

BEST MODE FOR CARRYING OUT THE INVENTION

Figure 1:
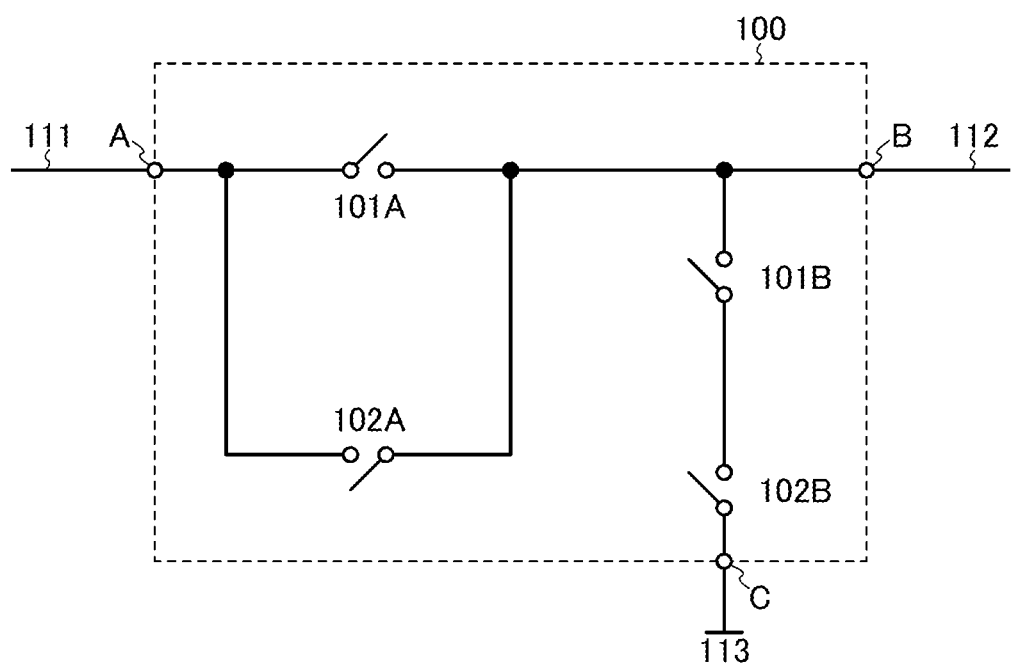
FIG. 1 illustrates a configuration of a device.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

One embodiment of the present invention includes, in its category, any semiconductor device using a transistor, such as an integrated circuit, an RF tag, and a semiconductor display device. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). Furthermore, the semiconductor display device includes, in its category, semiconductor display devices in which circuit elements including semiconductor films are included in driver circuits, such as liquid crystal display devices, light-emitting devices in which a light-emitting element typified by an organic light-emitting element (OLED) is provided in each pixel, electronic paper, digital micromirror devices (DMDs), plasma display panels (PDPs), and field emission displays (FEDs).

In this specification, the semiconductor display device includes, in its category, panels in which a display element such as a liquid crystal element or a light-emitting element is provided for each pixel, and modules in which an IC or the like including a controller is mounted on the panel.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials supplied to the terminals. In general, in an n-channel transistor, a terminal to which a lower potential is supplied is called a source, and a terminal to which a higher potential is supplied is called a drain. Furthermore, in a p-channel transistor, a terminal to which a lower potential is supplied is called a drain, and a terminal to which a higher potential is supplied is called a source. In this specification, although connection relation of the transistor is described assuming that the source and the drain are fixed in some cases for convenience, actually, the names of the source and the drain interchange with each other depending on the relation of the potentials.

Embodiment 1

In this embodiment, a device of one embodiment of the present invention is described.

FIG. 1 illustrates an example of the structure of a device of one embodiment of the present invention.

The device illustrated in FIG. 1 includes a circuit 100. The circuit 100 is a basic circuit included in the device of one embodiment of the present invention.

A terminal A of the circuit 100 is connected to a wiring 111, a terminal B thereof is connected to a wiring 112, and a terminal C thereof is connected to a wiring 113.

The circuit 100 includes a switch 101A, a switch 101B, a switch 102A, and a switch 102B. A first terminal of the switch 101A is connected to the wiring 111, and a second terminal thereof is connected to the wiring 112. A first terminal of the switch 101B is connected to a second terminal of the switch 102B, and a second terminal thereof is connected to the wiring 112. A first terminal of the switch 102A is connected to the wiring 111, and a second terminal thereof is connected to the wiring 112. A first terminal of the switch 102B is connected to the wiring 113, and the second terminal thereof is connected to the second terminal of the switch 101B. That is, the switch 101A and the switch 102A are connected to each other in parallel between the wiring 111 and the wiring 112. The switch 101B and the switch 102B are connected to each other in series between the wiring 113 and the wiring 112.

The circuit 100 has a function of determining the conduction state between the wiring 111 and the wiring 112 and the conduction state between the wiring 113 and the wiring 112. When the wiring 111 and the wiring 112 are brought into conduction, a signal of the wiring 111 (also referred to as a signal $V_{111}$) is supplied to the wiring 112. When the wiring 113 and the wiring 112 are brought into conduction, a potential of the wiring 113 (also referred to as a potential $V_{113}$) is supplied to the wiring 112. In other words, the circuit 100 has a function of determining whether the signal $V_{111}$ is supplied to the wiring 112 and whether the potential $V_{113}$ is supplied to the wiring 112.

By controlling the on/off states of the switches 101A, 101B, 102A, and 102B, the conduction state between the wiring 111 and the wiring 112 and the conduction state between the wiring 113 and the wiring 112 can be determined. When one or both of the switches 101A and 102A are on, the wiring 111 and the wiring 112 are brought into conduction. When both of the switches 101A and 102A are off, the wiring 111 and the wiring 112 are brought out of conduction. When both of the switches 101B and 102B are on, the wiring 113 and the wiring 112 are brought into conduction. When one or both of the switches 101B and 102B are off, the wiring 113 and the wiring 112 are brought out of conduction.

A signal of the wiring 112 (also referred to as a signal $V_{112}$) is controlled in accordance with the signal $V_{111}$ and the potential $V_{113}$. In the case where the signal $V_{111}$ is supplied to the wiring 112, the signal $V_{112}$ has the same or substantially the same potential as the signal $V_{111}$. In the case where the potential $V_{113}$ is supplied to the wiring 112, the signal $V_{112}$ has the same or substantially the same potential as the signal $V_{113}$.

A signal having a high level and a low level, i.e., a digital signal, is given as the signal $V_{111}$. Specifically, the signal $V_{111}$ is preferably a clock signal. Accordingly, in the case where the signal $V_{111}$ is supplied to the wiring 112, when the signal $V_{111}$ is at a high level, the signal $V_{112}$ is also at a high level; when the signal $V_{111}$ is at a low level, the signal $V_{112}$ is also at a low level. Note that the present invention is not limited to this.

The potential $V_{113}$ is, for example, a potential corresponding to a low level of the signal $V_{111}$. Accordingly, in the case where the potential $V_{113}$ is supplied to the wiring 112, the signal $V_{112}$ is at a low level. Note that the present invention is not limited to this. The potential $V_{113}$ may be a potential corresponding to a high level of the signal $V_{111}$.

Note that in this specification and the like, a potential corresponding to a low or high level of a signal refers to a potential that is the same or substantially the same as the low or high level of the signal.

When the wirings 111 and 112 are brought into conduction, the wirings 113 and 112 are preferably brought out of conduction. Similarly, when the wirings 111 and 112 are brought out of conduction, the wirings 113 and 112 are preferably brought into conduction. In that case, the signal $V_{111}$ and the potential $V_{113}$ can be prevented from being supplied to the wiring 112 at the same time.

For example, when one or both of the switches 101A and 102A are on, one or both of the switches 101B and 102B are preferably off. In that case, the wiring 111 and the wiring 112 are brought into conduction, and the wiring 113 and the wiring 112 are brought out of conduction.

For example, when both of the switches 101B and 102B are on, both of the switches 101A and 102A are preferably off. In that case, the wiring 111 and the wiring 112 are brought out of conduction, and the wiring 113 and the wiring 112 are brought into conduction.

There can be a period in which the conduction state between the wiring 111 and the wiring 112 is the same as the conduction state between the wiring 113 and the wiring 112. Note that in one operation period, such a period is preferably shorter than a period in which the conduction state between the wiring 111 and the wiring 112 is different from the conduction state between the wiring 113 and the wiring 112 (e.g., a period in which the wirings 111 and 112 are brought into conduction and the wirings 113 and 112 are brought out of conduction).

Note that in the case of a shift register, one operation period is from a time when a start pulse is input to a time when the next start pulse is input, for example. In other words, the one operation period is from a time when a start pulse is activated to a time when the start pulse is activated again. In the case of a display device, one operation period corresponds to one frame period, one horizontal period, or one vertical period. Alternatively, one operation period corresponds to one cycle period of a clock signal.

When one of the switches 101A and 101B is on, the other is preferably off. Similarly, when one of the switches 102A and 102B is on, the other is preferably off. Even in such a case, when the wirings 111 and 112 are brought into conduction, the wirings 113 and 112 can be brought out of conduction, and vice versa.

For example, when the switch 101A is on, the switch 101B is off, and when the switch 102A is on, the switch 102B is off. In that case, the wiring 111 and the wiring 112 are brought into conduction, and the wiring 113 and the wiring 112 are brought out of conduction.

For example, when the switch 101A is on, the switch 101B is off, and when the switch 102A is off, the switch 102B is on. In that case, the wiring 111 and the wiring 112 are brought into conduction, and the wiring 113 and the wiring 112 are brought out of conduction.

For example, when the switch 101A is off, the switch 101B is on, and when the switch 102A is on, the switch 102B is off. In that case, the wiring 111 and the wiring 112 are brought into conduction, and the wiring 113 and the wiring 112 are brought out of conduction.

For example, when the switch 101A is off, the switch 101B is on, and when the switch 102A is off, the switch 102B is on. In that case, the wiring 111 and the wiring 112 are brought out of conduction, and the wiring 113 and the wiring 112 are brought into conduction.

There can be a period in which both of the switches 101A and 101B are on, or the both are off. Note that in one operation period, such a period is preferably shorter than the period in which one of the switches 101A and 101B is on and the other is off.

There can be a period in which both of the switches 102A and 102B are on, or the both are off. Note that in one operation period, such a period is preferably shorter than the period in which one of the switches 102A and 102B is on and the other is off.

Next, a configuration example for controlling the switch 101A, the switch 101B, the switch 102A, and the switch 102B is described.

The switch 101A and the switch 101B are preferably controlled by the same signal. Similarly, the switch 102A and the switch 102B are preferably controlled by the same signal. Thus, the kinds of signals can be reduced.

Note that in this specification and the like, the phrase "an element such as a switch or a transistor is controlled by a signal" means not only the case where the element is controlled directly by the signal but also the case where the element is controlled by a signal in accordance with the signal or the case where the element is controlled by both of the signal and the signal in accordance with the signal.

In this specification and the like, a second signal in accordance with a first signal is an output signal or the like of a circuit (for example, a logic circuit, a combinational circuit, or a sequential circuit) to which the first signal is input.

In this specification and the like, the phrase "two switches are controlled by the same signal" means not only the case where the two switches are controlled by the same signal, but also the case where one switch is controlled by a first signal and the other switch is controlled by a second signal, and the second signal is a signal in accordance with the first signal.

Figure 2:
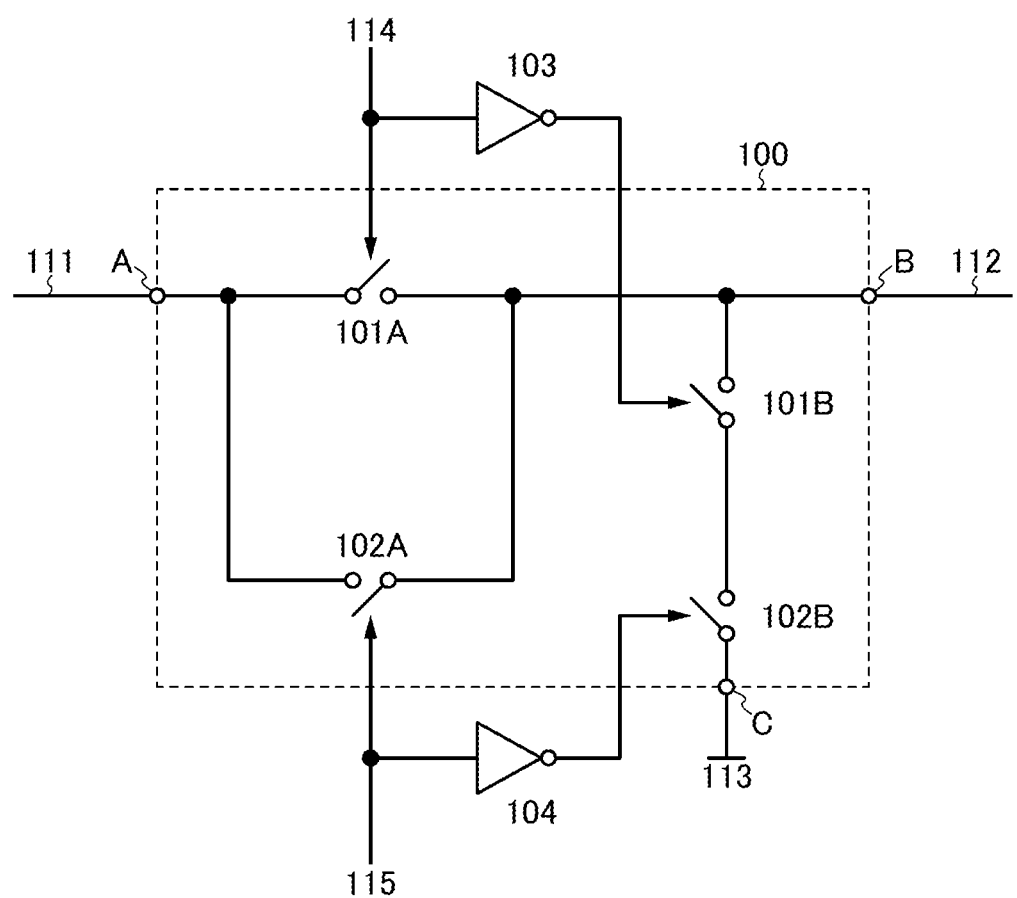
FIG. 2 illustrates a configuration of a device.

FIG. 2 illustrates a configuration example of the circuit 100 illustrated in FIG. 1, in which the switch 101A is controlled by a signal of the wiring 114 (also referred to as a signal $V_{114}$), the switch 101B is controlled by an inversion signal of the signal $V_{114}$, the switch 102A is controlled by a signal of the wiring 115 (also referred to as a signal $V_{115}$), and the switch 102B is controlled by an inversion signal of the signal $V_{115}$.

The wiring 114 is connected to a terminal that controls the on/off state (also referred to as a control terminal) of the switch 101A, and to a control terminal of the switch 101B via an inverter 103.

The wiring 115 is connected to a control terminal of the switch 102A, and to a control terminal of the switch 102B via an inverter 104.

Note that the circuit 100 may include the inverter 103 and the inverter 104.

The configuration for controlling the switch 101A, the switch 101B, the switch 102A, and the switch 102B is not limited to the configuration illustrated in FIG. 2.

Figure 3:
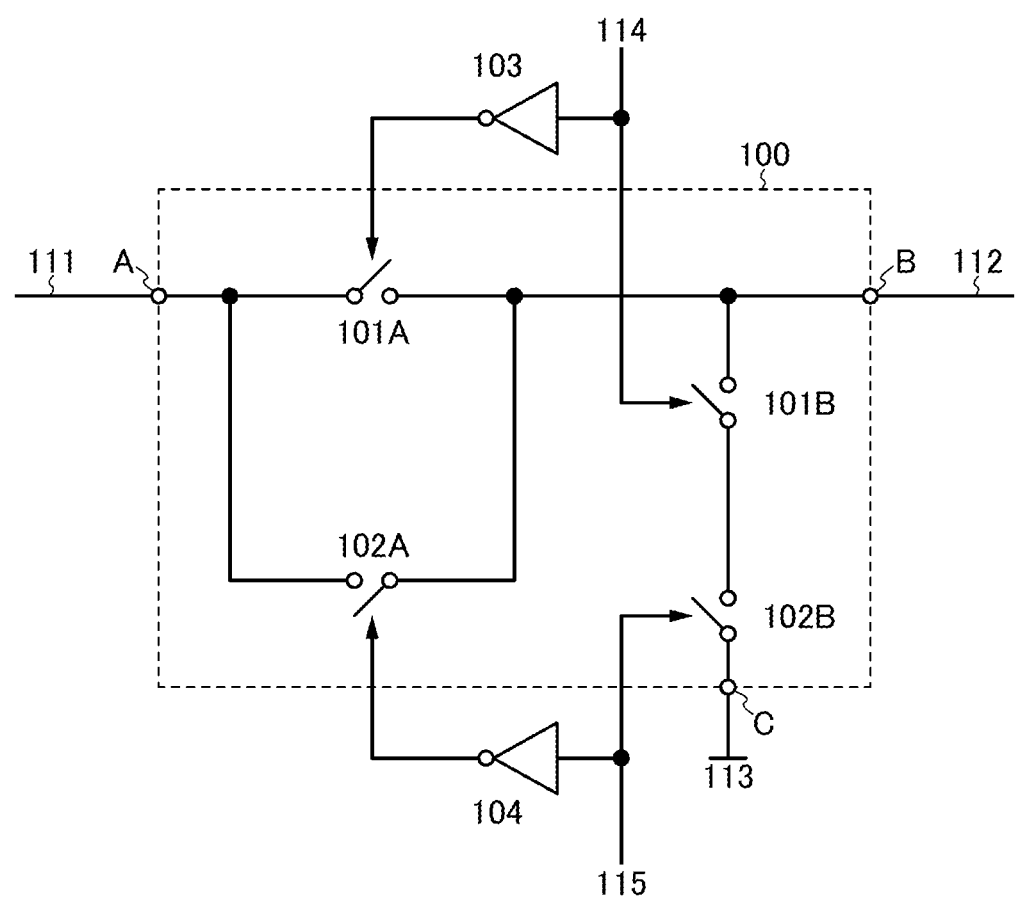
FIG. 3 illustrates a configuration of a device.

For example, as illustrated in FIG. 3, the switch 101B may be controlled by the signal $V_{114}$, and the switch 101A may be controlled by the inversion signal of the signal $V_{114}$. In that case, the wiring 114 is connected to a control terminal of the switch 101B, and to a control terminal of the switch 101A via the inverter 103.

For example, as illustrated in FIG. 3, the switch 102B may be controlled by the signal $V_{115}$, and the switch 102A may be controlled by the inversion signal of the signal $V_{115}$. In that case, the wiring 115 is connected to a control terminal of the switch 102B, and to a control terminal of the switch 102A via the inverter 104.

Figure 4:
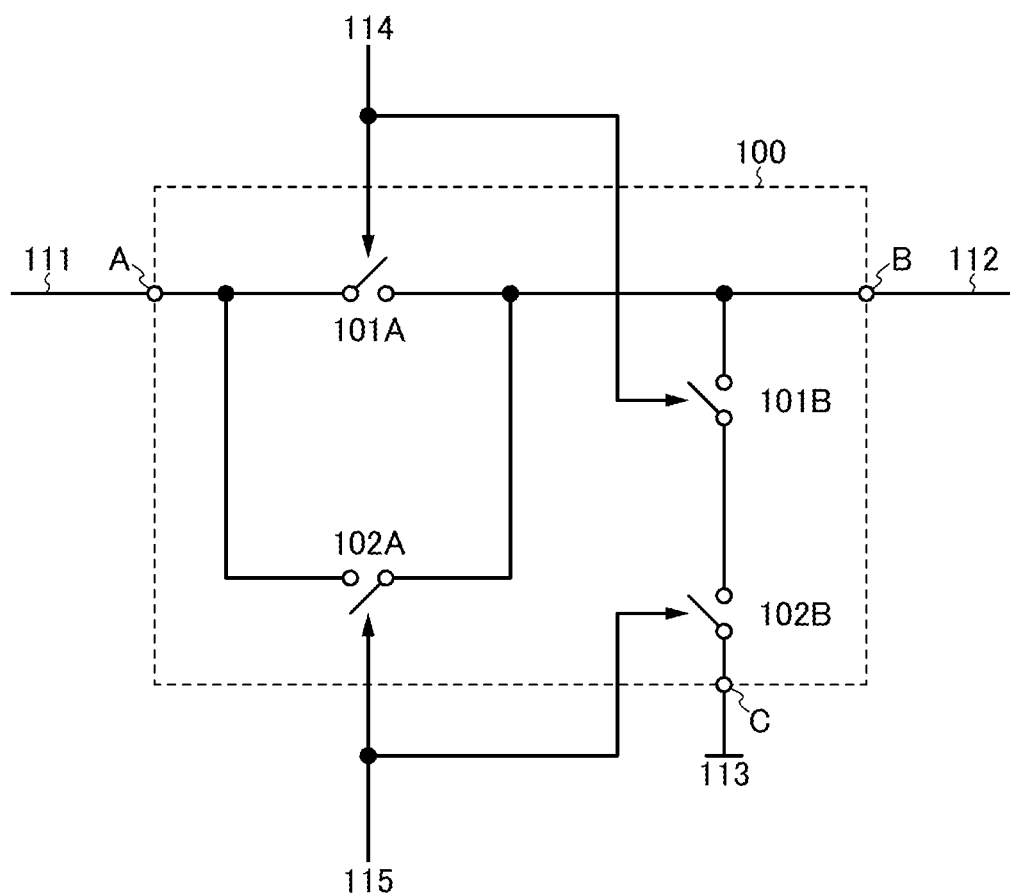
FIG. 4 illustrates a configuration of a device.

For example, as illustrated in FIG. 4, both of the switches 101A and 101B may be controlled by the signal $V_{114}$. In that case, the wiring 114 is connected to a control terminal of the switch 101A and a control terminal of the switch 101B.

For example, as illustrated in FIG. 4, both of the switches 102A and 102B may be controlled by the signal $V_{115}$. In that case, the wiring 115 is connected to a control terminal of the switch 102A and a control terminal of the switch 102B.

Figure 5:
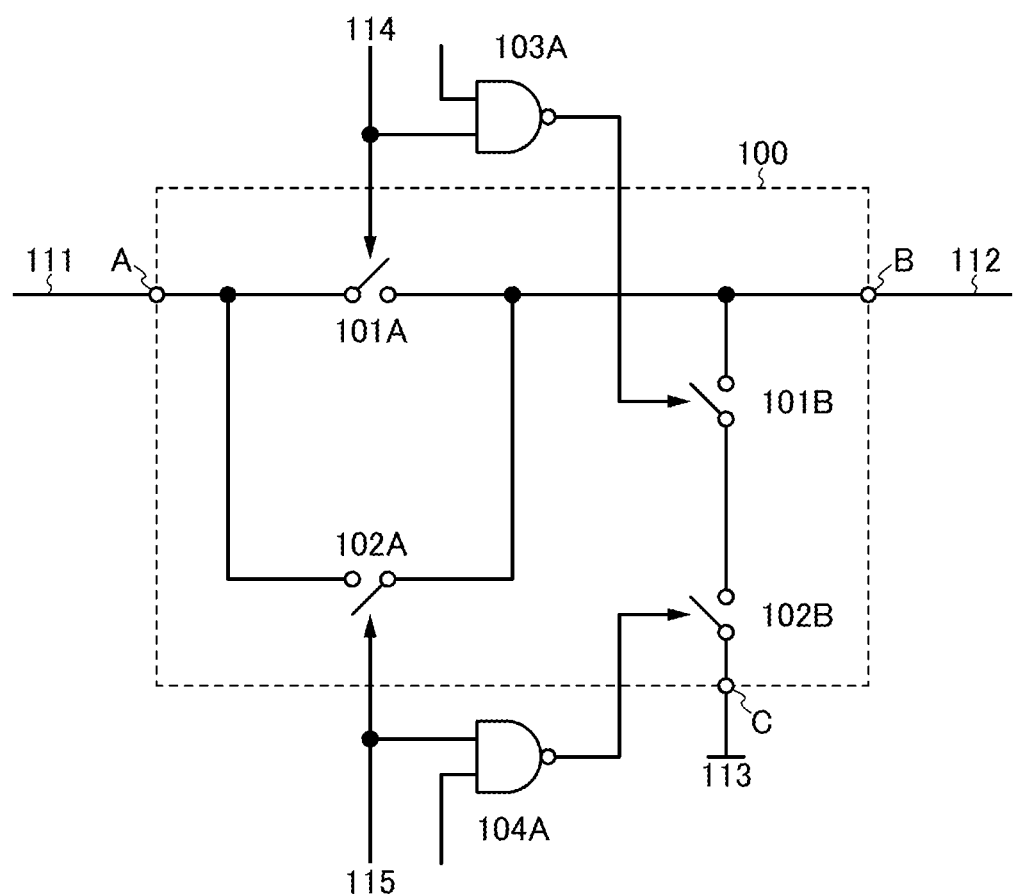
FIG. 5 illustrates a configuration of a device.

For example, a circuit having a function of outputting an inversion signal of an input signal may be used instead of the inverter 103. Examples of such a circuit include a NAND circuit, a NOR circuit, and a clocked inverter. FIG. 5 illustrates a configuration example in which a NAND circuit 103A is used instead of the inverter 103. An output terminal of the NAND circuit 103A corresponds to an output terminal of the inverter 103, and a first input terminal of the NAND circuit 103A corresponds to an input terminal of the inverter 103. A second input terminal of the NAND circuit 103A can be connected to an unillustrated wiring.

For example, a circuit having a function of outputting an inversion signal of an input signal may be used instead of the inverter 104. Examples of such a circuit include a NAND circuit, a NOR circuit, and a clocked inverter. FIG. 5 illustrates a configuration example in which a NAND circuit 104A is used instead of the inverter 104. An output terminal of the NAND circuit 104A corresponds to an output terminal of the inverter 104, and a first input terminal of the NAND circuit 104A corresponds to an input terminal of the inverter 104. A second input terminal of the NAND circuit 104A can be connected to an unillustrated wiring.

A second input terminal of the NAND circuit 104A may be connected to the wiring to which the second input terminal of the NAND circuit 103A is connected.

Next, a configuration example that can be applied to the switch 101A, the switch 101B, the switch 102A, and the switch 102B is described.

A variety of switches can be used as switches described in this specification and the like, such as the switch 101A, the switch 101B, the switch 102A, and the switch 102B. That is, the switch has a function of determining whether current flows or not by being turned on or off (being brought into an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a logic circuit in which such elements are combined, or the like can be used as a switch. An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

Figure 6:
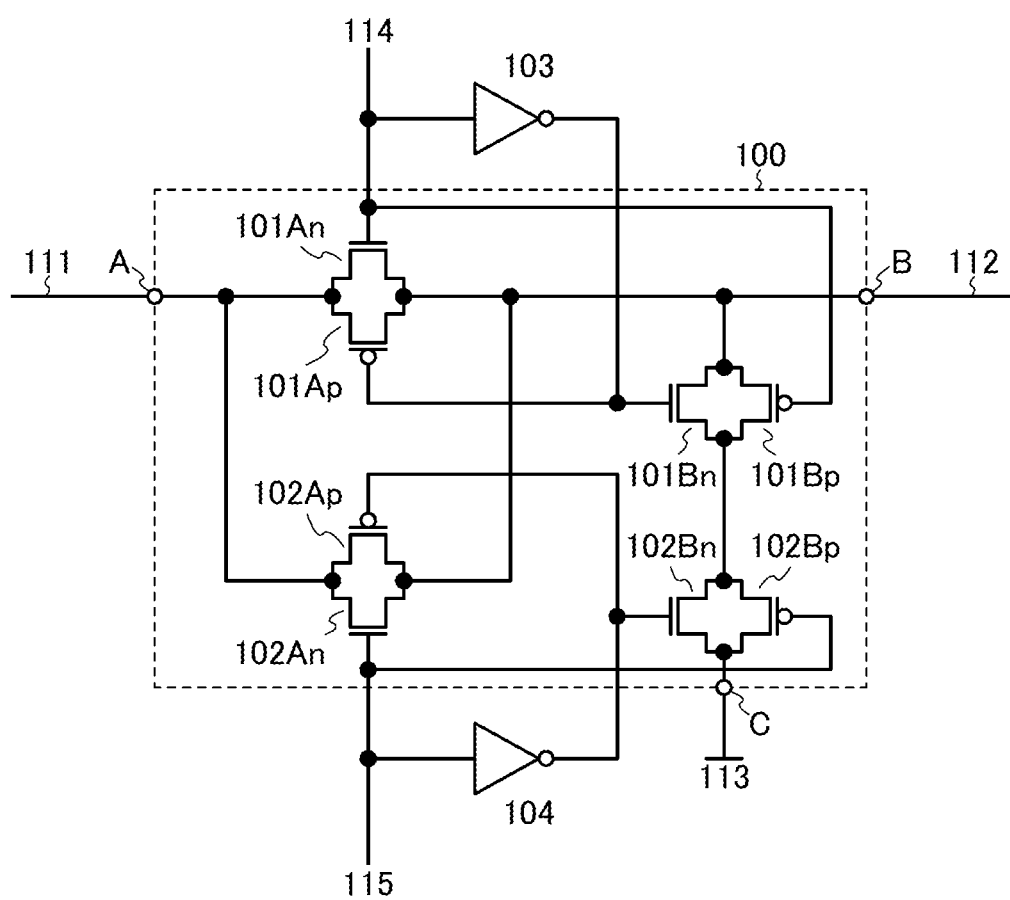
FIG. 6 illustrates a configuration of a device.

FIG. 6 illustrates a configuration example in which CMOS switches (also referred to as analog switches) are used as the switches 101A, 101B, 102A, and 102B in the circuit 100 illustrated in FIG. 2.

An n-channel transistor 101An and a p-channel transistor 101Ap correspond to the switch 101A. A first terminal of the transistor 101An and a first terminal of the transistor 101Ap correspond to a first terminal of the switch 101A, and are connected to the wiring 111. A second terminal of the transistor 101An and a second terminal of the transistor 101Ap correspond to a second terminal of the switch 101A, and are connected to the wiring 112. A gate of the transistor 101An and a gate of the transistor 101Ap correspond to a control terminal of the switch 101A. The gate of the transistor 101An is connected to the wiring 114, and the gate of the transistor 101Ap is connected to the output terminal of the inverter 103.

An n-channel transistor 101Bn and a p-channel transistor 101Bp correspond to the switch 101B. A first terminal of the transistor 101Bn and a first terminal of the transistor 101Bp correspond to a first terminal of the switch 101B. A second terminal of the transistor 101Bn and a second terminal of the transistor 101Bp correspond to a second terminal of the switch 101B, and are connected to the wiring 112. A gate of the transistor 101Bn and a gate of the transistor 101Bp correspond to a control terminal of the switch 101B. The gate of the transistor 101Bn is connected to an output terminal of the inverter 103, and the gate of the transistor 101Bp is connected to the wiring 114.

An n-channel transistor 102An and a p-channel transistor 102Ap correspond to the switch 102A. A first terminal of the transistor 102An and a first terminal of the transistor 102Ap correspond to a first terminal of the switch 102A, and are connected to the wiring 111. A second terminal of the transistor 102An and a second terminal of the transistor 102Ap correspond to a second terminal of the switch 102A, and are connected to the wiring 112. A gate of the transistor 102An and a gate of the transistor 102Ap correspond to a control terminal of the switch 102A. The gate of the transistor 102An is connected to the wiring 115, and the gate of the transistor 102Ap is connected to the output terminal of the inverter 104.

An n-channel transistor 102Bn and a p-channel transistor 102Bp correspond to the switch 102B. A first terminal of the transistor 102Bn and a first terminal of the transistor 102Bp correspond to a first terminal of the switch 102B, and are connected to the wiring 113. A second terminal of the transistor 102Bn and a second terminal of the transistor 102Bp correspond to a second terminal of the switch 102B, and are connected to the first terminal of the transistor 101Bn and the first terminal of the transistor 101Bp. A gate of the transistor 102Bn and a gate of the transistor 102Bp correspond to a control terminal of the switch 102B. The gate of the transistor 102Bn is connected to an output terminal of the inverter 104, and the gate of the transistor 102Bp is connected to the wiring 115.

When the signal $V_{114}$ is at a high level, the transistor 101An and the transistor 101Ap are turned on and the transistor 101Bn and the transistor 101Bp are turned off. When the signal $V_{114}$ is at a low level, the transistor 101An and the transistor 101Ap are turned off and the transistor 101Bn and the transistor 101Bp are turned on.

When the signal $V_{115}$ is at a high level, the transistor 102An and the transistor 102Ap are turned on and the transistor 102Bn and the transistor 102Bp are turned off. When the signal $V_{115}$ is at a low level, the transistor 102An and the transistor 102Ap are turned off and the transistor 102Bn and the transistor 102Bp are turned on.

The configuration for controlling transistors used as the switch 101A, the switch 101B, the switch 102A, and the switch 102B is not limited to the configuration illustrated in FIG. 6.

Figure 7:
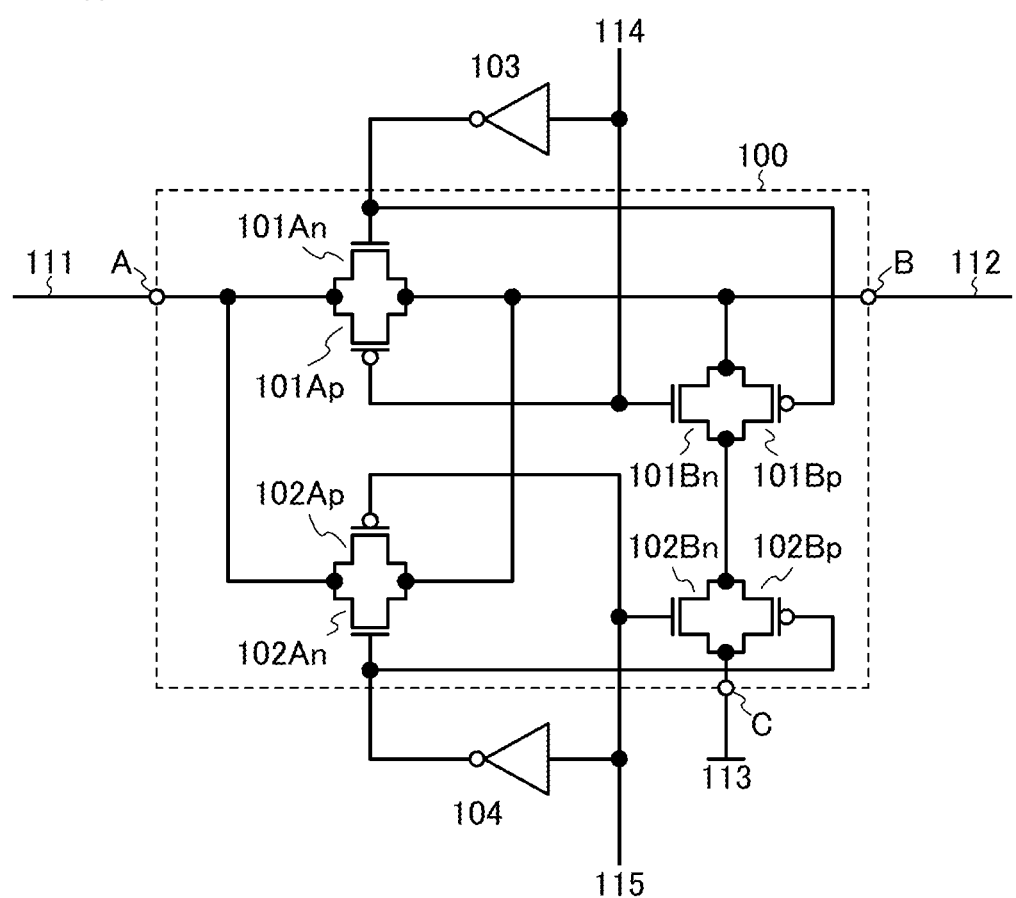
FIG. 7 illustrates a configuration of a device.

For example, as illustrated in FIG. 7, the gate of the transistor 101An and the gate of the transistor 101Bp may be connected to the output terminal of the inverter 103, and the gate of the transistor 101Ap and the gate of the transistor 101Bn may be connected to the wiring 114. When the signal $V_{114}$ is at a high level, the transistor 101An and the transistor 101Ap are turned off and the transistor 101Bn and the transistor 101Bp are turned on. When the signal $V_{114}$ is at a low level, the transistor 101An and the transistor 101Ap are turned on and the transistor 101Bn and the transistor 101Bp are turned off.

For example, as illustrated in FIG. 7, the gate of the transistor 102An and the gate of the transistor 102Bp may be connected to the output terminal of the inverter 104, and the gate of the transistor 102Ap and the gate of the transistor 102Bn may be connected to the wiring 115. When the signal $V_{115}$ is at a high level, the transistor 102An and the transistor 102Ap are turned off and the transistor 102Bn and the transistor 102Bp are turned on. When the signal $V_{115}$ is at a low level, the transistor 102An and the transistor 102Ap are turned on and the transistor 102Bn and the transistor 102Bp are turned off.

The switches 101A, 101B, 102A, and 102B are not limited to CMOS switches.

Figure 8:
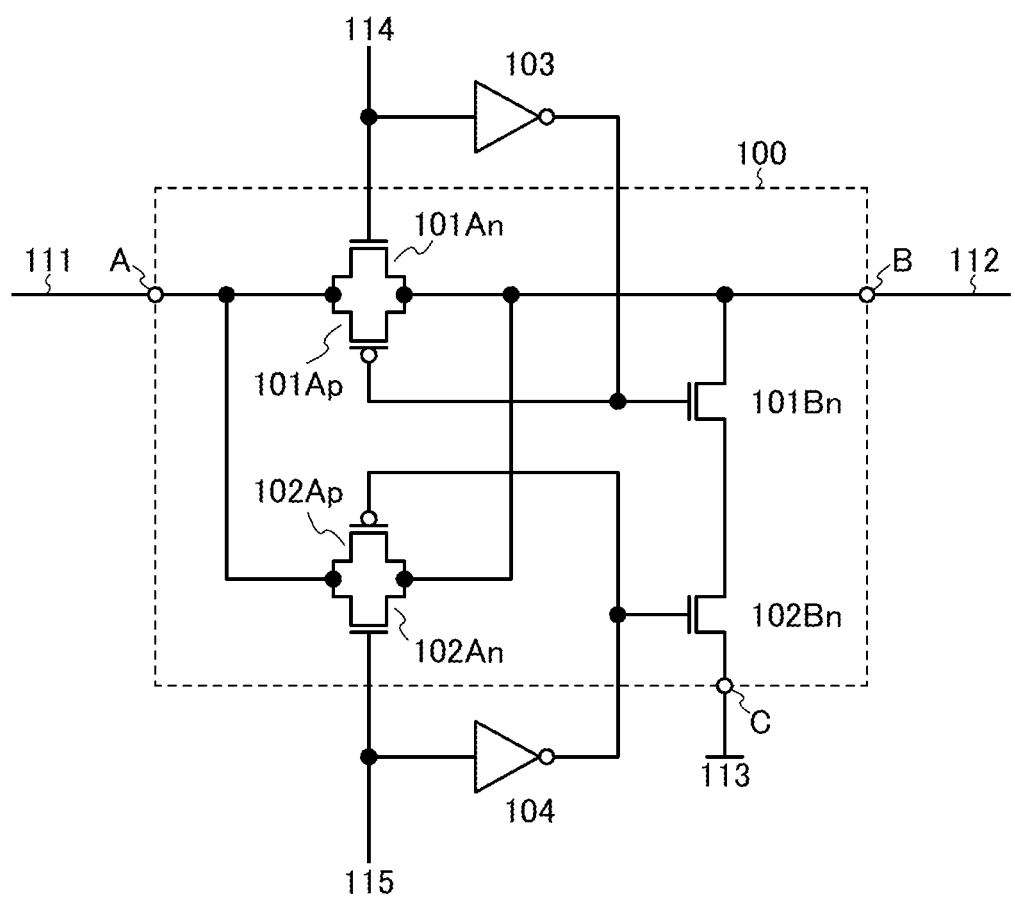
FIG. 8 illustrates a configuration of a device.

For example, as illustrated in FIG. 8, an n-channel transistor may be used as the switch 101B. That is, the transistor 101Bp may be omitted.

For example, as illustrated in FIG. 8, an n-channel transistor may be used as the switch 102B. That is, the transistor 102Bp may be omitted.

For example, a p-channel transistor may be used as the switch 101B. That is, the transistor 101Bn may be omitted.

For example, a p-channel transistor may be used as the switch 102B. That is, the transistor 102Bn may be omitted.

For example, an n-channel transistor may be used as the switch 101A. That is, the transistor 101Ap may be omitted.

For example, an n-channel transistor may be used as the switch 102A. That is, the transistor 102Ap may be omitted.

For example, a p-channel transistor may be used as the switch 101A. That is, the transistor 101An may be omitted.

For example, a p-channel transistor may be used as the switch 102A. That is, the transistor 102An may be omitted.

Note that in the case where one of the switches 101B and 102B is an n-channel transistor, the other is preferably an n-channel transistor or a CMOS switch. The potential $V_{113}$ is preferably a potential corresponding to the low level of the signal $V_{111}$. In that case, in each of the switches 101B and 102B, a potential difference between a gate and a source of the n-channel transistor can be large. Therefore, a resistance value between the wiring 112 and the wiring 113 can be small.

Note that in the case where one of the switches 101B and 102B is a p-channel transistor, the other is preferably a p-channel transistor or a CMOS switch. The potential $V_{113}$ is preferably a potential corresponding to the high level of the signal $V_{111}$. In that case, in each of the switches 101B and 102B, a potential difference between a gate and a source of the p-channel transistor can be large. Therefore, a resistance value between the wiring 112 and the wiring 113 can be small.

Note that in the case where the switch 101A is one of an n-channel transistor and a p-channel transistor, the switch 101B is preferably the other of the n-channel transistor and the p-channel transistor. In that case, the switch 101A and the switch 101B can be controlled by the same signal; thus, the inverter 103 can be omitted.

Note that in the case where the switch 102A is one of an n-channel transistor and a p-channel transistor, the switch 102B is preferably the other of the n-channel transistor and the p-channel transistor. In that case, the switch 102A and the switch 102B can be controlled by the same signal; thus, the inverter 104 can be omitted.

The signal $V_{111}$ is supplied to the wiring 112 via the switch 101A and the switch 102A. Thus, CMOS switches are preferably used as the switches 101A and 102A. In that case, a resistance value between the wiring 111 and the wiring 112 can be small whether the signal $V_{111}$ is at a high level or at a low level.

Next, a modification example of the circuit 100 illustrated in FIG. 1 is described.

For example, the second terminal of the switch 101A may be connected to the first terminal of the switch 101B or the second terminal of the switch 102B.

Figure 9:
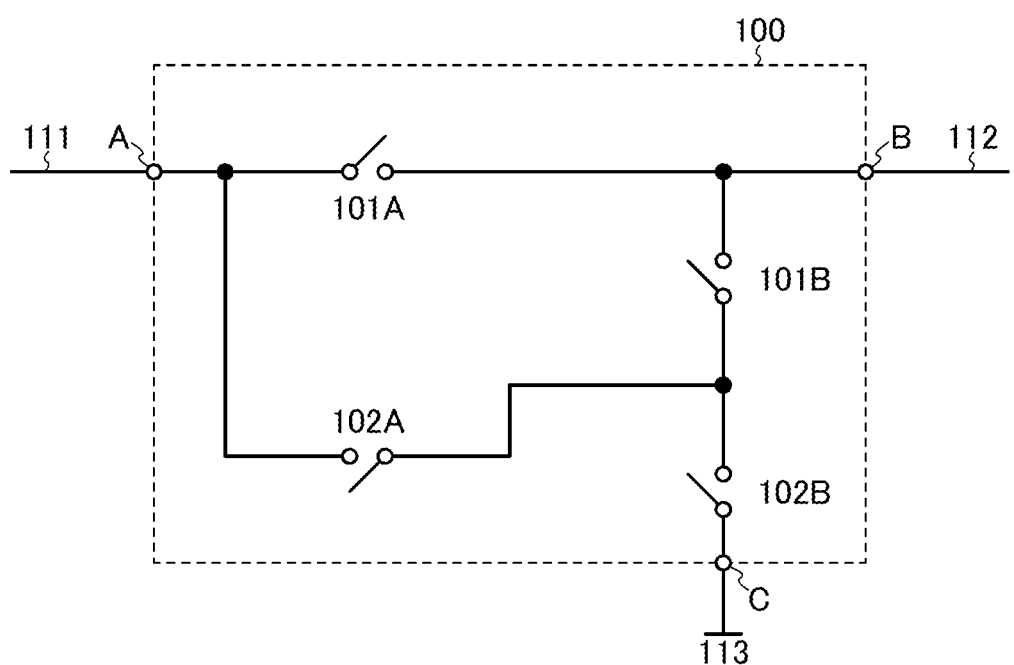
FIG. 9 illustrates a configuration of a device.

For example, as illustrated in FIG. 9, the second terminal of the switch 102A may be connected to the first terminal of the switch 101B or the second terminal of the switch 102B.

Figure 13:
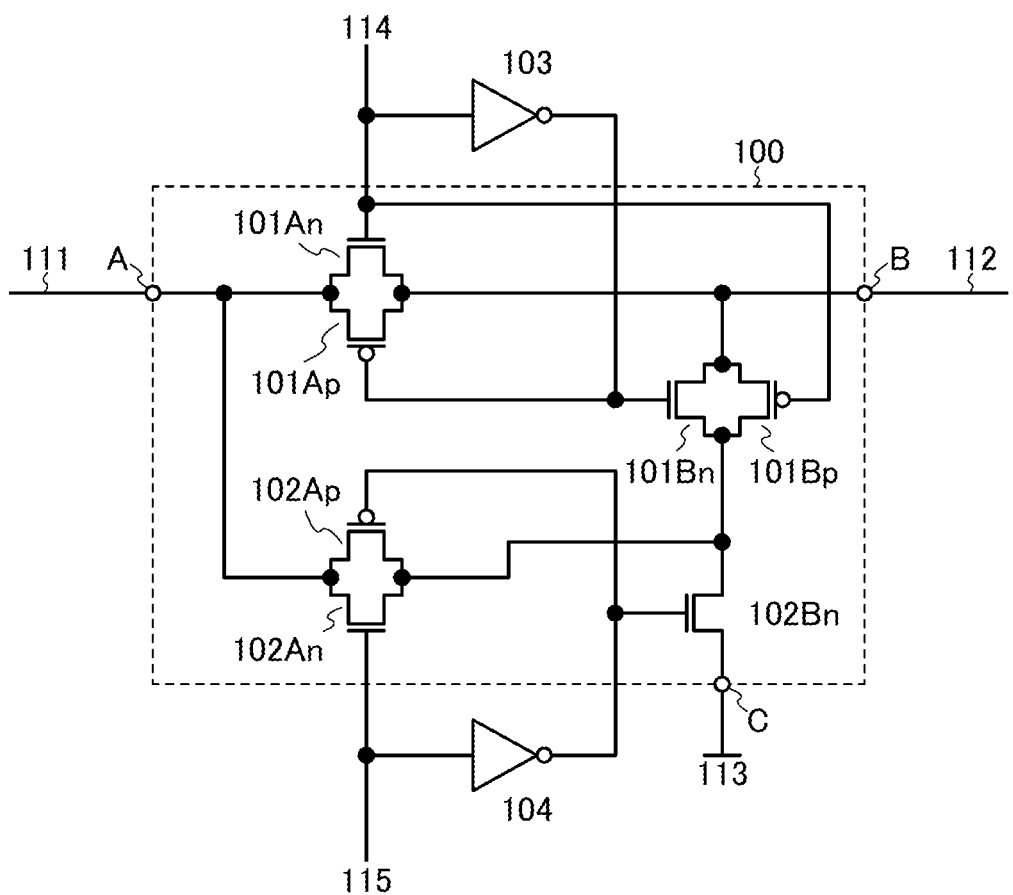
FIG. 13 illustrates a configuration of a device.

In the configuration illustrated in FIG. 9, there is a case where the signal $V_{111}$ is output to the wiring 112 via the switch 101A, and a case where the signal $V_{111}$ is output to the wiring 112 via the switch 102A and the switch 101B. For this reason, as illustrated in FIG. 13, CMOS switches are preferably used as the switches 101A, 102A, and 101B. In that case, a resistance value between the wiring 111 and the wiring 112 can be small.

Figure 10:
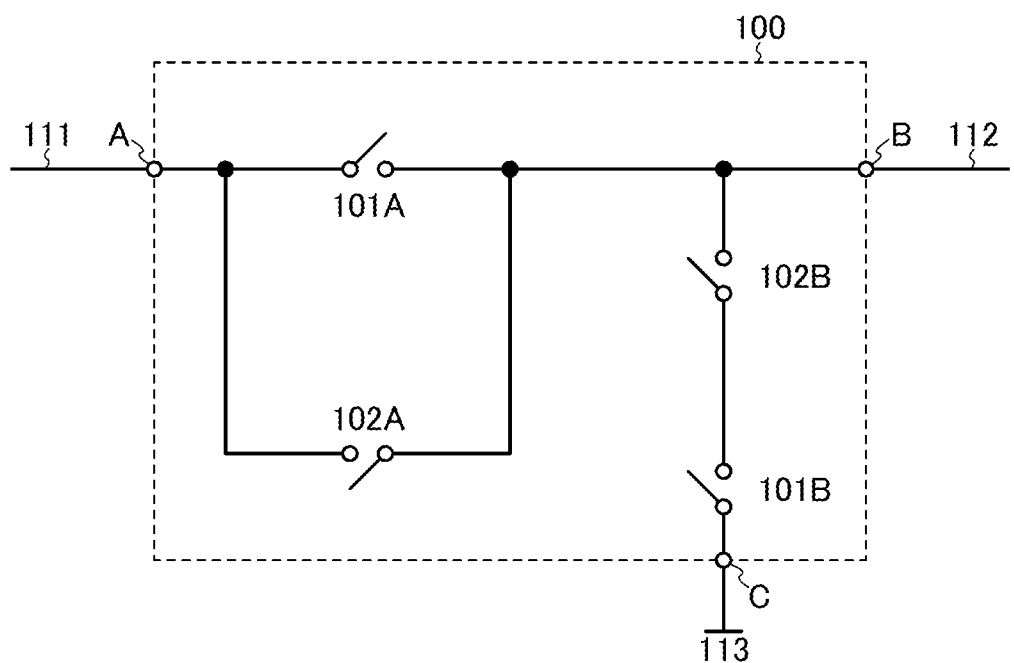
FIG. 10 illustrates a configuration of a device.

For example, as illustrated in FIG. 10, the switch 101B and the switch 102B may be connected in reverse. The first terminal of the switch 101B may be connected to the wiring 113, the first terminal of the switch 102B may be connected to the second terminal of the switch 101B, and the second terminal of the switch 102B may be connected to the wiring 112.

For example, the first terminal of the switch 102B may be connected to the wiring 114.

For example, the first terminal of the switch 102B may be connected to the wiring 115.

For example, the first terminal of the switch 102B may be connected to the output terminal of the inverter 103.

For example, the first terminal of the switch 102B may be connected to the output terminal of the inverter 104.

Figure 11:
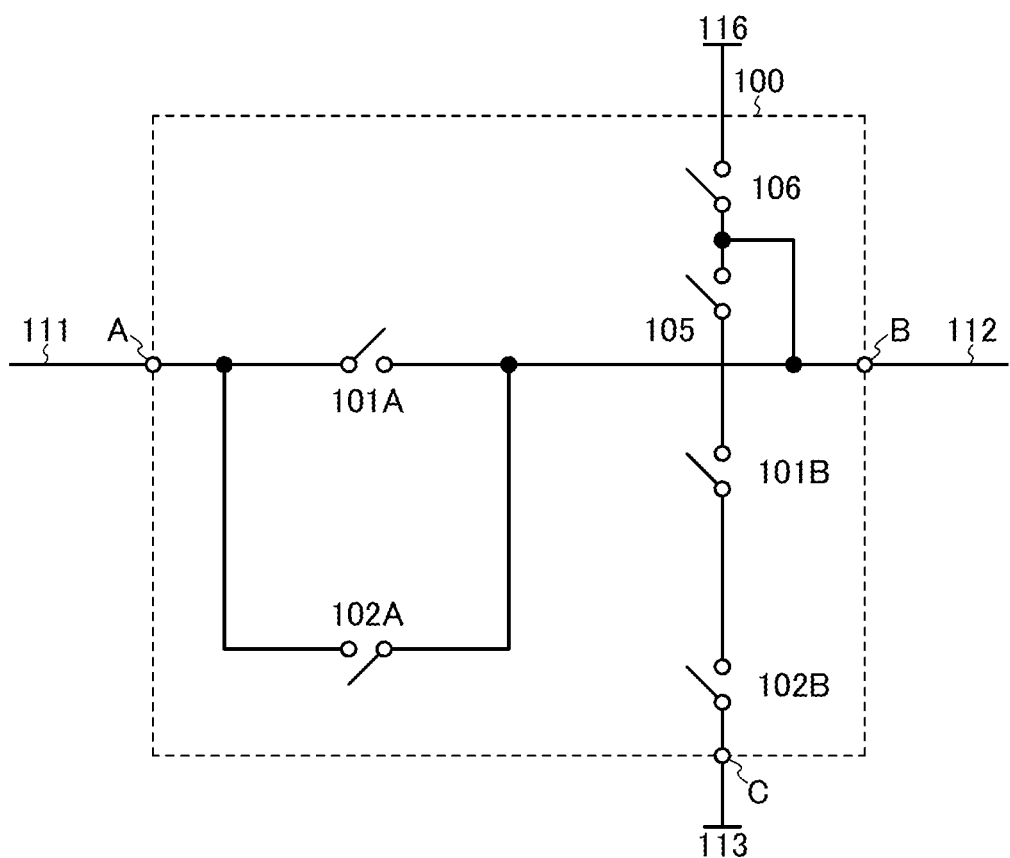
FIG. 11 illustrates a configuration of a device.

For example, a structure for initializing the potential of the wiring 112 may be added. FIG. 11 illustrates a configuration in which a switch 105 and a switch 106 are added for initializing the potential of the wiring 112. A first terminal of the switch 105 is connected to the second terminal of the switch 101B. A second terminal of the switch 105 is connected to the wiring 112. A first terminal of the switch 106 is connected to a wiring 117. A second terminal of the switch 107 is connected to the wiring 112. When one of the switch 105 and the switch 106 is on, the other is preferably off. When the switch 105 is on and the switch 106 is off, the operation of the circuit 100 illustrated in FIG. 11 is similar to that of the circuit 100 illustrated in FIG. 1. In contrast, when the switch 105 is off and the switch 106 is on, a potential of the wiring 116 (also referred to as a potential $V_{116}$) is supplied to the wiring 112. When the potential $V_{116}$ corresponds to a high level of the signal $V_{111}$, the signal $V_{112}$ is at a high level. Thus, even when the switch 101B and the switch 102B are on, the potential of the wiring 112 can be initialized.

The switch 105, the switch 101B, and the switch 102B are connected in series between the wiring 113 and the wiring 112. For example, the switch 101B and the switch 102B may be connected via the switch 105. For example, the switch 102B and the wiring 113 may be connected via the switch 105.

When the switch 106 is on, the switch 101A and the switch 102A are preferably off. In that case, the signal $V_{111}$ and the potential $V_{116}$ can be prevented from being supplied to the wiring 112 at the same time.

Figure 12:
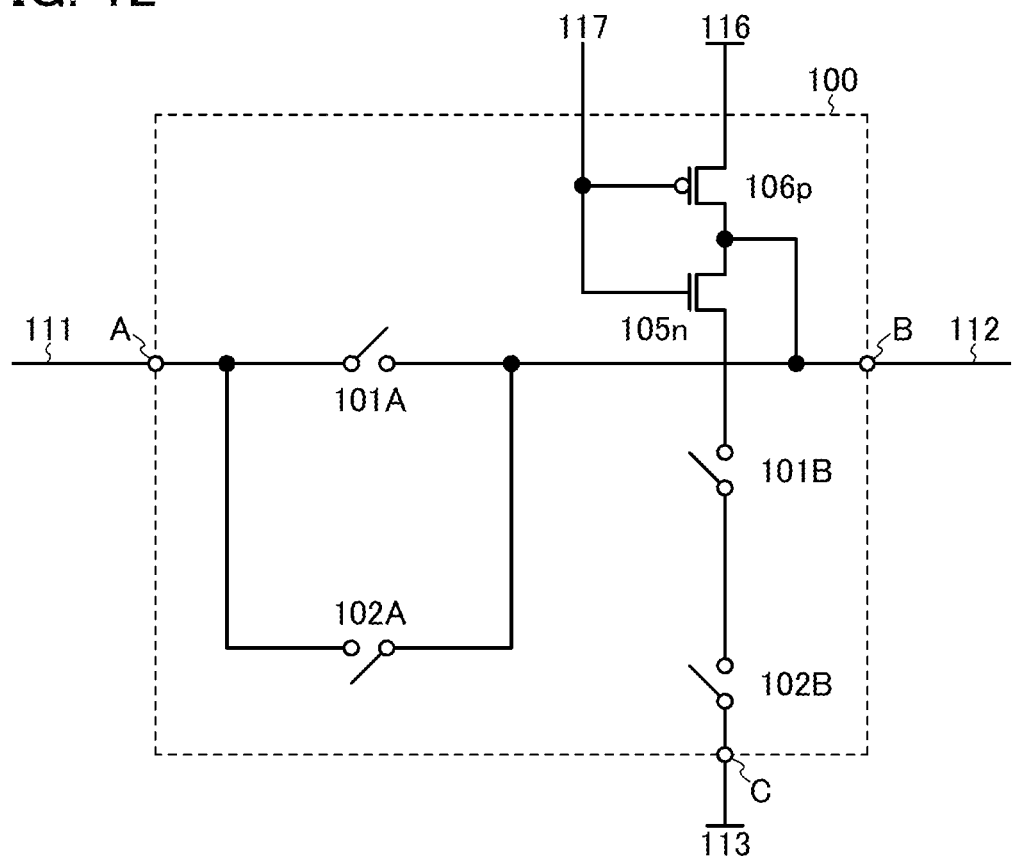
FIG. 12 illustrates a configuration of a device.

Like the switches 101A, 101B, 102A, and 102B, a variety of switches can be used as the switches 105 and 106. FIG. 12 illustrates a configuration example in which an n-channel transistor is used as the switch 105 and a p-channel transistor is used as the switch 106. An n-channel transistor 105n corresponds to the switch 105. A first terminal of the transistor 105n corresponds to a first terminal of the switch 105, and is connected to the second terminal of the switch 101B. A second terminal of the transistor 105n corresponds to the second terminal of the switch 105, and is connected to the wiring 112. A gate of the transistor 105n corresponds to a control terminal of the switch 105, and is connected to the wiring 117. A p-channel transistor 106p corresponds to the switch 106. A first terminal of the transistor 106p corresponds to the first terminal of the switch 106, and is connected to the wiring 116. A second terminal of the transistor 106p corresponds to a second terminal of the switch 106, and is connected to the wiring 112. A gate of the transistor 106p corresponds to a control terminal of the switch 106, and is connected to the wiring 117. When a signal of the wiring 117 (also referred to as a signal $V_{117}$) is at a high level, the transistor 105n is turned on and the transistor 106p is turned off. When the signal $V_{117}$ is at a low level, the transistor 105n is turned off and the transistor 106p is turned on.

The switch 105 and the switch 106 may be transistors with the same polarity. In that case, a gate of a transistor used as the switch 105 is preferably connected to a gate of a transistor used as the switch 106 via an inverter.

In the case where the potential $V_{113}$ is a potential corresponding to the low level of the signal $V_{111}$, an n-channel transistor or a CMOS switch is preferably used as each of the switch 101B, the switch 102B, and the switch 105. Alternatively, in the case where the potential $V_{113}$ is a potential corresponding to the high level of the signal $V_{111}$, a p-channel transistor or a CMOS switch is preferably used as each of the switch 101B, the switch 102B, and the switch 105. Since a potential difference between a gate and a source of each of transistors used as the switch 101B, the switch 102B, and the switch 105 can be large, a resistance value between the wiring 113 and the wiring 112 can be small.

In the case where the potential $V_{116}$ is a potential corresponding to the high level of the signal $V_{111}$, a p-channel transistor or a CMOS switch is preferably used as the switch 106. Alternatively, in the case where the potential $V_{116}$ is a potential corresponding to the low level of the signal $V_{111}$, an n-channel transistor or a CMOS switch is preferably used as the switch 106. Since a potential difference between a gate and a source of the switch 106 can be large, a resistance value between the wiring 116 and the wiring 112 can be small.

As described above, in this specification and the like, a variety of switches can be used as a switch. That is, the switch has a function of determining whether current flows or not by being turned on or off (being brought into an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a logic circuit in which such elements are combined, or the like can be used as a switch. An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

In the case where a transistor is used as a switch, the polarity (conductivity type) of the transistor is not particularly limited to a certain type because it operates just as a switch. However, a transistor of polarity with smaller off-current is preferably used when off-current is to be suppressed. Examples of a transistor with smaller off-state current are a transistor provided with an LDD region, a transistor with a multi-gate structure, and the like.

Note that in the case of using a transistor as a switch, an n-channel transistor is preferably used as the switch when the potential of a source of the transistor which operates as the switch is close to a potential of a low-potential-side power supply (e.g., Vss, GND, or 0 V). A p-channel transistor is preferably used as the switch when the potential of the source is close to a potential of a high-potential-side power supply (e.g., Vdd). This is because the absolute value of the gate-source voltage can be increased when the potential of a source of the n-channel transistor is close to the potential of a low-potential-side power supply or when the potential of a source of the p-channel transistor is close to the potential of a high-potential-side power supply, so that the transistor can more accurately operate as a switch. This is also because the transistor does not often perform source follower operation, so that the decrease in output voltage does not often occur.

Note that a CMOS switch including both n-channel and p-channel transistors may be employed as a switch. The use of a CMOS switch as a switch allows more accurate operation of the switch because a current can flow when either the p-channel transistor or the n-channel transistor is turned on. Thus, a voltage can be appropriately output regardless of whether the voltage of an input signal to the switch is high or low. Alternatively, the voltage amplitude of a signal for turning on or off the switch can be made small, so that power consumption can be reduced.

Note that when a transistor is used as a switch, the switch includes an input terminal (one of a source and a drain), an output terminal (the other of the source and the drain), and a terminal for controlling conduction (a gate) in some cases. When a diode is used as a switch, the switch does not have a terminal for controlling conduction in some cases. Therefore, when a diode is used as a switch, the number of wirings for controlling terminals can be small as compared with the case of using a transistor as a switch.

In this specification and the like, for example, transistors with a variety of structures can be used as a transistor, without limitation to a certain type. For example, a transistor including a single crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned can be used. In the case of using the TFT, there are various advantages. For example, since the TFT can be formed at temperature lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Alternatively, transmission of light in a display element can be controlled by using the transistor formed using the light-transmitting substrate. Alternatively, part of a film included in the transistor can transmit light because of a small thickness of the transistor. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed using the same substrate.

Note that when a catalyst (e.g., nickel) is used in the case of forming microcrystalline silicon, crystallinity can be further improved and a transistor having excellent electric characteristics can be formed. In that case, crystallinity can be improved by just performing heat treatment without performing laser irradiation. Accordingly, a gate driver circuit (e.g., a scan line driver circuit) and part of a source driver circuit (e.g., an analog switch) can be formed over the same substrate. Note that when laser irradiation for crystallization is not performed, unevenness in crystallinity of silicon can be suppressed. Therefore, high-quality images can be displayed. Note that it is possible to form polycrystalline silicon or microcrystalline silicon without a catalyst (e.g., nickel).

Note that although the crystallinity of silicon is preferably improved to polycrystal, microcrystal, or the like in the whole panel, the present invention is not limited to this. The crystallinity of silicon may be improved only in part of the panel. Selective increase in crystallinity can be achieved by selective laser irradiation or the like. For example, only a peripheral circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, the crystallinity of silicon can be improved only in a region in which a circuit needs to be operated at high speed. Because a pixel region is not particularly needed to be operated at high speed, even if crystallinity is not improved, the pixel circuit can be operated without any problem. Thus, a region whose crystallinity is improved is small, so that manufacturing steps can be decreased. This can increase throughput and reduce manufacturing cost. Alternatively, since the number of necessary manufacturing apparatus is small, manufacturing cost can be reduced.

Examples of the transistor include a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) and a thin film transistor including a thin film of such a compound semiconductor or an oxide semiconductor. Because manufacturing temperature can be lowered, such a transistor can be formed at room temperature, for example. The transistor can thus be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Such an element can be formed at the same time as the transistor; thus, cost can be reduced.

Note that for example, a transistor formed by an ink-jet method or a printing method can be used as a transistor. Accordingly, such a transistor can be formed at room temperature, can be formed at a low vacuum, or can be formed using a large substrate. Thus, the transistor can be formed without using a mask (reticle), which enables the layout of the transistor to be easily changed. Alternatively, the transistor can be formed without using a resist, leading to reductions in material cost and the number of steps. Further, a film can be formed only in a portion where the film is needed, a material is not wasted as compared with the case of employing a manufacturing method by which etching is performed after the film is formed over the entire surface, so that the cost can be reduced.

Note that for example, a transistor including an organic semiconductor or a carbon nanotube can be used as a transistor. Thus, such a transistor can be formed over a flexible substrate. A device including a transistor which includes an organic semiconductor or a carbon nanotube can resist a shock.

Note that transistors with a variety of different structures can be used for a transistor. For example, a MOS transistor, a junction transistor, a bipolar transistor, or the like can be used as a transistor. By using a MOS transistor as a transistor, the size of the transistor can be reduced. Thus, a number of transistors can be mounted. By using a bipolar transistor as a transistor, a large amount of current can flow. Thus, a circuit can be operated at high speed. Note that a MOS transistor and a bipolar transistor may be formed over one substrate, in which case reductions in power consumption and size, high-speed operation, and the like can be achieved.

Note that in this specification and the like, for example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (reliability can be improved). Alternatively, with the multi-gate structure, the drain-source current does not change so much even if the drain-source voltage fluctuates when the transistor operates in a saturation region, so that a flat slope of the voltage-current characteristics can be obtained. By utilizing the flat slope of the voltage-current characteristics, an ideal current source circuit or an active load having extremely high resistance can be obtained. Accordingly, a differential circuit, a current mirror circuit, or the like having excellent properties can be obtained.

Note that a transistor with a structure where gate electrodes are formed above and below a channel can be used, for example. With the structure where gate electrodes are formed above and below a channel, a circuit structure where a plurality of transistors are connected in parallel is provided. Thus, a channel region is increased, so that the amount of current can be increased. Alternatively, by using the structure where gate electrodes are formed above and below a channel, a depletion layer can be easily formed, resulting in lower subthreshold swing.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor. A transistor with any of a variety of structures such as a planar type, a FIN-type, a Tri-Gate type, a top-gate type, a bottom-gate type, and a double-gate type (with gates above and below a channel) can be used.

Note that for example, a transistor with a structure where a source electrode or a drain electrode overlaps with a channel region (or part of it) can be used as a transistor. By using the structure where a source electrode or a drain electrode overlaps with a channel region (or part of it), unstable operation due to accumulation of electric charge in part of the channel region can be prevented.

Note that for example, a transistor with a structure where an LDD region is provided can be used as a transistor. Provision of the LDD region enables a reduction in off-current or an increase in the withstand voltage of the transistor (an improvement in reliability). Alternatively, by providing the LDD region, the drain current does not change so much even when the drain-source voltage fluctuates when the transistor operates in a saturation region, so that a flat slope of the voltage-current characteristics can be obtained.

Note that in this specification and the like, a transistor can be formed using any of a variety of substrates, for example. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. Specifically, when a transistor is formed using a semiconductor substrate, a single crystal substrate, an SOI substrate, or the like, the transistor can have few variations in characteristics, size, shape, or the like, high current supply capability, and a small size. By forming a circuit with the use of such a transistor, power consumption of the circuit can be reduced or the circuit can be highly integrated.

A flexible substrate may be used as the substrate, and the transistor may be provided directly on the flexible substrate. Moreover, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

That is, a transistor may be formed using a substrate, and then, the transistor may be transferred to another substrate. Example of a substrate to which a transistor is transferred are, in addition to the above substrate over which the transistor can be formed, a paper substrate, a cellophane substrate, an aramid substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

Note that all the circuits which are necessary to realize a predetermined function can be formed using one substrate (e.g., a glass substrate, a plastic substrate, a single crystal substrate, or an SOI substrate). In this manner, the cost can be reduced by a reduction in the number of components or reliability can be improved by a reduction in the number of connection points to circuit components.

Note that not all the circuits which are necessary to realize the predetermined function are needed to be formed using one substrate. That is, part of the circuits which are necessary to realize the predetermined function may be formed using a substrate and another part of the circuits which are necessary to realize the predetermined function may be formed using another substrate. For example, part of the circuits which are necessary to realize the predetermined function can be formed using a glass substrate and another part of the circuits which are necessary to realize the predetermined function can be formed using a single crystal substrate (or an SOI substrate). The single crystal substrate over which the another part of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like. When part of the circuits is formed over the same substrate as a pixel portion in this manner, the cost can be reduced by a reduction in the number of components or reliability can be improved by a reduction in the number of connection points between circuit components. In particular, a circuit in a portion where a driving voltage is high, a circuit in a portion where a driving frequency is high, or the like consumes much power in many cases. In view of the above, such a circuit is formed over a substrate (e.g., a single crystal substrate) different from a substrate over which a pixel portion is formed, whereby an IC chip is formed. The use of this IC chip allows prevention of increase in power consumption.

For example, in this specification and the like, a transistor is an element having at least three terminals: a gate, a drain, and a source. The transistor includes a channel region between the drain (a drain terminal, a drain region, or a drain electrode) and the source (a source terminal, a source region, or a source electrode), and a current can flow through the drain, the channel region, and the source. Here, since the source and the drain of the transistor change depending on the structure, the operating condition, or the like of the transistor, it is difficult to define which is a source or a drain. Therefore, a portion functioning as a source or a drain is not called a source or a drain in some cases. In that case, for example, one of the source and the drain is referred to as a first terminal, a first electrode, or a first region, and the other of the source and the drain is referred to as a second terminal, a second electrode, or a second region in some cases.

Note that a transistor may be an element having at least three terminals of a base, an emitter, and a collector. In that case also, one of the emitter and the collector is referred to as a first terminal, a first electrode, or a first region, and the other of the emitter and the collector is referred to as a second terminal, a second electrode, or a second region in some cases. Note that in the case where a bipolar transistor is used as a transistor, a gate can be rephrased as a base.

For example, in this specification and the like, when it is explicitly described that X and Y are connected, the case where X and Y are electrically connected, the case where X and Y are functionally connected, and the case where X and Y are directly connected are included therein. Accordingly, a connection relation other than connection relations shown in the drawings and texts is also included, without being limited to a predetermined connection relation, for example, a connection relation shown in the drawings and texts.

Here, each of X and Y denotes an object (e.g., a device, an element, a circuit, a wiring, an electrode, a terminal, a conductive film, a layer, or the like).

In the case where X and Y are electrically connected, one or more elements (e.g., a switch, a transistor, a capacitor, an inductor, a resistor, a diode, a display element, a light-emitting element, and a load) that enable an electrical connection between X and Y can be connected between X and Y, for example. Note that the switch is controlled to be turned on or off. That is, the switch has a function of determining whether current flows or not by being turned on or off (becoming an on state or an off state). Alternatively, the switch has a function of selecting and changing a current path.

In the case where X and Y are functionally connected, one or more circuits (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and a control circuit) that enable a functional connection between X and Y can be connected between X and Y, for example. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another element or another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

A content described in this embodiment can be implemented by being combined with any of the other contents described in this embodiment and/or any of contents described in the other embodiments in this specification and the like, as appropriate.

Embodiment 2

In this embodiment, a device of one embodiment of the present invention is described.

Figure 14:
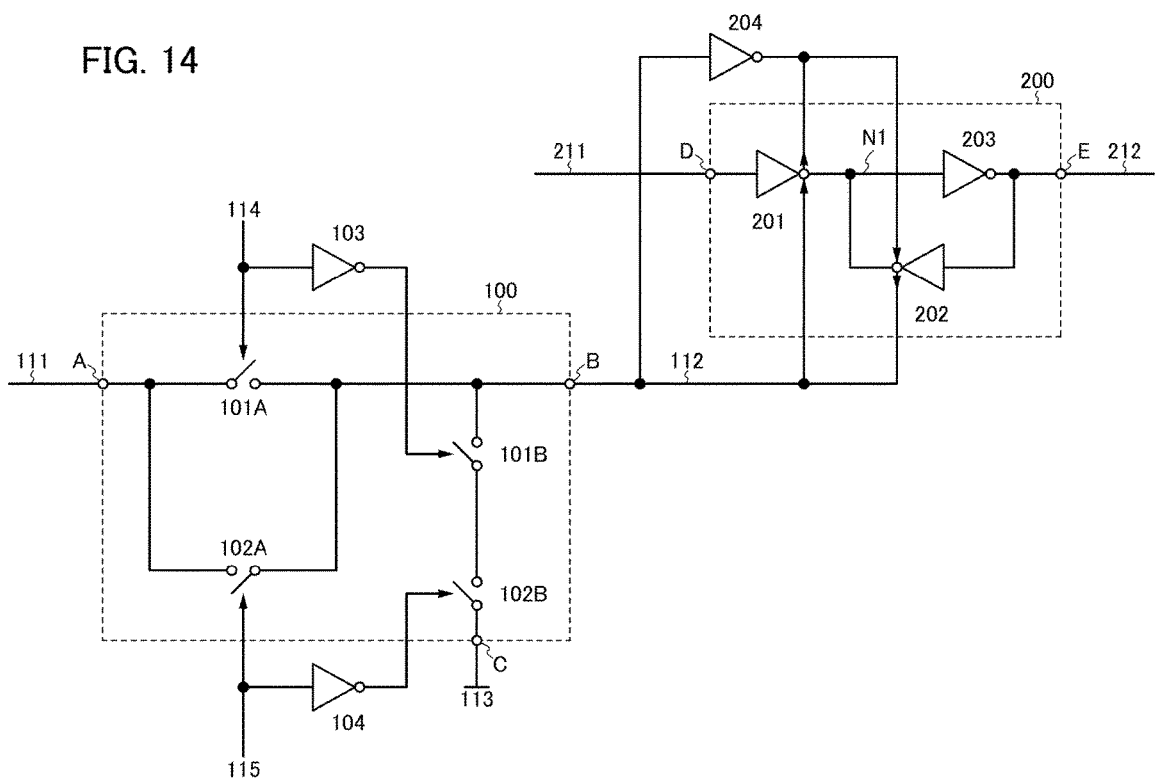
FIG. 14 illustrates a configuration of a device.

FIG. 14 illustrates an example of the structure of a device of one embodiment of the present invention.

A device illustrated in FIG. 14 includes the circuit 100 and a circuit 200.

The circuit 100 in FIG. 14 corresponds to the circuit 100 described in Embodiment 1 and the like. The circuit 100 illustrated in FIG. 14 employs the configuration of the circuit 100 illustrated in FIG. 2.

A terminal D of the circuit 200 is connected to a wiring 211, and a terminal E thereof is connected to the wiring 212. The circuit 200 is connected to the wiring 112. That is, the signal $V_{112}$ is input to the circuit 200.

The circuit 200 has a function of holding a signal of the wiring 211 (also referred to as a signal $V_{211}$). The timing when the circuit 200 holds the signal $V_{211}$ is controlled by the signal $V_{112}$. The circuit 200 has a function of outputting a signal based on the held signal $V_{211}$ (also referred to as a signal $V_{212}$) to the wiring 212.

Note that in this specification and the like, the phrase "a circuit is controlled by a signal" means not only the case where the element is controlled directly by the signal but also the case where the element is controlled by a signal in accordance with the signal or the case where the element is controlled by both of the signal and the signal in accordance with the signal.

Next, a specific example of the circuit 200 is described.

The circuit 200 includes a clocked inverter 201, a clocked inverter 202, and an inverter 203. An input terminal of the clocked inverter 201 is connected to the wiring 211, an output terminal thereof is connected to an input terminal of the inverter 203, a first control terminal thereof (an arrow toward ○ in FIG. 14) is connected to the wiring 112, and a second control terminal thereof (an outward arrow from ○ in FIG. 14) is connected to the wiring 112 via an inverter 204. An input terminal of the clocked inverter 202 is connected to the wiring 212, an output terminal thereof is connected to the input terminal of the inverter 203, a first control terminal thereof is connected to the wiring 112 via the inverter 204, and a second control terminal thereof is connected to the wiring 211. An output terminal of the inverter 203 is connected to the wiring 212.

The circuit 200 may include the inverter 204.

The clocked inverters 201 and 202 have a function of determining whether the output has a high impedance. In the case where the clocked inverter 201 and the clocked inverter 202 determine that the output does not have a high impedance, the clocked inverter 201 and the clocked inverter 202 have a function of outputting an inversion signal of an input signal. Whether the outputs of the clocked inverter 201 and the clocked inverter 202 have a high impedance is determined by signals input to the first control terminals and the second control terminals. That is, the signal $V_{112}$ controls whether the outputs of the clocked inverter 201 and the clocked inverter 202 have a high impedance.

As described above, the control of the clocked inverter 201 and the clocked inverter 202 means not only the case where they are controlled directly by the signal $V_{112}$, but also the case where they are controlled by a signal in accordance with the signal $V_{112}$ or by the signal $V_{112}$ and the signal in accordance with the signal $V_{112}$.

In the case where the output of the clocked inverter 201 does not have a high impedance, the signal $V_{211}$ is input to a node N1 via the clocked inverter 201. That is, an inversion signal of the signal $V_{211}$ is supplied to the node N1. In contrast, in the case where the output of the clocked inverter 201 has a high impedance, the signal $V_{211}$ is not input to the node N1 via the clocked inverter 201.

In the case where the output of the clocked inverter 202 does not have a high impedance, the clocked inverter 202 and the inverter 203 form an inverter loop. This inverter loop holds a potential of the node N1 and the signal $V_{212}$. That is, the signal $V_{211}$ is held.

When one of the outputs of the clocked inverters 201 and 202 has a high impedance, it is preferable that the other output do not have a high impedance. In that case, an output signal of the clocked inverter 201 and an output signal of the clocked inverter 202 can be prevented from being supplied to the node N1 at the same time. Furthermore, the node N1 can be prevented from being floating.

The operation of the device in FIG. 14 is described with reference to a timing chart of FIG. 15.

Figure 15:
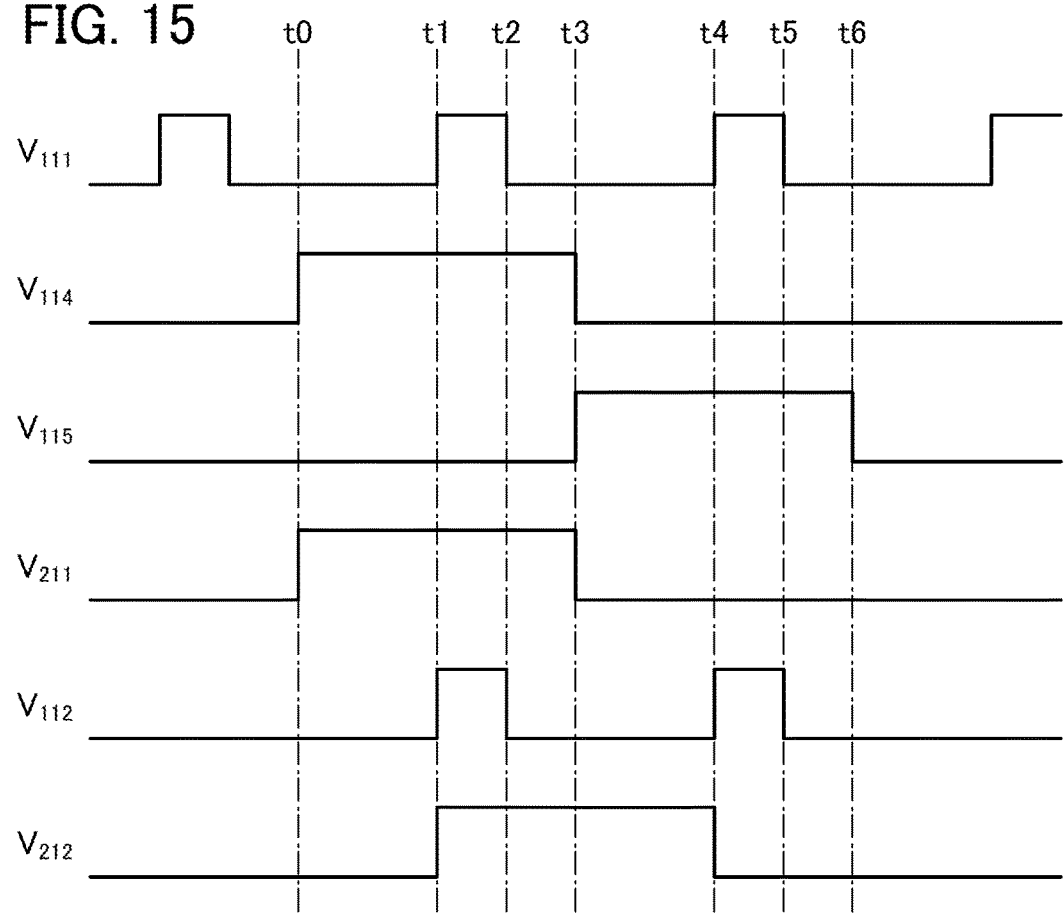
FIG. 15 illustrates operations of a device.

FIG. 15 illustrates examples of the signal $V_{111}$, the signal $V_{114}$, the signal $V_{115}$, the signal $V_{211}$, the signal $V_{112}$, and the signal $V_{212}$.

At a time t0, the signal $V_{111}$ is set at a low level, the signal $V_{114}$ is set at a high level, the signal $V_{115}$ is set at a low level, and the signal $V_{211}$ is set at a high level.

In the circuit 100, the switch 101A is turned on, the switch 101B is turned off, the switch 102A is turned off, and the switch 102B is turned on. Thus, the signal $V_{111}$ at a low level is supplied to the wiring 112, so that the signal $V_{112}$ is at a low level.

In the circuit 200, the signal $V_{112}$ is at a low level, and an output of the clocked inverter 201 has a high impedance. Thus, the signal $V_{211}$ is not input to the node N1 via the clocked inverter 201. In addition, the signal $V_{112}$ is at a low level, and an output of the clocked inverter 202 does not have a high impedance. Thus, the clocked inverter 202 and the inverter 203 form an inverter loop. When an initial value of the node N1 is at a high level, the potential of the node N1 and the signal $V_{212}$ are held so that the signal $V_{212}$ is at a low level.

At a time t1, the signal $V_{111}$ is set at a high level.

In the circuit 100, the signal $V_{111}$ at a high level is supplied to the wiring 112, so that the signal $V_{112}$ is at a high level.

In the circuit 200, the signal $V_{112}$ is at a high level, and the output of the clocked inverter 201 does not have a high impedance. Thus, the signal $V_{211}$ at a high level is input to the node N1 via the clocked inverter 201, the node N1 is at a low level and the signal $V_{212}$ is at a high level. The output of the clocked inverter 202 has a high impedance.

At a time t2, the signal $V_{111}$ is set at a low level.

In the circuit 100, the signal $V_{111}$ at a low level is supplied to the wiring 112, so that the signal $V_{112}$ is at a low level.

In the circuit 200, the signal $V_{112}$ is at a low level, and the output of the clocked inverter 201 has a high impedance. Thus, the signal $V_{211}$ is not input to the node N1 via the clocked inverter 201. Since the signal $V_{112}$ is at a low level, the output of the clocked inverter 202 does not have a high impedance. Thus, the clocked inverter 202 and the inverter 203 form an inverter loop. The potential of the node N1 and the signal $V_{212}$ are held so that the signal $V_{212}$ is at a high level.

At a time t3, the signal $V_{114}$ is set at a low level, the signal $V_{115}$ is set at a high level, and the signal $V_{211}$ is set at a low level.

In the circuit 100, the switch 101A is turned off, the switch 101B is turned on, the switch 102A is turned on, and the switch 102B is turned off. Thus, the signal $V_{111}$ at a low level continues to be supplied to the wiring 112, so that the signal $V_{112}$ is kept at a low level.

In the circuit 200, the signal $V_{112}$ is kept at a low level, and the potential of the node N1 and the signal $V_{212}$ are held so that the signal $V_{212}$ is at a high level.

At a time t4, the signal $V_{111}$ is set at a high level.

In the circuit 100, the signal $V_{111}$ at a high level is supplied to the wiring 112, so that the signal $V_{112}$ is at a high level.

In the circuit 200, the signal $V_{112}$ is at a high level, and the output of the clocked inverter 201 does not have a high impedance. Thus, the signal $V_{211}$ at a low level is input to the node N1 via the clocked inverter 201, the node N1 is at a high level and the signal $V_{212}$ is at a low level. The output of the clocked inverter 202 has a high impedance.

At a time t5, the signal $V_{111}$ is set at a low level.

In the circuit 100, the signal $V_{111}$ at a low level is supplied to the wiring 112, so that the signal $V_{112}$ is at a low level.

In the circuit 200, the signal $V_{112}$ is at a low level, and the output of the clocked inverter 201 has a high impedance. Thus, the signal $V_{211}$ is not input to the node N1 via the clocked inverter 201. Since the signal $V_{112}$ is at a low level, the output of the clocked inverter 202 does not have a high impedance. Thus, the clocked inverter 202 and the inverter 203 form an inverter loop. The potential of the node N1 and the signal $V_{212}$ are held so that the signal $V_{212}$ is at a low level.

At a time t6, the signal $V_{115}$ is set at a low level.

In the circuit 100, the switch 102A is turned off and the switch 102B is turned on. Thus, the potential $V_{111}$ is supplied to the wiring 112, so that the signal $V_{112}$ is kept at a low level.

In the circuit 200, the signal $V_{112}$ is kept at a low level, and the potential of the node N1 and the signal $V_{212}$ are held so that the signal $V_{212}$ is at a low level.

The device illustrated in FIG. 14 operates in the above-described manner, the signal $V_{211}$ can be shifted in synchronization with the signal $V_{112}$.

The circuit 100 can stop supply of the signal $V_{111}$ to the circuit 200. A load of the wiring 111 can be small, which can reduce power consumption. In particular, the load of the wiring 111 can be smaller than that in the case where the signal $V_{111}$ is input to a gate of a transistor, whereby power consumption can be reduced.

Note that operations of the switch 101A, the switch 101B, the switch 102A, and the switch 102B in the case where a high-level signal is input to the control terminal are described, but the operations are not limited to the above description.

For example, when the signal $V_{114}$ is at a low level, the switch 101A may be turned on and the switch 101B may be turned off; when the signal $V_{114}$ is at a high level, the switch 101A may be turned off and the switch 101B may be turned on.

For example, when the signal $V_{115}$ is at a low level, the switch 102A may be turned on and the switch 102B may be turned off; when the signal $V_{115}$ is at a high level, the switch 102A may be turned off and the switch 102B may be turned on.

The signal $V_{114}$ at a high level or at a low level that has a potential at which the switch 101A is turned on may be called a first potential or active. The signal $V_{114}$ at a high level or at a low level that has a potential at which the switch 101A is turned off may be called a second potential or non-active (also referred to as inactive).

The signal $V_{115}$ at a high level or at a low level that has a potential at which the switch 102A is turned on may be called a first potential or active. The signal $V_{115}$ at a high level or at a low level that has a potential at which the switch 102A is turned off may be called a second potential or non-active (also referred to as inactive).

Next, a modification example of the circuit 200 illustrated in FIG. 14 is described.

Figure 16:
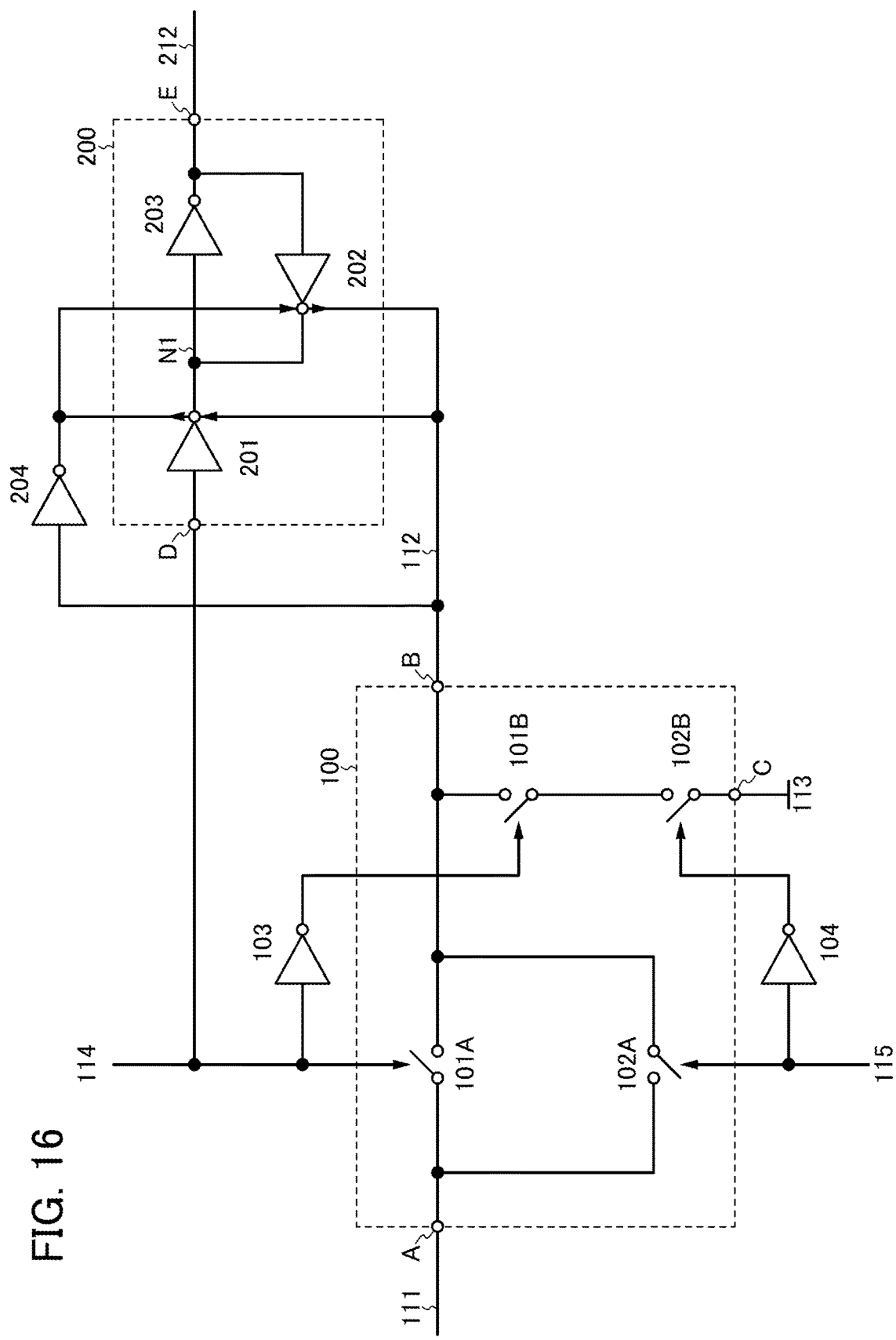
FIG. 16 illustrates a configuration of a device.

For example, as illustrated in FIG. 16, the wiring 114 may be connected to the terminal D of the circuit 200.

For example, the wiring 115 may be connected to the terminal D of the circuit 200.

For example, the output terminal of the inverter 103 may be connected to the terminal D of the circuit 200.

For example, the output terminal of the inverter 104 may be connected to the terminal D of the circuit 200.

Figure 17:
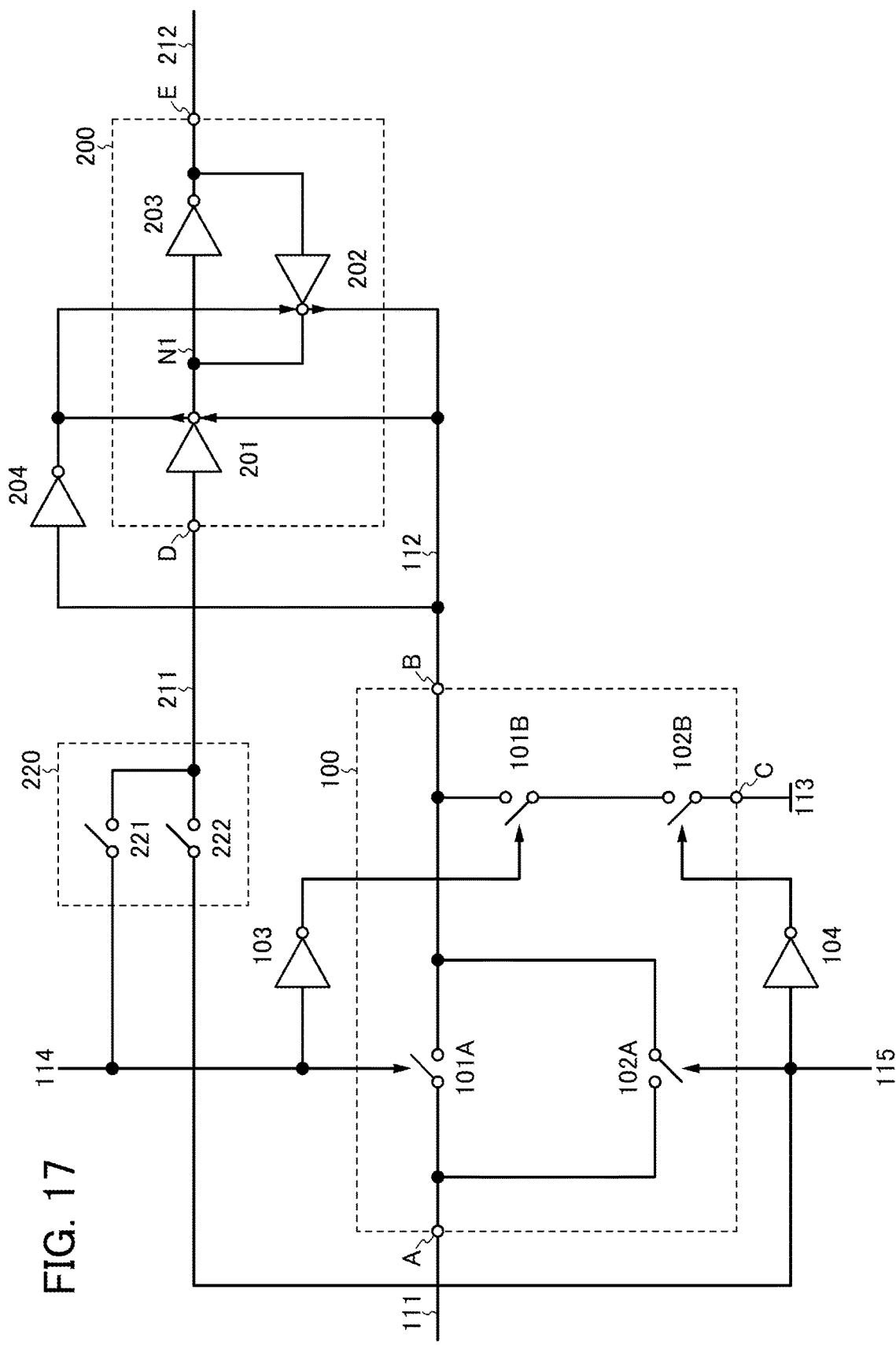
FIG. 17 illustrates a configuration of a device.

For example, a means or a circuit that determines whether the signal $V_{114}$ or a signal in accordance with the signal $V_{114}$ is supplied to the wiring 211, and whether the signal $V_{115}$ or a signal in accordance with the signal $V_{115}$ is supplied to the wiring 211 may be added. FIG. 17 illustrates a configuration example in which the circuit 220 is added. The circuit 220 is connected to the wiring 114, the wiring 115, and the wiring 211. The circuit 220 has a function of determining the conduction state between the wiring 114 and the wiring 211 and the conduction state between the wiring 115 and the wiring 211. When the wiring 114 and the wiring 211 are brought into conduction, the signal $V_{114}$ is supplied to the wiring 211. When the wiring 115 and the wiring 211 are brought into conduction, the signal $V_{115}$ is supplied to the wiring 211. In other words, the circuit 220 has a function of determining whether the signal $V_{114}$ is supplied to the wiring 211 and whether the signal $V_{115}$ is supplied to the wiring 211.

Note that when the wirings 114 and 211 are brought into conduction, the wirings 115 and 211 are preferably brought out of conduction. Similarly, when the wirings 115 and 211 are brought into conduction, the wirings 114 and 211 are preferably brought out of conduction. In that case, the signal $V_{114}$ and the signal $V_{115}$ can be prevented from being supplied to the wiring 211 at the same time.

The circuit 220 may include a switch 221 and a switch 222. A first terminal of the switch 221 is connected to the wiring 114, and a second terminal thereof is connected to the wiring 211. A first terminal of the switch 222 is connected to the wiring 115, and a second terminal thereof is connected to the wiring 211. When the switch 221 is on, the wiring 114 and the wiring 211 are brought into conduction, and the signal $V_{114}$ is supplied to the wiring 211. When the switch 222 is on, the wiring 115 and the wiring 211 are brought into conduction, and the signal $V_{115}$ is supplied to the wiring 211.

When one of the switches 221 and 222 is on, the other is preferably off. In that case, the signal $V_{114}$ and the signal $V_{115}$ can be prevented from being supplied to the wiring 211 at the same time.

The first terminal of the switch 221 may be connected to the output terminal of the inverter 103. The first terminal of the switch 222 may be connected to the output terminal of the inverter 104.

The circuit 200 may include the circuit 220.

For example, a sequential circuit capable of holding the signal $V_{211}$ or a signal in accordance with the signal $V_{211}$ may be used as the circuit 200. The timing when the circuit 200 holds the signal $V_{211}$ or the signal in accordance with the signal $V_{211}$ is preferably controlled by the signal $V_{112}$ or the signal in accordance with the signal $V_{112}$.

For example, a sequential circuit capable of holding the signal $V_{112}$ or a signal in accordance with the signal $V_{112}$ may be used as the circuit 200. The timing when the circuit 200 holds the signal $V_{112}$ or the signal in accordance with the signal $V_{112}$ is preferably controlled by the signal $V_{211}$ or the signal in accordance with the signal $V_{211}$.

Figure 18A:
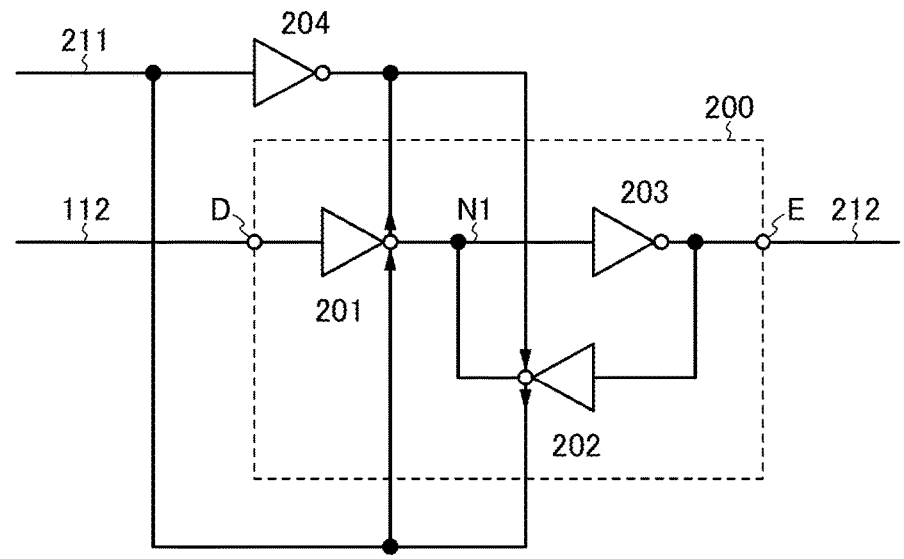
FIGS. 18A and 18B illustrate configurations of a device.

For example, as illustrated in FIG. 18A, the input terminal of the clocked inverter 201 may be connected to the wiring 112, a first control terminal of the clocked inverter 201, a second control terminal of the clocked inverter 201, and an input terminal of the inverter 204 may be connected to the wiring 211.

For example, the circuit 200 may include one or plural circuits having a function of determining whether the output has a high impedance. Whether the output has a high impedance is preferably determined by the signal $V_{112}$ or the signal in accordance with the signal $V_{112}$.

For example, the circuit 200 may include one or plural logic circuits. In any one of the one or the plural logic circuits, the signal $V_{112}$ or the signal in accordance with the signal $V_{112}$ is preferably input to an input terminal.

Figure 18B:
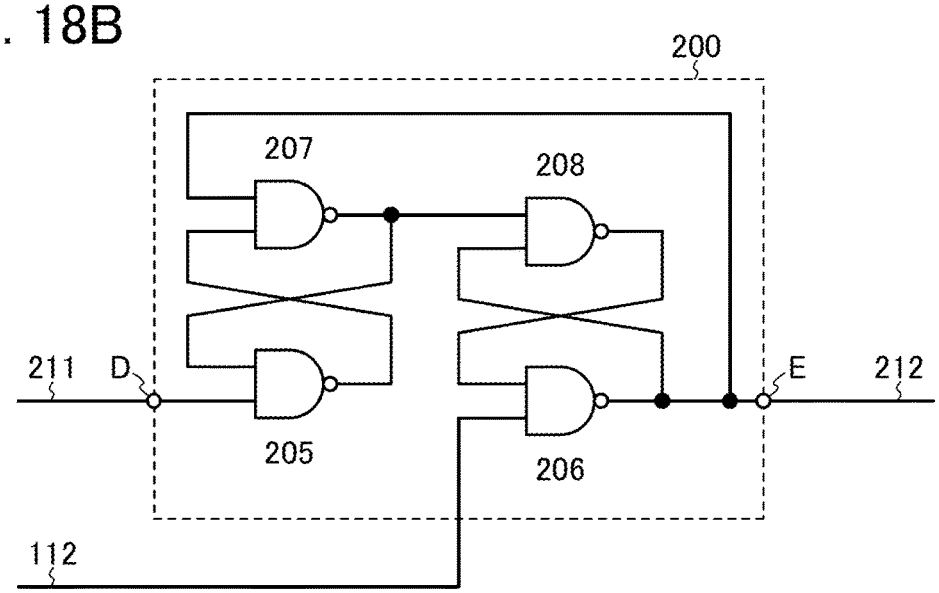

For example, as illustrated in FIG. 18B, the circuit 200 may include a NAND circuit 205, a NAND circuit 206, a NAND circuit 207, and a NAND circuit 208. A first input terminal of the NAND circuit 205 is connected to the wiring 211, a second input terminal thereof is connected to an output terminal of the NAND circuit 207, and an output terminal thereof is connected to a first input terminal of the NAND circuit 207. A first input terminal of the NAND circuit 206 is connected to the wiring 112, a second input terminal thereof is connected to an output terminal of the NAND circuit 208, and an output terminal thereof is connected to a first input terminal of the NAND circuit 208 and the wiring 212. A second input terminal of the NAND circuit 207 is connected to the wiring 212, and the output terminal thereof is connected to the second input terminal of the NAND circuit 208.

A content described in this embodiment can be implemented by being combined with any of the other contents described in this embodiment and/or any of contents described in the other embodiments in this specification and the like, as appropriate.

Embodiment 3

In this embodiment, a device of one embodiment of the present invention is described.

Figure 19:
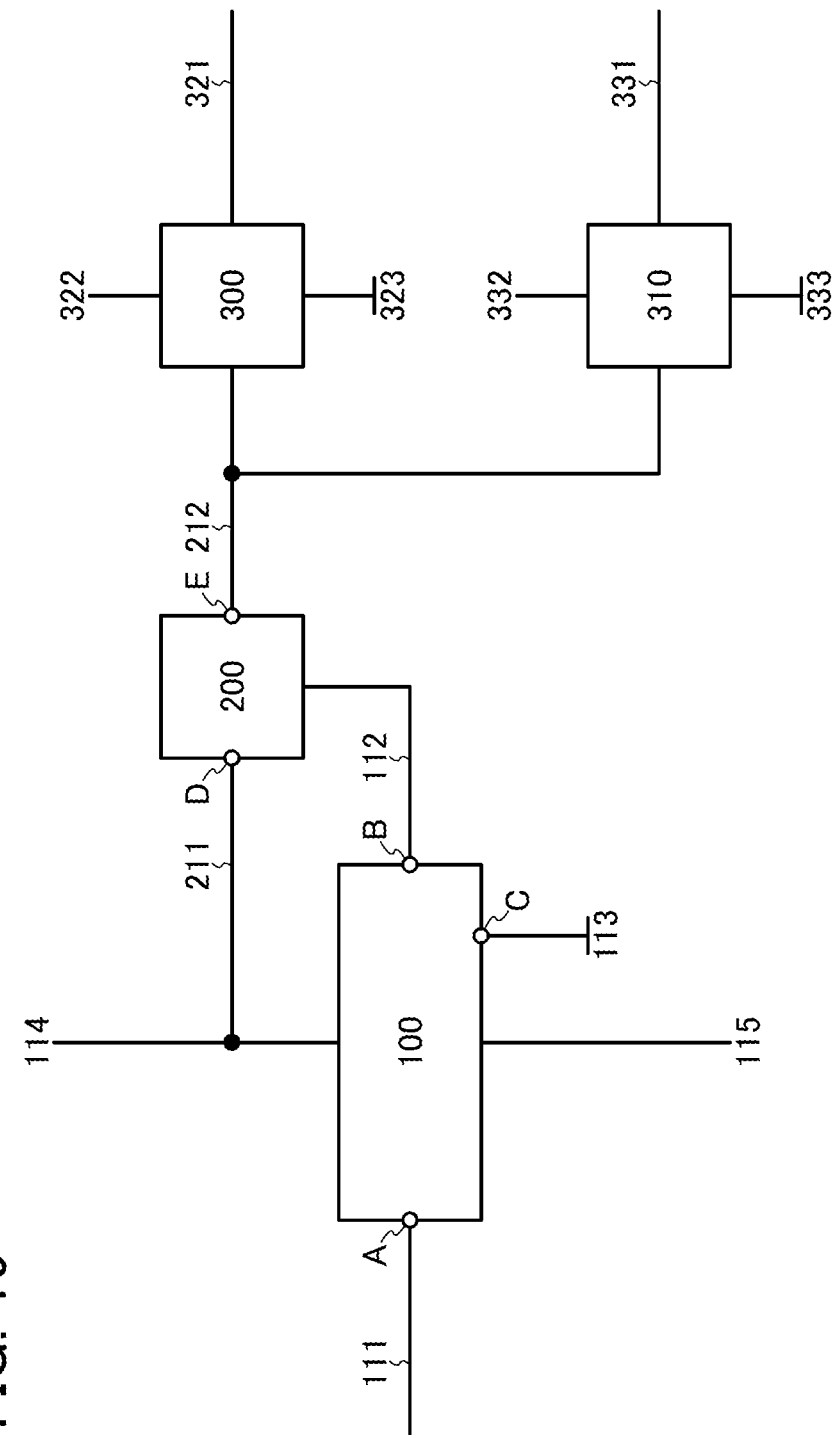
FIG. 19 illustrates a configuration of a device.

FIG. 19 illustrates an example of the structure of a device of one embodiment of the present invention.

A device illustrated in FIG. 19 includes the circuit 100, the circuit 200, a circuit 300, and a circuit 310.

The circuit 100 and the circuit 200 in FIG. 19 correspond to the circuit 100 and the circuit 200 in Embodiment 1, 2, or the like.

Figure 20:
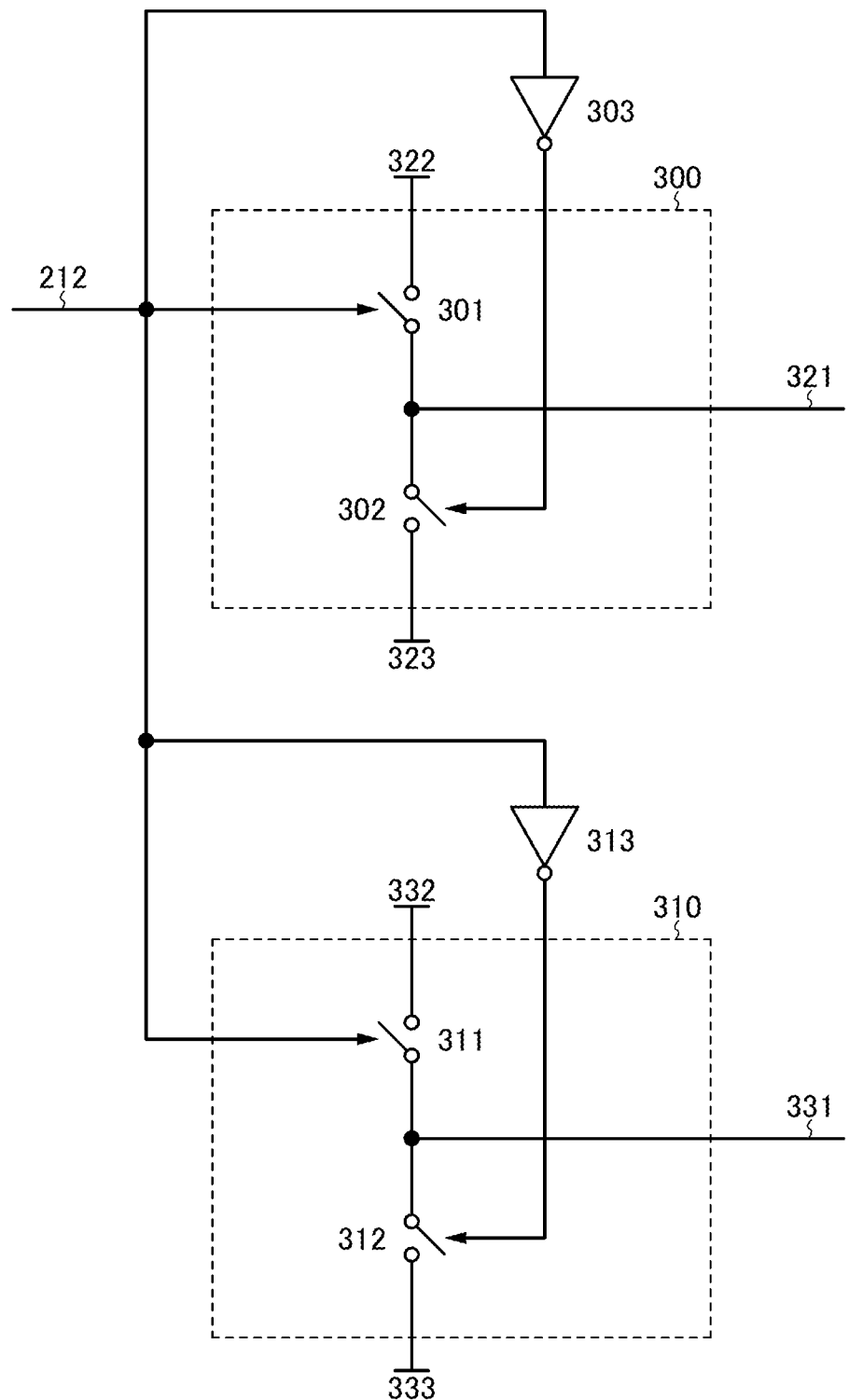
FIG. 20 illustrates a configuration of a device.

FIG. 20 illustrates a configuration example of the circuit 300 and the circuit 310.

The circuit 300 includes a switch 301 and a switch 302. A first terminal of the switch 301 is connected to the wiring 322, a second terminal thereof is connected to the wiring 321, and a control terminal thereof is connected to the wiring 212. A first terminal of the switch 302 is connected to the wiring 323, a second terminal thereof is connected to the wiring 321, and a control terminal thereof is connected to an output terminal of the inverter 303.

The circuit 310 includes a switch 311 and a switch 312. A first terminal of the switch 311 is connected to the wiring 332, a second terminal thereof is connected to the wiring 331, and a control terminal thereof is connected to the wiring 212. A first terminal of the switch 312 is connected to the wiring 333, a second terminal thereof is connected to the wiring 331, and a control terminal thereof is connected to an output terminal of the inverter 313.

The circuit 300 has a function of determining the conduction state between the wiring 322 and the wiring 321 and the conduction state between the wiring 323 and the wiring 321. When the wiring 322 and the wiring 321 are brought into conduction, a signal of the wiring 322 (also referred to as a signal $V_{322}$) is supplied to the wiring 321. When the wiring 323 and the wiring 321 are brought into conduction, a potential of the wiring 323 (also referred to as a potential $V_{323}$) is supplied to the wiring 321. In other words, the circuit 300 has a function of determining whether the signal $V_{322}$ is supplied to the wiring 321 and whether the potential $V_{323}$ is supplied to the wiring 321.

The circuit 310 has a function of determining the conduction state between the wiring 332 and the wiring 331 and the conduction state between the wiring 333 and the wiring 331. When the wiring 332 and the wiring 331 are brought into conduction, a signal of the wiring 332 (also referred to as a signal $V_{332}$) is supplied to the wiring 331. When the wiring 333 and the wiring 331 are brought into conduction, a potential of the wiring 333 (also referred to as a potential $V_{333}$) is supplied to the wiring 331. In other words, the circuit 310 has a function of determining whether the signal $V_{332}$ is supplied to the wiring 331 and whether the potential $V_{333}$ is supplied to the wiring 331.

The conduction state between the wiring 322 and the wiring 321 and the conduction state between the wiring 323 and the wiring 321 can be determined by controlling the on/off states of the switch 301 and the switch 302. When the switch 301 is on, the wiring 322 and the wiring 321 are brought into conduction. When the switch 302 is on, the wiring 323 and the wiring 321 are brought into conduction.

The conduction state between the wiring 332 and the wiring 331 and the conduction state between the wiring 333 and the wiring 331 can be determined by controlling the on/off states of the switch 311 and the switch 312. When the switch 311 is on, the wiring 332 and the wiring 331 are brought into conduction. When the switch 312 is on, the wiring 333 and the wiring 331 are brought into conduction.

A signal of the wiring 321 (also referred to as a signal $V_{321}$) is controlled in accordance with the signal $V_{322}$ and the potential $V_{323}$. In the case where the signal $V_{322}$ is supplied to the wiring 321, the signal $V_{321}$ has the same or substantially the same potential as the signal $V_{322}$. In the case where the potential $V_{323}$ is supplied to the wiring 321, the signal $V_{321}$ has the same or substantially the same potential as the potential $V_{323}$.

A signal having a high level and a low level, i.e., a digital signal, is given as the signal $V_{322}$. Specifically, the signal $V_{322}$ is preferably a clock signal. Note that the signal $V_{322}$ preferably has a phase different from a phase of the signal $V_{111}$. Accordingly, in the case where the signal $V_{322}$ is supplied to the wiring 321, when the signal $V_{322}$ is at a high level, the signal $V_{321}$ is also at a high level; when the signal $V_{322}$ is at a low level, the signal $V_{321}$ is also at a low level. Note that the present invention is not limited to this.

The potential $V_{323}$ is, for example, a potential corresponding to a low level of the signal $V_{322}$. Accordingly, in the case where the potential $V_{323}$ is supplied to the wiring 321, the signal $V_{321}$ is at a low level. Note that the present invention is not limited to this. The potential $V_{323}$ may be a potential corresponding to a high level of the signal $V_{322}$.

A signal of the wiring 331 (also referred to as a signal $V_{331}$) is controlled in accordance with the signal $V_{332}$ and the potential $V_{333}$. In the case where the signal $V_{332}$ is supplied to the wiring 331, the signal $V_{331}$ has the same or substantially the same potential as the signal $V_{332}$. In the case where the potential $V_{333}$ is supplied to the wiring 331, the signal $V_{331}$ has the same or substantially the same potential as the potential $V_{333}$.

A signal having a high level and a low level, i.e., a digital signal, is given as the signal $V_{332}$. Specifically, the signal $V_{332}$ is preferably a clock signal. Note that the signal $V_{332}$ preferably has a phase different from phases of the signal $V_{111}$ and the signal $V_{322}$. Accordingly, in the case where the signal $V_{332}$ is supplied to the wiring 331, when the signal $V_{332}$ is at a high level, the signal $V_{331}$ is also at a high level; when the signal $V_{332}$ is at a low level, the signal $V_{331}$ is also at a low level. Note that the present invention is not limited to this.

The potential $V_{333}$ is, for example, a potential corresponding to a low level of the signal $V_{332}$. Accordingly, in the case where the potential $V_{333}$ is supplied to the wiring 331, the signal $V_{331}$ is at a low level. Note that the present invention is not limited to this. The potential $V_{333}$ may be a potential corresponding to a high level of the signal $V_{332}$.

The potential $V_{323}$ and the potential $V_{333}$ may be the same potential or substantially the same potential. In such a case, the same potential may be supplied to the wiring 323 and the wiring 333. Alternatively, the wiring 323 and the wiring 333 may be combined into one wiring.

When the wirings 322 and 321 are brought into conduction, the wirings 323 and 321 are preferably brought out of conduction. Similarly, when the wirings 322 and 321 are brought out of conduction, the wirings 323 and 321 are preferably brought into conduction. That is, when one of the switch 301 and the switch 302 is on, the other is preferably off. In that case, the signal $V_{322}$ and the potential $V_{323}$ can be prevented from being supplied to the wiring 321 at the same time.

When the wirings 332 and 331 are brought into conduction, the wirings 333 and 331 are preferably brought out of conduction. Similarly, when the wirings 332 and 331 are brought out of conduction, the wirings 333 and 331 are preferably brought into conduction. That is, when one of the switch 311 and the switch 312 is on, the other is preferably off. In that case, the signal $V_{332}$ and the potential $V_{333}$ can be prevented from being supplied to the wiring 331 at the same time.

The circuit 300 is controlled by the signal $V_{212}$. Specifically, the switch 301 is controlled by the signal $V_{212}$, and the switch 302 is controlled by an inversion signal of the signal $V_{212}$.

The circuit 310 is controlled by the signal $V_{212}$. Specifically, the switch 311 is controlled by the signal $V_{212}$, and the switch 312 is controlled by an inversion signal of the signal $V_{212}$.

The operation of the device in FIG. 19 and FIG. 20 is described with reference to a timing chart of FIG. 21.

Figure 21:
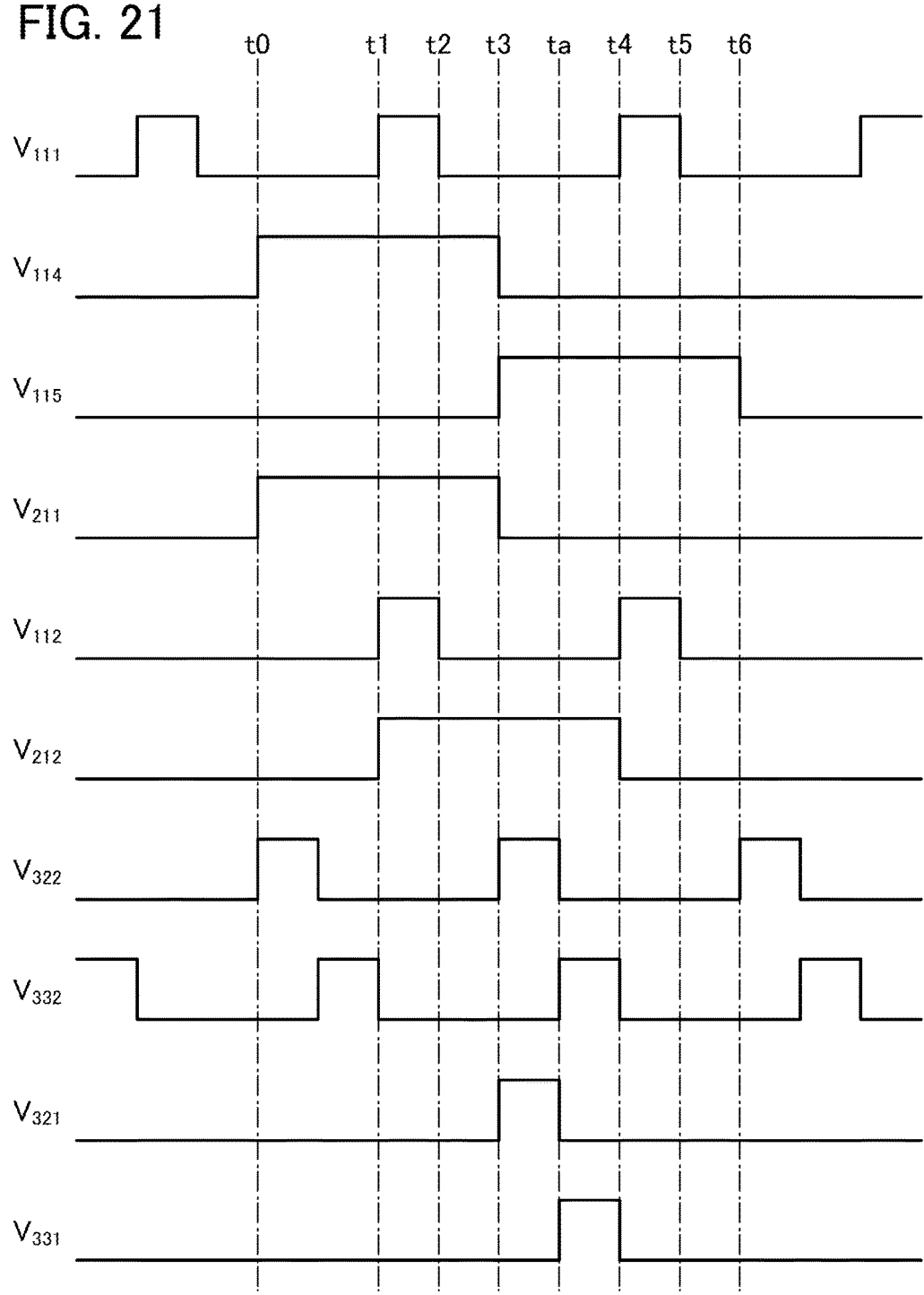
FIG. 21 illustrates operations of a device.

FIG. 21 is a timing chart obtained by adding examples of the signal $V_{322}$, the signal $V_{332}$, the signal $V_{321}$, and the signal $V_{333}$ to the timing chart illustrated in FIG. 15.

At the time t1, the signal $V_{322}$ is set at a low level, and the signal $V_{332}$ is set at a low level.

In the circuit 300, the signal $V_{212}$ is at a high level, so that the switch 301 is turned on and the switch 302 is turned off. Thus, the signal $V_{322}$ at a low level is supplied to the wiring 321, and the signal $V_{321}$ is at a low level.

In the circuit 310, the signal $V_{212}$ is at a high level, so that the switch 311 is turned on and the switch 312 is turned off. Thus, the signal $V_{332}$ at a low level is supplied to the wiring 331, and the signal $V_{331}$ is at a low level.

At a time t2, the signal $V_{322}$ is at a high level.

In the circuit 300, the signal $V_{212}$ is kept at a high level, so that the switch 301 remains on and the switch 302 remains off. Thus, the signal $V_{322}$ at a high level is supplied to the wiring 321, and the signal $V_{321}$ is at a high level.

In the circuit 310, the signal $V_{212}$ is kept at a high level, so that the switch 311 remains on and the switch 312 remains off. Thus, the signal $V_{322}$ at a low level is supplied to the wiring 331, and the signal $V_{331}$ is kept at a high level.

At a time ta (t3<ta<t4), the signal $V_{322}$ is set at a low level and the signal $V_{323}$ is set at a high level.

In the circuit 300, the signal $V_{212}$ is kept at a high level, so that the switch 301 remains on and the switch 302 remains off. Thus, the signal $V_{322}$ at a low level is supplied to the wiring 321, and the signal $V_{321}$ is at a low level.

In the circuit 310, the signal $V_{212}$ is kept at a high level, so that the switch 311 remains on and the switch 312 remains off. Thus, the signal $V_{322}$ at a low level is supplied to the wiring 331, and the signal $V_{331}$ is kept at a high level.

At a time t4, the signal $V_{323}$ is set at a low level.

In the circuit 300, the signal $V_{212}$ is at a low level, so that the switch 301 is turned off and the switch 302 is turned on. Thus, the potential $V_{323}$ is supplied to the wiring 321, and the signal $V_{321}$ is kept at a low level.

In the circuit 310, the signal $V_{212}$ is at a low level, so that the switch 311 is turned off and the switch 312 is turned on. Thus, the potential $V_{333}$ is supplied to the wiring 331, so that the signal $V_{331}$ is at a low level.

As described above, the signals $V_{321}$ and $V_{331}$ each having a smaller pulse width than the signal $V_{212}$ can be generated.

Note that operations of the switch 301, the switch 302, the switch 311, and the switch 312 in the case where a high-level signal is input to the control terminal are described, but the operations are not limited to the above description.

Configurations for controlling the switch 301, the switch 302, the switch 311, and the switch 312 are not limited to those illustrated in FIG. 19 and FIG. 20.

Figure 22:
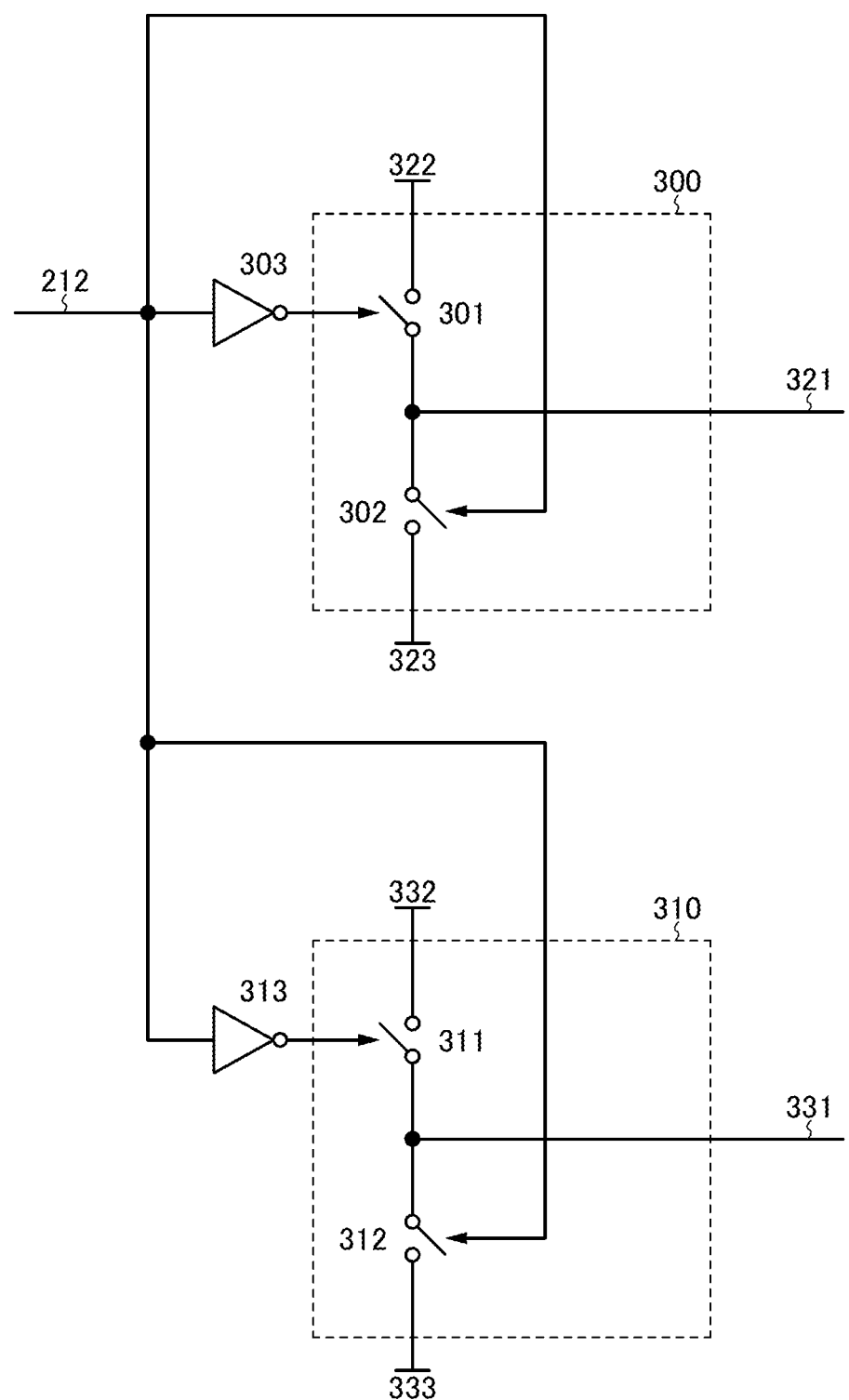
FIG. 22 illustrates a configuration of a device.

For example, as illustrated in FIG. 22, the switch 302 may be controlled by the signal $V_{212}$, and the switch 301 may be controlled by the inversion signal of the signal $V_{212}$. In that case, the wiring 212 is connected to a control terminal of the switch 302, and to a control terminal of the switch 301 via the inverter 303.

For example, as illustrated in FIG. 22, the switch 312 may be controlled by the signal $V_{212}$, and the switch 311 may be controlled by the inversion signal of the signal $V_{212}$. In that case, the wiring 212 is connected to a control terminal of the switch 312, and to a control terminal of the switch 311 via the inverter 313.

For example, both of the switches 301 and 302 may be controlled by the signal $V_{212}$. In that case, the wiring 212 is connected to a control terminal of the switch 301 and a control terminal of the switch 302.

For example, both of the switches 311 and 312 may be controlled by the signal $V_{212}$. In that case, the wiring 212 is connected to a control terminal of the switch 311 and a control terminal of the switch 312.

Figure 23:
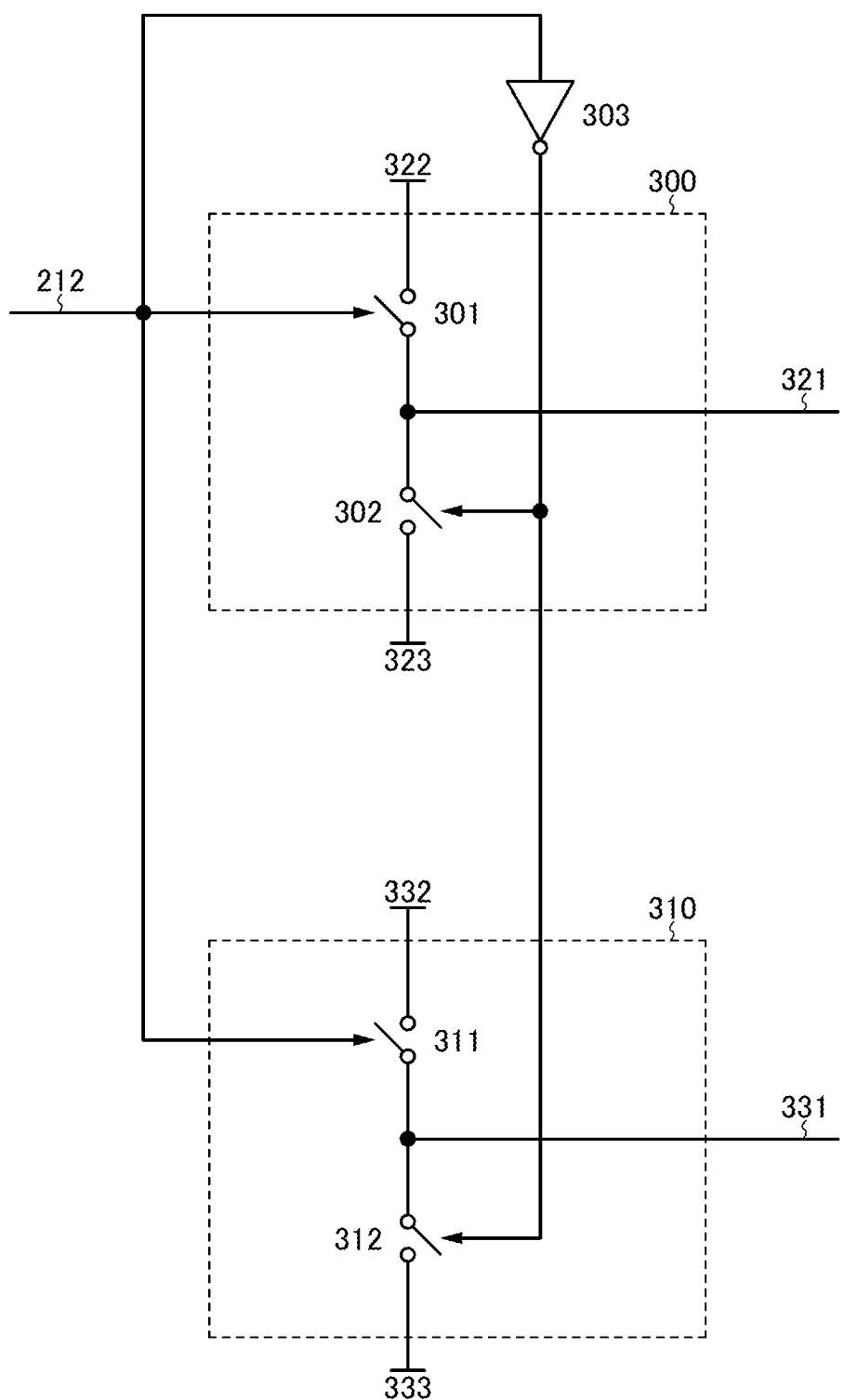
FIG. 23 illustrates a configuration of a device.

For example, as illustrated in FIG. 23, the switch 312 may be controlled by an inversion signal of the signal $V_{212}$. In such a case, an output terminal of the inverter 303 is connected to a control terminal of the switch 302 and a control terminal of the switch 312.

For example, a circuit having a function of outputting an inversion signal of an input signal may be used instead of the inverter 303. Examples of such a circuit include a NAND circuit, a NOR circuit, and a clocked inverter.

For example, a circuit having a function of outputting an inversion signal of an input signal may be used instead of the inverter 313. Examples of such a circuit include a NAND circuit, a NOR circuit, and a clocked inverter.

Next, a configuration example that can be applied to the switch 301, the switch 302, the switch 311, and the switch 312 is described.

Like the switches 101A, 101B, 102A, and 102B, a variety of switches can be used as the switch 301, the switch 302, the switch 311, and the switch 312.

Figure 24:
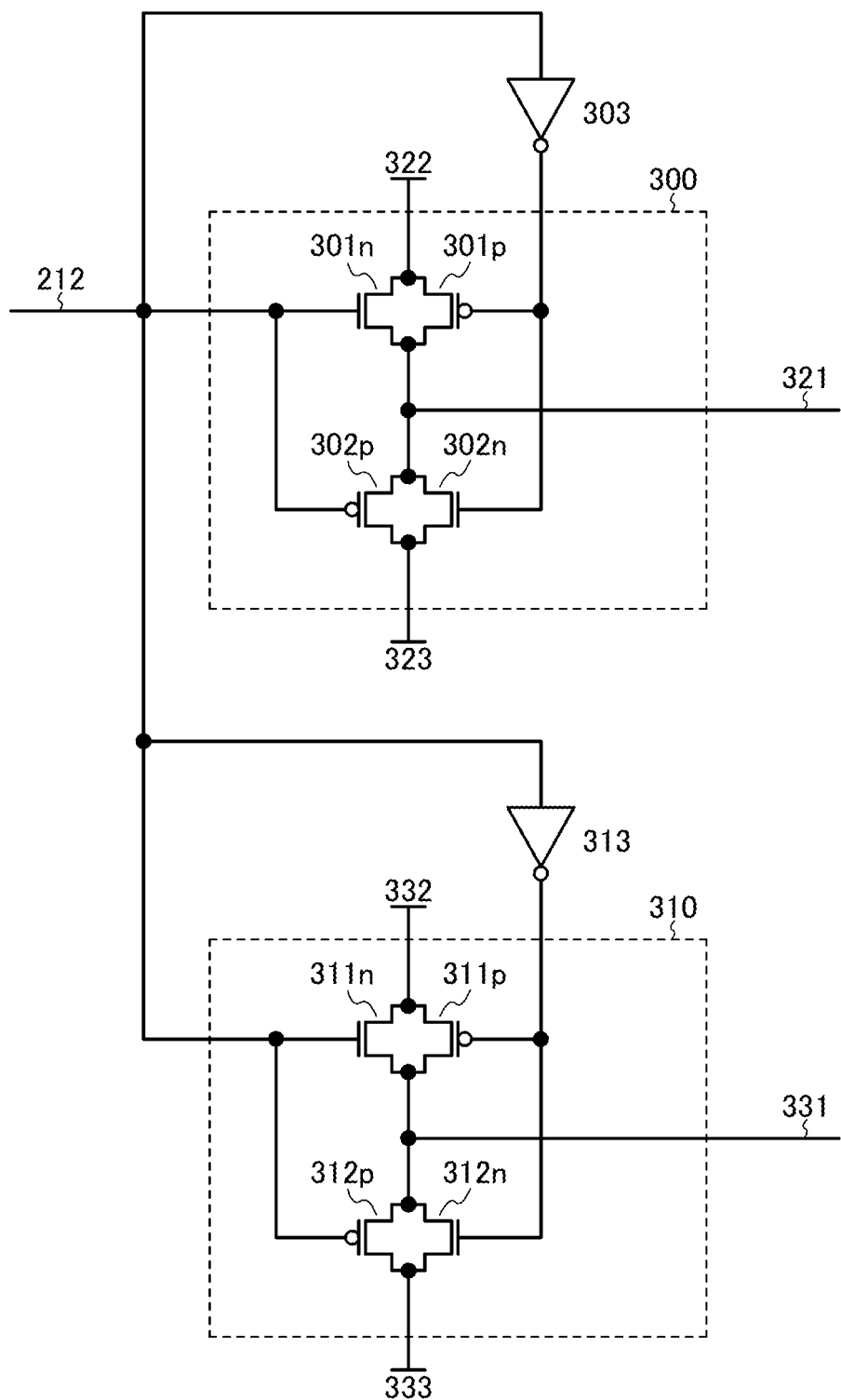
FIG. 24 illustrates a configuration of a device.

FIG. 24 illustrates a configuration example in which CMOS switches are used as the switches 301, 302, 311, and 312 in the circuits 300 and 310 illustrated in FIG. 20.

An n-channel transistor 301*n* and a p-channel transistor 301*p* correspond to the switch 301. A first terminal of the transistor 301*n* and a first terminal of the transistor 301*p* correspond to a first terminal of the switch 301, and are connected to the wiring 322. A second terminal of the transistor 301*n* and a second terminal of the transistor 301*p* correspond to a second terminal of the switch 301, and are connected to the wiring 321. A gate of the transistor 301*n* and a gate of the transistor 301*p* correspond to a control terminal of the switch 301. The gate of the transistor 301*n* is connected to the wiring 212, and the gate of the transistor 301*p* is connected to the output terminal of the inverter 303.

An n-channel transistor 302*n* and a p-channel transistor 302*p* correspond to the switch 302. A first terminal of the transistor 302*n* and a first terminal of the transistor 302*p* correspond to a first terminal of the switch 302, and are connected to the wiring 323. A second terminal of the transistor 302*n* and a second terminal of the transistor 302*p* correspond to a second terminal of the switch 302, and are connected to the wiring 321. A gate of the transistor 302*n* and a gate of the transistor 302*p* correspond to a control terminal of the switch 302. The gate of the transistor 302*n* is connected to the output terminal of the inverter 303. The gate of the transistor 302*p* is connected to the wiring 212.

An n-channel transistor 311*n* and a p-channel transistor 311*p* correspond to the switch 311. A first terminal of the transistor 311*n* and a first terminal of the transistor 311*p* correspond to a first terminal of the switch 311, and are connected to the wiring 332. A second terminal of the transistor 311*n* and a second terminal of the transistor 311*p* correspond to a second terminal of the switch 311, and are connected to the wiring 331. A gate of the transistor 311*n* and a gate of the transistor 311*p* correspond to a control terminal of the switch 311. The gate of the transistor 311*n* is connected to the wiring 212, and the gate of the transistor 311*p* is connected to the output terminal of the inverter 313.

An n-channel transistor 312*n* and a p-channel transistor 312*p* correspond to the switch 312. A first terminal of the transistor 312*n* and a first terminal of the transistor 312*p* correspond to a first terminal of the switch 312, and are connected to the wiring 333. A second terminal of the transistor 312*n* and a second terminal of the transistor 312*p* correspond to a second terminal of the switch 312, and are connected to the wiring 333. A gate of the transistor 312*n* and a gate of the transistor 312*p* correspond to a control terminal of the switch 312. The gate of the transistor 312*n* is connected to an output terminal of the inverter 313, and the gate of the transistor 312*p* is connected to the wiring 212.

Configurations for controlling transistors used as the switch 301, the switch 302, the switch 311, and the switch 312 are not limited to those illustrated in FIG. 24.

For example, as illustrated in FIG. 22, the gate of the transistor 301*n* and the gate of the transistor 302*p* may be connected to the output terminal of the inverter 303, and the gate of the transistor 301*p* and the gate of the transistor 302*n* may be connected to the wiring 212.

For example, as illustrated in FIG. 22, the gate of the transistor 311*n* and the gate of the transistor 312*p* may be connected to the output terminal of the inverter 313, and the gate of the transistor 311*p* and the gate of the transistor 312*n* may be connected to the wiring 212.

For example, as in the configuration illustrated in FIG. 23, a gate of the transistor 311*p* and a gate of the transistor 312*n* may be connected to the output terminal of the inverter 303.

The switches 301, 302, 311, and 312 are not limited to CMOS switches.

Figure 25:
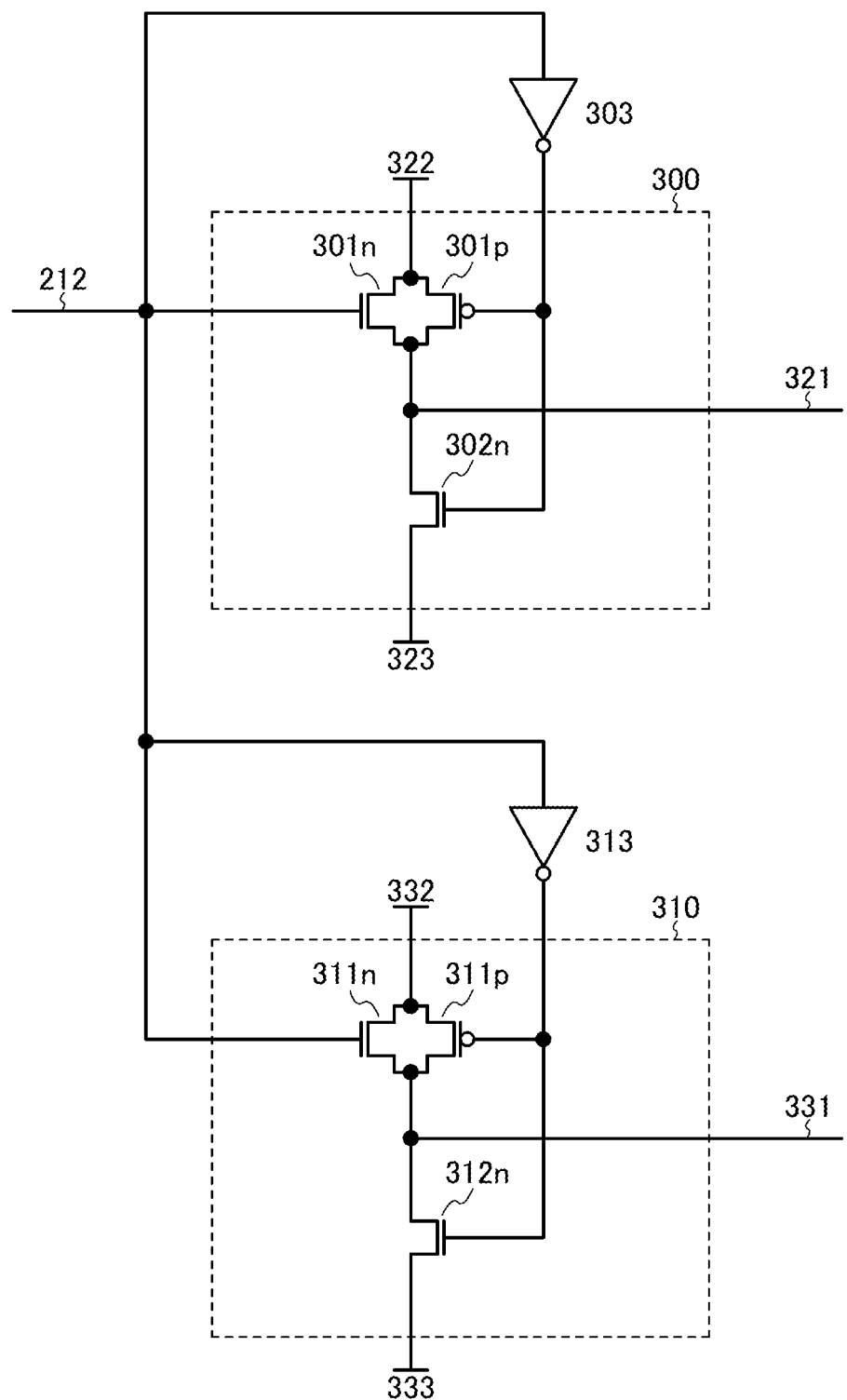
FIG. 25 illustrates a configuration of a device.

For example, as illustrated in FIG. 25, an n-channel transistor may be used as the switch 302. That is, the transistor 302*p* may be omitted.

For example, as illustrated in FIG. 25, an n-channel transistor may be used as the switch 312. That is, the transistor 312*p* may be omitted.

For example, a p-channel transistor may be used as the switch 302. That is, the transistor 302*n* may be omitted.

For example, a p-channel transistor may be used as the switch 312. That is, the transistor 312n may be omitted.

For example, an n-channel transistor may be used as the switch 301. That is, the transistor 301p may be omitted.

For example, an n-channel transistor may be used as the switch 311. That is, the transistor 311p may be omitted.

For example, a p-channel transistor may be used as the switch 301. That is, the transistor 301n may be omitted.

For example, a p-channel transistor may be used as the switch 311. That is, the transistor 311n may be omitted.

Note that in the case where the switch 302 is an n-channel transistor, the potential $V_{323}$ is preferably a potential corresponding to a low level of the signal $V_{212}$. In that case, a potential difference between a gate and a source of the n-channel transistor as the switch 302 can be large. Therefore, a resistance value between the wiring 323 and the wiring 321 can be small.

Note that in the case where the switch 312 is an n-channel transistor, the potential $V_{333}$ is preferably a potential corresponding to a low level of the signal $V_{212}$. In that case, a potential difference between a gate and a source of the n-channel transistor as the switch 312 can be large. Therefore, a resistance value between the wiring 333 and the wiring 331 can be small.

Note that in the case where the switch 302 is a p-channel transistor, the potential $V_{323}$ is preferably a potential corresponding to a high level of the signal $V_{212}$. In that case, a potential difference between a gate and a source of the p-channel transistor as the switch 302 can be large. Therefore, a resistance value between the wiring 323 and the wiring 321 can be small.

Note that in the case where the switch 312 is a p-channel transistor, the potential $V_{333}$ is preferably a potential corresponding to a high level of the signal $V_{212}$. In that case, a potential difference between a gate and a source of the p-channel transistor as the switch 312 can be large. Therefore, a resistance value between the wiring 333 and the wiring 331 can be small.

Next, a modification example of the circuits 300 and 310 illustrated in FIG. 19 and FIG. 20 is described.

For example, the wiring 323 and the wiring 333 may be combined into one wiring. In such a case, the first terminal of the switch 302 and a first terminal of the switch 312 are connected to the wiring 323 or the wiring 333.

For example, the wiring 323, the wiring 333, and the wiring 113 may be combined into one wiring. In such a case, the first terminal of the switch 302, the first terminal of the switch 312, and the switch 101B are connected to the wiring 323, the wiring 333, the wiring 113, or the portion described in Embodiment 1 to which the first terminal of the switch 302 is connected (the wiring 114, the wiring 115, the output terminal of the inverter 103, or an output terminal of the inverter 104).

Figure 26:
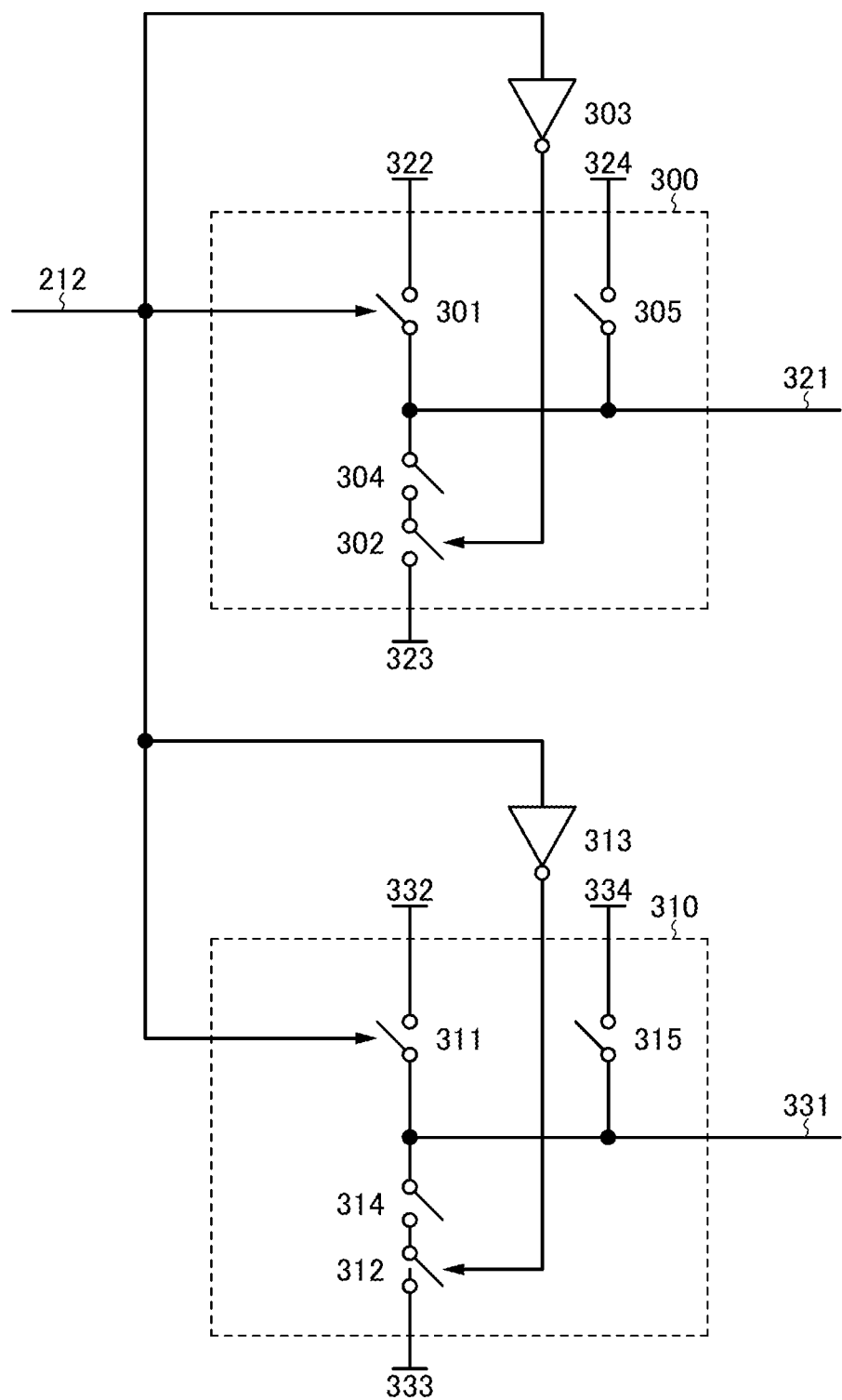
FIG. 26 illustrates a configuration of a device.

For example, a structure for initializing the potential of the wiring 321 may be added to the circuit 300. FIG. 26 illustrates a configuration in which a switch 304 and a switch 305 are added for initializing the potential of the wiring 321. A first terminal of the switch 304 is connected to the second terminal of the switch 302. A second terminal of the switch 304 is connected to the wiring 321. A first terminal of the switch 305 is connected to the wiring 324. A second terminal of the switch 305 is connected to the wiring 321. When one of the switch 304 and the switch 305 is on, the other is preferably off. When the switch 304 is on and the switch 305 is off, the operation of the circuit 300 illustrated in FIG. 26 is similar to that of the circuit 300 illustrated in FIG. 20. In contrast, when the switch 304 is off and the switch 305 is on, a potential of the wiring 324 (also referred to as a potential $V_{324}$) is supplied to the wiring 321. When the potential $V_{324}$ corresponds to a high level of the signal $V_{322}$, the signal $V_{321}$ is at a high level. Thus, the potential of the wiring 321 can be initialized.

Note that the switch 304 and the switch 302 are connected in series between the wiring 323 and the wiring 321. For example, the switch 302 and the wiring 323 may be connected via the switch 304.

When the switch 305 is on, the switch 301 is preferably off. In that case, the signal $V_{322}$ and the potential $V_{324}$ can be prevented from being supplied to the wiring 321 at the same time.

For example, a structure for initializing the potential of the wiring 331 may be added to the circuit 310. FIG. 26 illustrates a configuration in which a switch 314 and a switch 315 are added for initializing the potential of the wiring 331. A first terminal of the switch 314 is connected to the second terminal of the switch 312. A second terminal of the switch 314 is connected to the wiring 331. A first terminal of the switch 315 is connected to the wiring 334. A second terminal of the switch 315 is connected to the wiring 331. When one of the switch 314 and the switch 315 is on, the other is preferably off. When the switch 314 is on and the switch 315 is off, the operation of the circuit 310 illustrated in FIG. 26 is similar to that of the circuit 310 illustrated in FIG. 20. In contrast, when the switch 314 is off and the switch 315 is on, a potential of the wiring 334 (also referred to as a potential $V_{334}$) is supplied to the wiring 331. When the potential $V_{334}$ corresponds to a high level of the signal $V_{332}$, the signal $V_{331}$ is at a high level. Thus, the potential of the wiring 331 can be initialized.

Note that the switch 314 and the switch 312 are connected in series between the wiring 333 and the wiring 331. For example, the switch 312 and the wiring 333 may be connected via the switch 314.

When the switch 315 is on, the switch 311 is preferably off. In that case, the signal $V_{332}$ and the potential $V_{334}$ can be prevented from being supplied to the wiring 331 at the same time.

Note that the wiring 324 and the wiring 334 may be combined into one wiring. In such a case, the first terminal of the switch 305 and the first terminal of the switch 315 are connected to the wiring 324 or the wiring 334.

Figure 27:
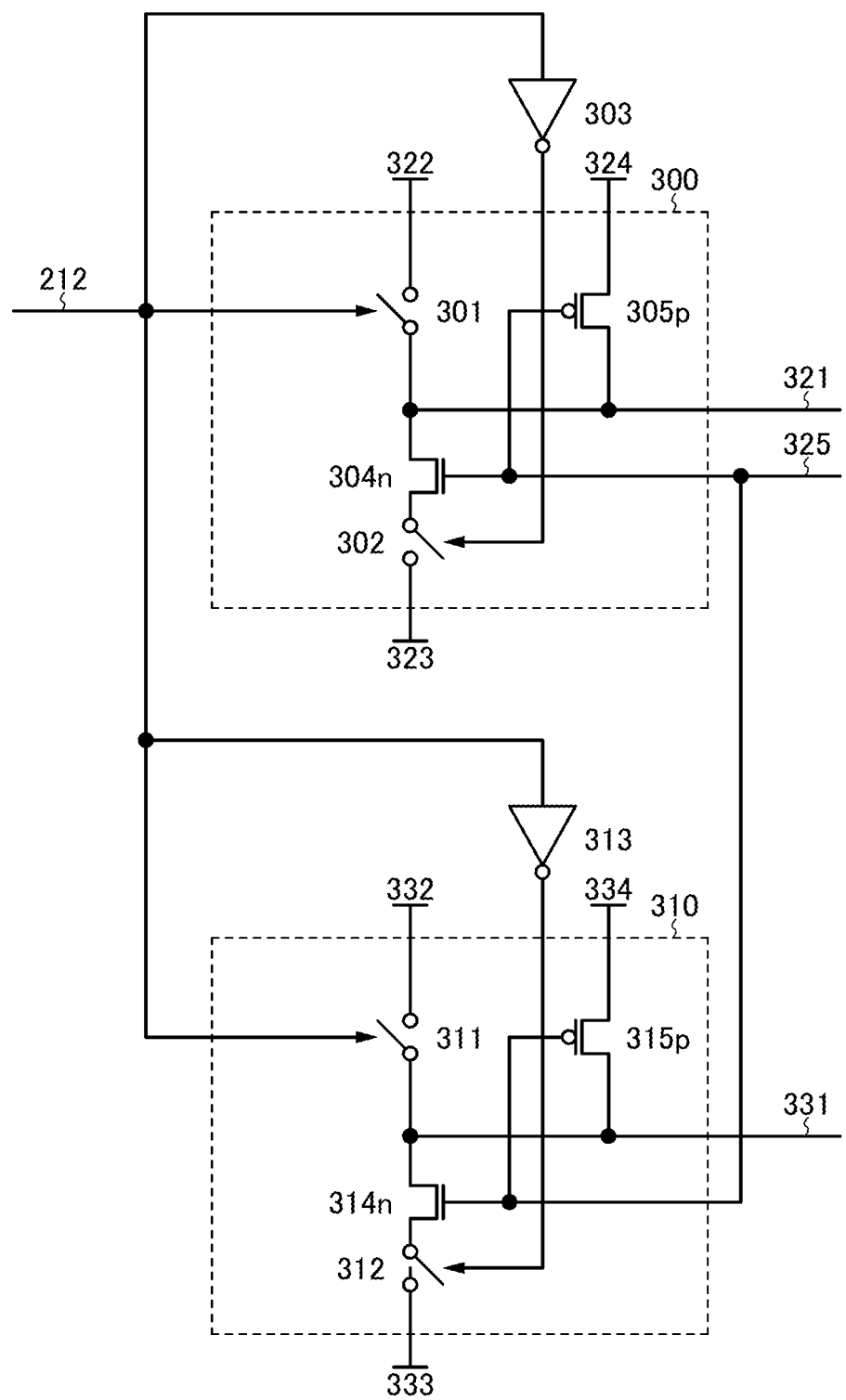
FIG. 27 illustrates a configuration of a device.

Like the switches 101A, 101B, 102A, and 102B, a variety of switches can be used as the switch 304, the switch 305, the switch 314, and the switch 315. FIG. 27 illustrates a configuration example in which n-channel transistors are used as the switch 304 and the switch 314 and p-channel transistors are used as the switch 305 and the switch 315 in the circuit 300 and the circuit 310 illustrated in FIG. 26. An n-channel transistor 304n corresponds to the switch 304. A first terminal of the transistor 304n corresponds to a first terminal of the switch 304, and is connected to a second terminal of the switch 302. A second terminal of the transistor 304n corresponds to a second terminal of the switch 304, and is connected to the wiring 321. A gate of the transistor 304n corresponds to a control terminal of the switch 304, and is connected to the wiring 325. A p-channel transistor 305p corresponds to the switch 305. A first terminal of the transistor 305p corresponds to the first terminal of the switch 305, and is connected to the wiring 325. A second terminal of the transistor 305p corresponds to the second terminal of the switch 305, and is connected to the wiring 321. A gate of the transistor 305p corresponds to a control terminal of the switch 305, and is connected to the wiring 325. An n-channel transistor 314n corresponds to the switch 314. A first terminal of the transistor 314n corresponds to the first terminal of the switch 314, and is connected to the second terminal of the switch 312. A second terminal of the transistor 314n corresponds to the second terminal of the switch 314, and is connected to the wiring 331. A gate of the transistor 314n corresponds to a control terminal of the switch 314, and is connected to the wiring 325. A p-channel transistor 315p corresponds to the switch 315. A first terminal of the transistor 315p corresponds to the first terminal of the switch 315, and is connected to the wiring 334. A second terminal of the transistor 315p corresponds to the second terminal of the switch 315, and is connected to the wiring 331. A gate of the transistor 315p corresponds to a control terminal of the switch 315, and is connected to the wiring 325. When a signal of the wiring 325 (also referred to as a signal $V_{325}$) is at a high level, the transistor 304n is turned on, the transistor 305p is turned off, the transistor 314n is turned on, and the transistor 305p is turned off. When the signal $V_{325}$ is at a low level, the transistor 304n is turned off, the transistor 305p is turned on, the transistor 314n is turned off, and the transistor 305p is turned on.

The switch 304 and the switch 305 may be transistors with the same polarity. In that case, a gate of a transistor used as the switch 304 is preferably connected to a gate of a transistor used as the switch 305 via an inverter.

The switch 314 and the switch 315 may be transistors with the same polarity. In that case, a gate of a transistor used as the switch 314 is preferably connected to a gate of a transistor used as the switch 315 via an inverter.

In the case where the potential $V_{323}$ is a potential corresponding to the low level of the signal $V_{212}$, an n-channel transistor or a CMOS switch is preferably used as each of the switch 304 and the switch 302. In the case where the potential $V_{323}$ is a potential corresponding to the high level of the signal $V_{212}$, a p-channel transistor or a CMOS switch is preferably used as each of the switch 304 and the switch 302. Since a potential difference between a gate and a source of each of transistors used as the switch 304 and the switch 302 can be large, a resistance value between the wiring 323 and the wiring 321 can be small.

In the case where the potential $V_{333}$ is a potential corresponding to the low level of the signal $V_{212}$, an n-channel transistor or a CMOS switch is preferably used as each of the switch 314 and the switch 312. In the case where the potential $V_{333}$ is a potential corresponding to the high level of the signal $V_{212}$, a p-channel transistor or a CMOS switch is preferably used as each of the switch 314 and the switch 312. Since a potential difference between a gate and a source of each of transistors used as the switch 314 and the switch 312 can be large, a resistance value between the wiring 333 and the wiring 331 can be small.

In the case where the potential $V_{324}$ is a potential corresponding to the high level of the signal $V_{212}$, a p-channel transistor or a CMOS switch is preferably used as the switch 305. In the case where the potential $V_{324}$ is a potential corresponding to the low level of the signal $V_{212}$, an n-channel transistor or a CMOS switch is preferably used as the switch 305. Since a potential difference between a gate and a source of a transistor used as the switch 305 can be large, a resistance value between the wiring 324 and the wiring 321 can be small.

In the case where the potential $V_{334}$ is a potential corresponding to the high level of the signal $V_{212}$, a p-channel transistor or a CMOS switch is preferably used as the switch 315. In the case where the potential $V_{334}$ is a potential corresponding to the low level of the signal $V_{212}$, an n-channel transistor or a CMOS switch is preferably used as the switch 315. Since a potential difference between a gate and a source of a transistor used as the switch 315 can be large, a resistance value between the wiring 334 and the wiring 331 can be small.

For example, a circuit such as a logic circuit, a combinational circuit, or a sequential circuit may be connected to the wiring 321. In other words, the signal $V_{321}$ may be output through a circuit such as a logic circuit, a combinational circuit, or a sequential circuit.

For example, a circuit such as a logic circuit, a combinational circuit, or a sequential circuit may be connected to the wiring 331. In other words, the signal $V_{321}$ may be output through a circuit such as a logic circuit, a combinational circuit, or a sequential circuit.

A content described in this embodiment can be implemented by being combined with any of the other contents described in this embodiment and/or any of contents described in the other embodiments in this specification and the like, as appropriate.

Embodiment 4

In this embodiment, a device of one embodiment of the present invention is described.

Figure 28:
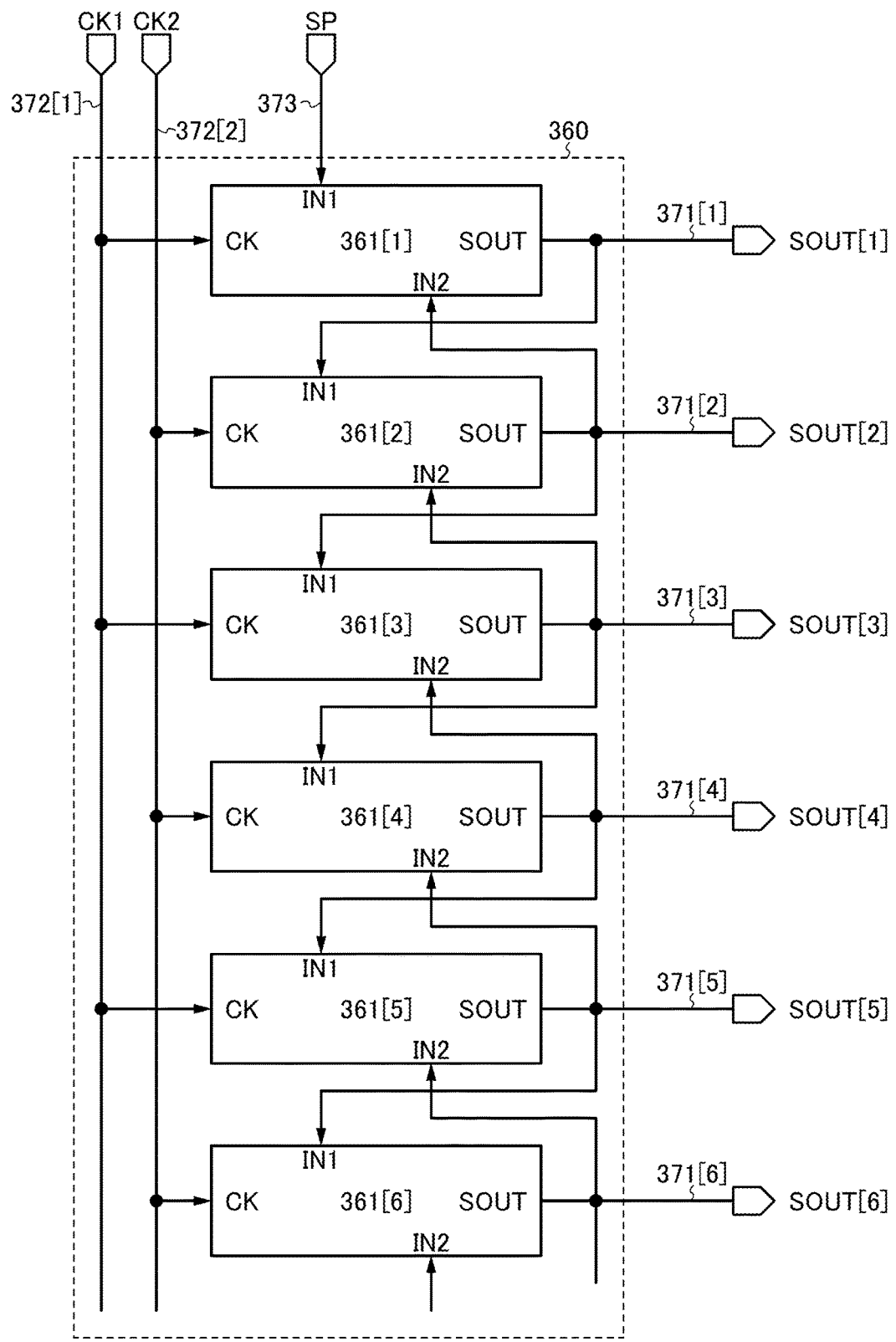
FIG. 28 illustrates a configuration of a device.

FIG. 28 illustrates an example of the structure of a device of one embodiment of the present invention.

A device illustrated in FIG. 28 includes a shift register 360. The shift register 360 is connected to N (N is a natural number of three or more) wirings 371 (also referred to as wirings 371[1] to [N]), two wirings 372 (also referred to as wirings 372[1] and [2]), and a wiring 373. FIG. 28 illustrates only wirings 371 [1] to [6].

The shift register 360 outputs signals SOUT[1] to [N] to the wirings 371[1] to [N], respectively, in accordance with a signal of the wiring 372[1] (a signal CK1), a signal of the wiring 372[2] (a signal CK2), and a signal of the wiring 373 (a signal SP).

An example of the signal CK1 is a clock signal.

An example of the signal CK2 is a clock signal. Note that the signal CK1 and the signal CK2 preferably have different phases.

An example of the signal SP is a start pulse.

The shift register 360 includes N (N is a natural number of three or more) circuits 361 (also referred to as circuits 361[1] to [N]). FIG. 28 illustrates only circuits 361[1] to [6]. The device described in Embodiment 2 or the like can be used as each of the circuits 361[1] to [N]. Note that the circuits 361[1] to [N] each include the device described in Embodiment 1 or the like.

Each of the circuits 361[1] to [N] may be called a stage, a sequential circuit, or a flip flop, for example.

A terminal OUT of the circuit 361[1] is connected to the wiring 371[1], a terminal CK thereof is connected to the wiring 372[1], a terminal IN1 thereof is connected to the wiring 373, and a terminal IN2 thereof is connected to the wiring 372[2]. A terminal SOUT of a circuit 361[i] (i is a natural number of 2 to N−1) is connected to a wiring 371[i], a terminal CK thereof is connected to the wiring 372[1] in each of odd-numbered stages, the terminal CK is connected to the wiring 372[2] in each of even-numbered stages, a terminal IN1 thereof is connected to a wiring 371[i−1], and a terminal IN2 thereof is connected to a wiring 371[i+1]. The circuit 361[N] is different from the circuit 361[i] in that the terminal IN2 is connected to an unillustrated wiring or the wiring 373.

Figure 29:
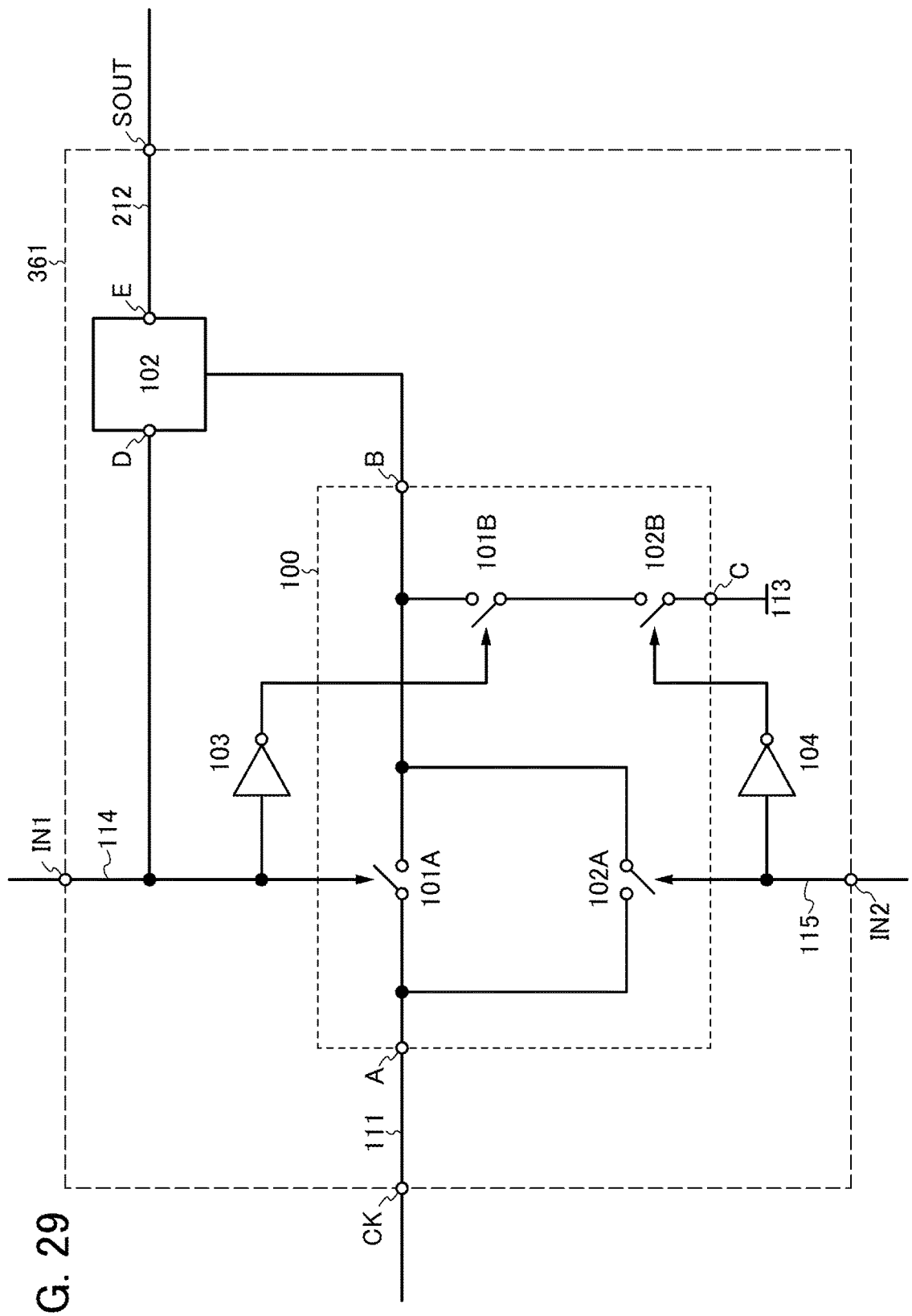
FIG. 29 illustrates a configuration of a device.

As illustrated in FIG. 29, in each of the circuits 361[1] to [N], the terminal SOUT corresponds to the wiring 212, the terminal CK corresponds to the wiring 111, the terminal IN1 corresponds to the wiring 114 or the wiring 211, and the terminal IN2 corresponds to the wiring 115. Accordingly, in the circuit 361[1], the signal SOUT[1] corresponds to the signal $V_{212}$, the signal CK1 corresponds to the signal $V_{111}$, the signal SP corresponds to the signal $V_{114}$ or the signal $V_{211}$, and a signal SOUT[2] corresponds to the signal $V_{115}$. In the circuit 361[i], a signal SOUT[i] corresponds to the signal $V_{212}$, the signal CK1 corresponds to the signal $V_{111}$ in an odd-numbered stage, the signal CK2 corresponds to the signal $V_{111}$ in an even-numbered stage, a signal SOUT[i−1] corresponds to the signal $V_{114}$ or the signal $V_{211}$, and a signal SOUT[i+1] corresponds to the signal $V_{115}$.

Each of the circuits 361[1] to [N] operates as the device described in Embodiment 2, the signals SOUT[1] to [N] can be at a high level (activated) sequentially as illustrated in FIG. 30. Note that time t0 to time t6 in FIG. 30 correspond to the time t0 to the time t6 in the timing chart of the circuit 361[1] in FIG. 15.

The wirings 371[1] to [N] may be connected to the circuits 300 and 310 described in Embodiment 3.

A content described in this embodiment can be implemented by being combined with any of the other contents described in this embodiment and/or any of contents described in the other embodiments in this specification and the like, as appropriate.

Embodiment 5

<Structure Example of Semiconductor Display Device>

Next, a structure example of a semiconductor display device of one embodiment of the present invention is described.

Figure 31A:
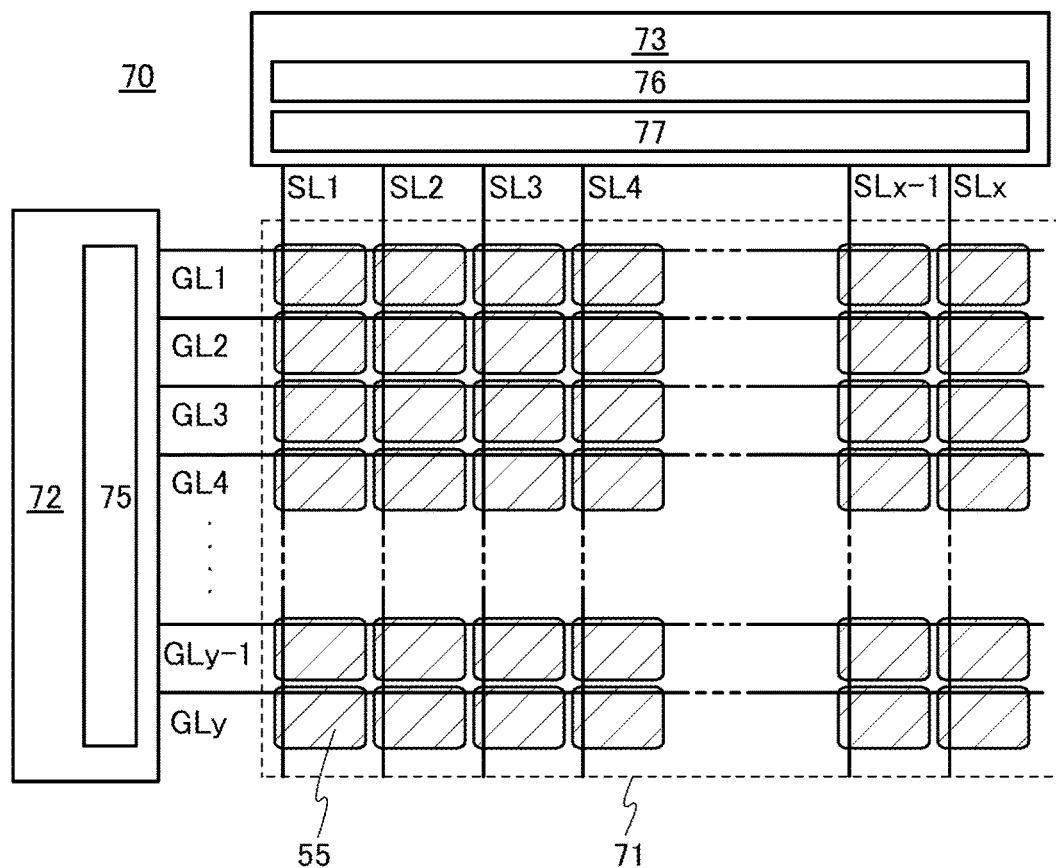
FIGS. 31A to 31C illustrate a configuration of a semiconductor display device.

In a semiconductor display device 70 illustrated in FIG. 31A, a pixel portion 71 includes a plurality of pixels 55, wirings GL (wirings GL1 to GLy, y: a natural number) that correspond to bus lines each selecting the pixels 55 in a row, and wirings SL (wirings SL1 to SLx, x: a natural number) for supplying video signals to the selected pixels 55. The input of signals to the wirings GL is controlled by a driver circuit 72. The input of video signals to the wirings SL is controlled by a driver circuit 73. Each of the plurality of pixels 55 is connected to at least one of the wirings GL and at least one of the wirings SL.

Specifically, the driver circuit 72 includes a shift register 75 that produces signals for sequentially selecting the wirings GL1 to GLy. Moreover, specifically, the driver circuit 73 includes a shift register 76 that sequentially produces signals having pulses and a switching circuit 77 that controls supply of video signals to the wirings SL1 to SLx in accordance with the signals produced in the shift register 76.

As the shift register 75 or 76, any of the devices described in Embodiments 1 to 4 in this specification and the like can be used.

Note that the kinds and number of the wirings in the pixel portion 71 can be determined by the configuration, number, and position of the pixels 55. Specifically, in the pixel portion 71 illustrated in FIG. 31A, the pixels 55 are arranged in a matrix of x columns and y rows, and the wirings SL1 to SLx and the wirings GL1 to GLy are provided in the pixel portion 71 as an example.

Although FIG. 31A illustrates the case where the driver circuits 72 and 73 and the pixel portion 71 are formed over one substrate as an example, the driver circuits 72 and 73 may be formed over a substrate different from a substrate over which the pixel portion 71 is formed.

Figure 31B:
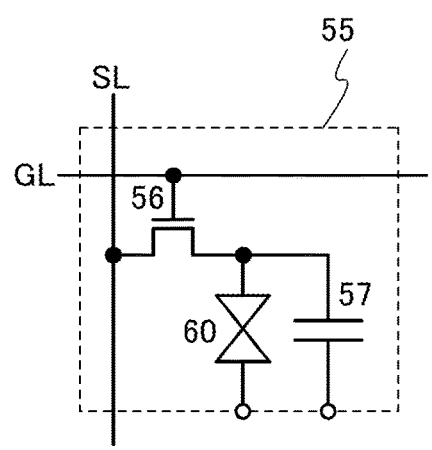

FIG. 31B illustrates an example of a configuration of the pixel 55. Each of the pixels 55 includes a liquid crystal element 60, a transistor 56 that controls the supply of an video signal to the liquid crystal element 60, and a capacitor 57 that holds voltage between a pixel electrode and a common electrode of the liquid crystal element 60. The liquid crystal element 60 includes the pixel electrode, the common electrode, and a liquid crystal layer containing a liquid crystal material to which voltage between the pixel electrode and the common electrode is applied.

The transistor 56 controls whether to supply the potential of the wiring SL to the pixel electrode of the liquid crystal element 60. A predetermined potential is supplied to the common electrode of the liquid crystal element 60.

The connection state between the transistor 56 and the liquid crystal element 60 is specifically described below. In FIG. 31B, a gate of the transistor 56 is connected to any one of the wirings GL1 to GLy. One of a source and a drain of the transistor 56 is connected to any one of the wirings SL1 to SLx, and the other of the source and the drain of the transistor 56 is connected to the pixel electrode of the liquid crystal element 60.

The transmittance of the liquid crystal element 60 changes when the alignment of liquid crystal molecules included in the liquid crystal layer changes in accordance with the level of voltage applied between the pixel electrode and the common electrode. Accordingly, when the transmittance of the liquid crystal element 60 is controlled by the potential of a video signal supplied to the pixel electrode, gray-scale images can be displayed. In each of the plurality of pixels 55 included in the pixel portion 71, the gray level of the liquid crystal element 60 is adjusted in response to a video signal containing image data; thus, an image is displayed on the pixel portion 71.

FIG. 31B illustrates an example in which the one transistor 56 is used as a switch for controlling the input of a video signal to the pixel 55. However, a plurality of transistors functioning as one switch may be used in the pixel 55.

In one embodiment of the present invention, the transistor 56 with an extremely low off-state current is preferably used as the switch for controlling the input of a video signal to the pixel 55. With the transistor 56 having an extremely low off-state current, leakage of charge through the transistor 56 can be prevented. Thus, the potential of a video signal that is supplied to the liquid crystal element 60 and the capacitor 57 can be held more reliably. Accordingly, changes in transmittance of the liquid crystal element 60 due to leakage of charge in one frame period are prevented, so that the quality of an image to be displayed can be improved. Since leakage of charge through the transistor 56 can be prevented when the transistor 56 has a low off-state current, the supply of a power supply potential or a signal to the driver circuits 72 and 73 may be stopped in a period during which a still image is displayed. With the above configuration, the number of times of writing video signals to the pixel portion 71 can be reduced, and thus power consumption of the semiconductor display device can be reduced.

For example, the off-state current of a transistor including a semiconductor film containing an oxide semiconductor is extremely low, and therefore is suitable for the transistor 56, for example.

In addition, the transistor 56 in FIG. 31B may include a pair of gate electrodes overlapping with each other with a semiconductor film provided therebetween. The pair of gate electrodes are electrically connected to each other. In one embodiment of the present invention, the above structure allows the on-state current and the reliability of the transistor 56 to be increased.

Figure 31C:
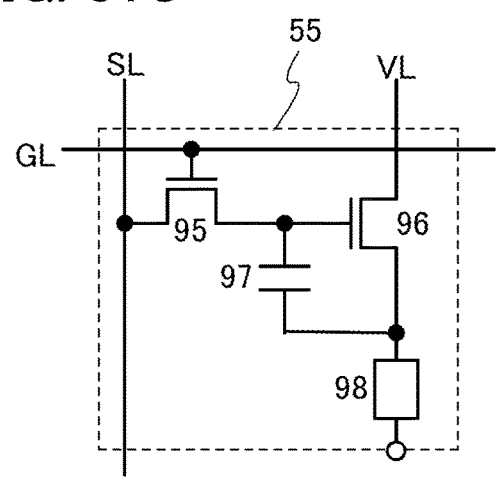

Next, FIG. 31C illustrates another example of the pixel 55. The pixel 55 includes a transistor 95 for controlling input of a video signal to the pixel 55, a light-emitting element 98, a transistor 96 for controlling the value of current supplied to the light-emitting element 98 in response to a video signal, and a capacitor 97 for holding the potential of a video signal.

Examples of the light-emitting element 98 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 98. As electroluminescence, there are luminescence (fluorescence) at the time of returning from a singlet-excited state to a ground state and luminescence (phosphorescence) at the time of returning from a triplet-excited state to a ground state.

The potential of one of the anode and the cathode of the light-emitting element 98 is controlled in response to an video signal input to the pixel 55. The one of the anode and the cathode whose potential is controlled in response to a video signal is used as a pixel electrode, and the other is used as a common electrode. A predetermined potential is supplied to the common electrode of the light-emitting element 98, and the luminance of the light-emitting element 98 is determined by a potential difference between the pixel electrode and the common electrode. Thus, the luminance of the light-emitting element 98 is controlled by the potential of the video signal, so that the light-emitting element 98 can express gray level. In each of the plurality of pixels 55 included in the pixel portion, the gray level of the light-emitting element 98 is adjusted in response to a video signal containing image data; thus, an image is displayed on the pixel portion 71.

Next, connection between the transistor 95, the transistor 96, the capacitor 97, and the light-emitting element 98 that are included in the pixel 55 is described.

One of a source and a drain of the transistor 95 is connected to the wiring SL, and the other is connected to a gate of the transistor 96. A gate of the transistor 95 is connected to the wiring GL. One of a source and a drain of the transistor 96 is connected to a power supply line VL, and the other is connected to the light-emitting element 98. Specifically, the other of the source and the drain of the transistor 96 is connected to one of the anode and the cathode of the light-emitting element 98. A predetermined potential is supplied to the other of the anode and the cathode of the light-emitting element 98.

FIG. 31C illustrates the case where the transistor 96 includes a pair of gate electrodes overlapping with each other with a semiconductor film provided therebetween. The pair of gate electrodes are electrically connected to each other. In one embodiment of the present invention, the above structure allows the on-state current and the reliability of the transistor 96 to be increased.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes at least one of the following, for example: an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element using a carbon nanotube. In addition to the above, a display medium whose contrast, luminance, reflectivity, transmittance, or the like changes by electromagnetic action may be included. Note that examples of display devices including EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Accordingly, power consumption can be further reduced.

For example, in this specification and the like, a transistor can be formed using any of a variety of substrates. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, a base film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thinning can be achieved.

This embodiment can be implemented in appropriate combination with any of the structures described in the other embodiments and the like in this specification and the like.

Embodiment 6

<Configuration of Pixel>

Figure 32:
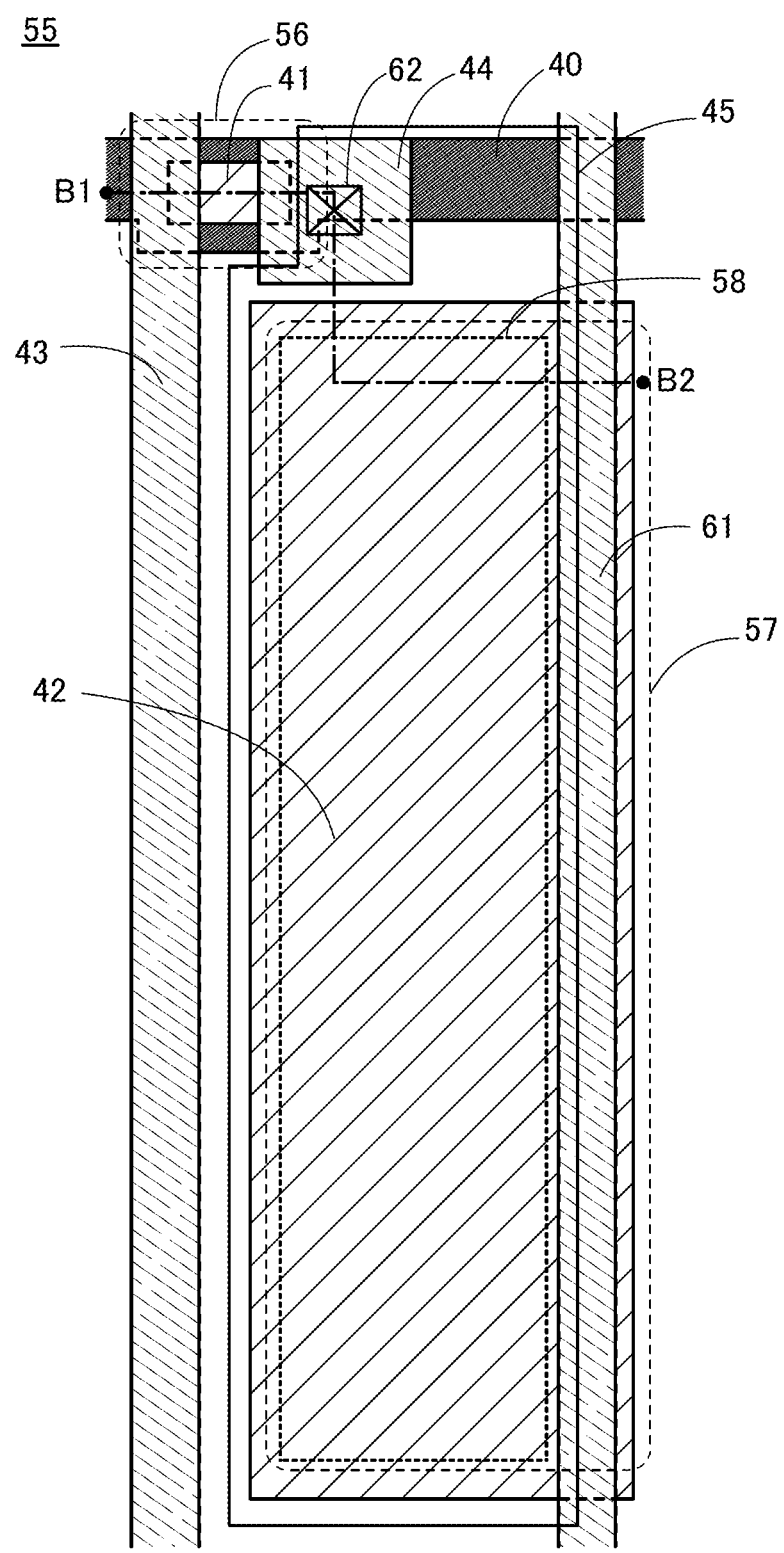
FIG. 32 is a top view of a pixel.
Figure 33:
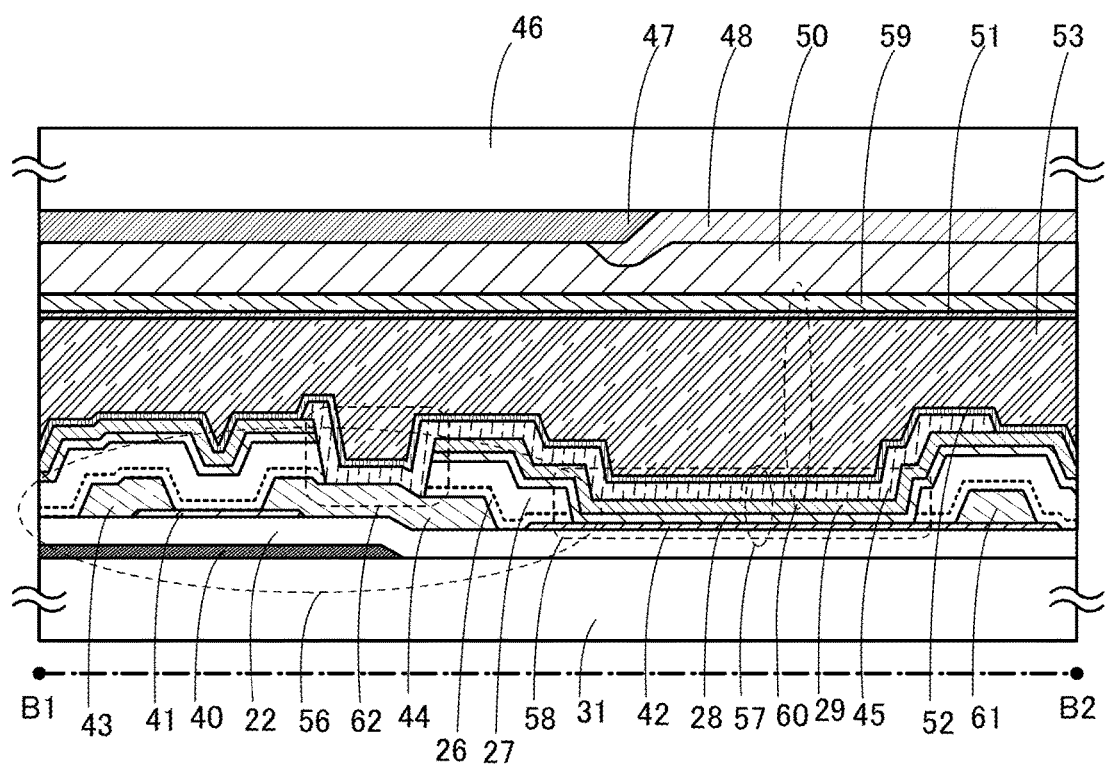
FIG. 33 is a cross-sectional view of a pixel.

Next, description is given of a configuration example of the pixel 55 in a liquid crystal display device that is an example of the semiconductor display device 70 illustrated in FIG. 31A. FIG. 32 illustrates an example of a top view of the pixel 55. Insulating films are not illustrated in FIG. 32 in order to clarify the layout of the pixel 55. FIG. 33 is a cross-sectional view of the liquid crystal display device using an element substrate including the pixel 55 illustrated in FIG. 32. In the liquid crystal display device in FIG. 33, the element substrate including a substrate 31 corresponds to a cross-sectional view along the dashed line B1-B2 in FIG. 32.

The pixel 55 illustrated in FIG. 32 and FIG. 33 includes the transistor 56 and the capacitor 57. In FIG. 33, the pixel 55 includes the liquid crystal element 60.

Over the substrate 31 having an insulating surface, the transistor 56 includes a conductive film 40 serving as a gate electrode, an insulating film 22 that is over the conductive film 40 and serves as a gate insulating film, an oxide semiconductor film 41 that is over the insulating film 22 and overlaps with the conductive film 40, and a conductive film 43 and a conductive film 44 that are electrically connected to the oxide semiconductor film 41 and serve as a source electrode and a drain electrode. The conductive film 40 serves as the wiring GL illustrated in FIG. 31B. The conductive film 43 serves as the wiring SL illustrated in FIG. 31B.

The pixel 55 includes a metal oxide film 42 over the insulating film 22. The metal oxide film 42 is a conductive film that transmits visible light. A conductive film 61 electrically connected to the metal oxide film 42 is provided over the metal oxide film 42. The conductive film 61 serves as a wiring that supplies a predetermined potential to the metal oxide film 42.

The insulating film 22 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In FIG. 33, an insulating film 26 and an insulating film 27 are stacked in this order provided over the oxide semiconductor film 41, the conductive film 43, the conductive film 44, the metal oxide film 42, and the conductive film 61. The transistor 56 may include the insulating films 26 and 27. Although the insulating films 26 and 27, which are stacked in this order, are illustrated in FIG. 33, a single insulating film or a stack of three or more insulating films may be used instead of the insulating films 26 and 27.

An opening 58 is provided in the insulating films 26 and 27 to overlap with the metal oxide film 42. The opening 58 is provided in a region overlapping with the metal oxide film 42, and the oxide semiconductor film 41, the conductive film 43, and the conductive film 44 are not provided in the region.

In FIG. 33, a nitride insulating film 28 and an insulating film 29 are stacked in this order over the insulating film 26 and the insulating film 27 and over the metal oxide film 42 in the opening 58.

Note that by forming an oxide semiconductor film over the insulating film 22 and forming the nitride insulating film 28 to be in contact with the oxide semiconductor film, the conductivity of the oxide semiconductor film can be increased. In that case, the oxide semiconductor film with high conductivity can be used as the metal oxide film 42. The conductivity of the oxide semiconductor film is increased probably because oxygen vacancies are formed in the oxide semiconductor film at the time of forming the opening 58 or the nitride insulating film 28, and hydrogen diffused from the nitride insulating film 28 is bonded to the oxygen vacancies to form a donor. Specifically, the resistivity of the metal oxide film 42 is higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

It is preferable that the metal oxide film 42 have a higher hydrogen concentration than the oxide semiconductor film 41. In the metal oxide film 42, the hydrogen concentration measured by secondary ion mass spectrometry (SIMS) is greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$. In the oxide semiconductor film 41, the hydrogen concentration measured by SIMS is less than $5\times10^{19}$ atoms/cm$^3$, preferably less than $5\times10^{18}$ atoms/cm$^3$, further preferably less than or equal to $1\times10^{18}$ atoms/cm$^3$, still further preferably less than or equal to $5\times10^{17}$ atoms/cm$^3$, yet still further preferably less than or equal to $1\times10^{16}$ atoms/cm$^3$.

For the nitride insulating film 28, silicon nitride, silicon nitride oxide, aluminum nitride, or aluminum nitride oxide can be used, for example. In comparison with an oxide insulating film such as a silicon oxide film and an aluminum oxide film, the nitride insulating film 28 containing any of the above materials can further prevent impurities from the outside, such as water, alkali metal, and alkaline-earth metal, from being diffused into the oxide semiconductor film 41.

Furthermore, an opening 62 is provided in the nitride insulating film 28 and the insulating film 29 to overlap with the conductive film 44. A conductive film 45 that transmits visible light and serves as a pixel electrode is provided over the nitride insulating film 28 and the insulating film 29. The conductive film 45 is electrically connected to the conductive film 44 in the opening 62. The conductive film 45 overlaps with the metal oxide film 42 in the opening 58. A portion where the conductive film 45 and the metal oxide film 42 overlap with each other with the nitride insulating film 28 and the insulating film 29 sandwiched therebetween serves as the capacitor 57.

In the capacitor 57, the metal oxide film 42 and the conductive film 45 serving as a pair of electrodes and the nitride insulating film 28 and the insulating film 29 collectively serving as a dielectric film transmit visible light. This means that the capacitor 57 transmits visible light. Thus, the aperture ratio of the pixel 55 can be higher than that of a pixel including a capacitor having a property of transmitting less visible light. Therefore, the required capacitance for high image quality can be secured; thus, light loss can be reduced in a panel and power consumption of a semiconductor device can be reduced.

Note that as described above, the insulating film 29 is not necessarily provided. However, with the use of the insulating film 29 using an insulator, which has a dielectric constant lower than that of the nitride insulating film 28, as a dielectric film together with the nitride insulating film 28, the dielectric constant of the dielectric film of the capacitor 57 can be adjusted to a desired value without increasing the thickness of the nitride insulating film 28.

An alignment film 52 is provided over the conductive film 45.

A substrate 46 is provided to face the substrate 31. A shielding film 47 blocking visible light and a coloring layer 48 transmitting visible light in a specific wavelength range are provided on the substrate 46. A resin film 50 is provided on the shielding film 47 and the coloring layer 48, and a conductive film 59 serving as a common electrode is provided on the resin film 50. An alignment film 51 is provided on the conductive film 59.

Between the substrates 31 and 46, a liquid crystal layer 53 containing a liquid crystal material is sandwiched between the alignment films 52 and 51. The liquid crystal element 60 includes the conductive film 45, the conductive film 59, and the liquid crystal layer 53.

Although a twisted nematic (TN) mode is used as a method for driving the liquid crystal in FIG. 32 and FIG. 33, the following can be used as a method for driving the liquid crystal: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

In the liquid crystal display device of one embodiment of the present invention, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Further alternatively, a liquid crystal material categorized by a ferroelectric liquid crystal or an anti-ferroelectric liquid crystal can be used. Further alternatively, a liquid crystal material categorized by a high-molecular liquid crystal such as a main-chain high-molecular liquid crystal, a side-chain high-molecular liquid crystal, or a composite-type high-molecular liquid crystal, or a low-molecular liquid crystal can be used. Further alternatively, a liquid crystal material categorized by a polymer dispersed liquid crystal (PDLC) can be used.

Alternatively, liquid crystal exhibiting a blue phase for which an alignment film is unnecessary may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. The liquid crystal composition that includes a liquid crystal exhibiting a blue phase and a chiral material is preferable because it has a small response time of less than or equal to 1 msec, has optical isotropy, which makes the alignment process unneeded, and has a small viewing angle dependence.

Although a liquid crystal display device using a color filter to display a color image is illustrated in FIG. 33 as an example, the liquid crystal display device of one embodiment of the present invention may display a color image by sequentially lighting a plurality of light sources having different hues.

Figure 34A:
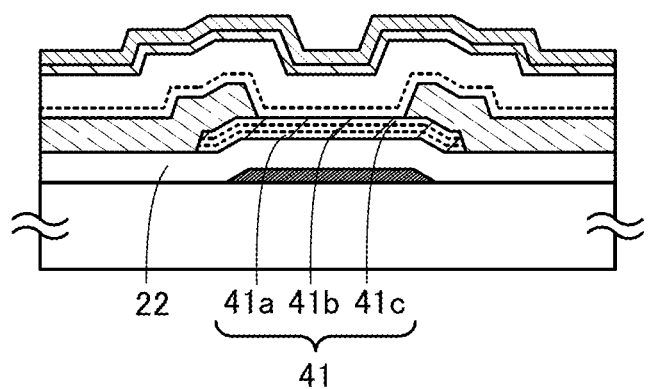
FIGS. 34A and 34B illustrate cross-sectional structures of a transistor.

The oxide semiconductor film 41 of the transistor 56 is not necessarily a single oxide semiconductor film, but may be a stack of a plurality of oxide semiconductor films. FIG. 34A illustrates an example in which the oxide semiconductor film 41 is formed using a stack of three oxide semiconductor films. Specifically, in the transistor 56 in FIG. 34A, oxide semiconductor films 41a, 41b, and 41c are stacked sequentially from the insulating film 22 side as the oxide semiconductor film 41.

The oxide semiconductor films 41a and 41c each contain at least one of metal elements contained in the oxide semiconductor film 41b. The energy at the bottom of the conduction band of the oxide semiconductor films 41a and 41c is closer to a vacuum level than that of the oxide semiconductor film 41b by 0.05 eV or more, 0.07 eV or more, 0.1 eV or more, or 0.15 eV or more and 2 eV or less, 1 eV or less, 0.5 eV or less, or 0.4 eV or less. Furthermore, the oxide semiconductor film 41b preferably contains at least indium in order that the carrier mobility is high.

Figure 34B:
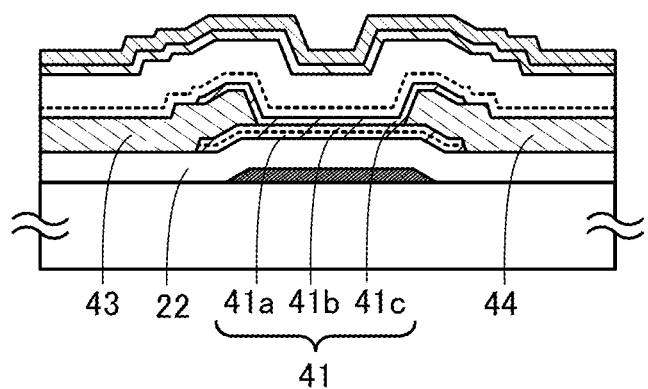

As illustrated in FIG. 34B, the oxide semiconductor film 41c overlapping with the insulating film 22 may be provided over the conductive films 43 and 44.

This embodiment can be implemented in appropriate combination with any of the structures described in the other embodiments and the like in this specification and the like.

Embodiment 7

<Top and Cross-Sectional Views of Semiconductor Display Device>

Figure 35:
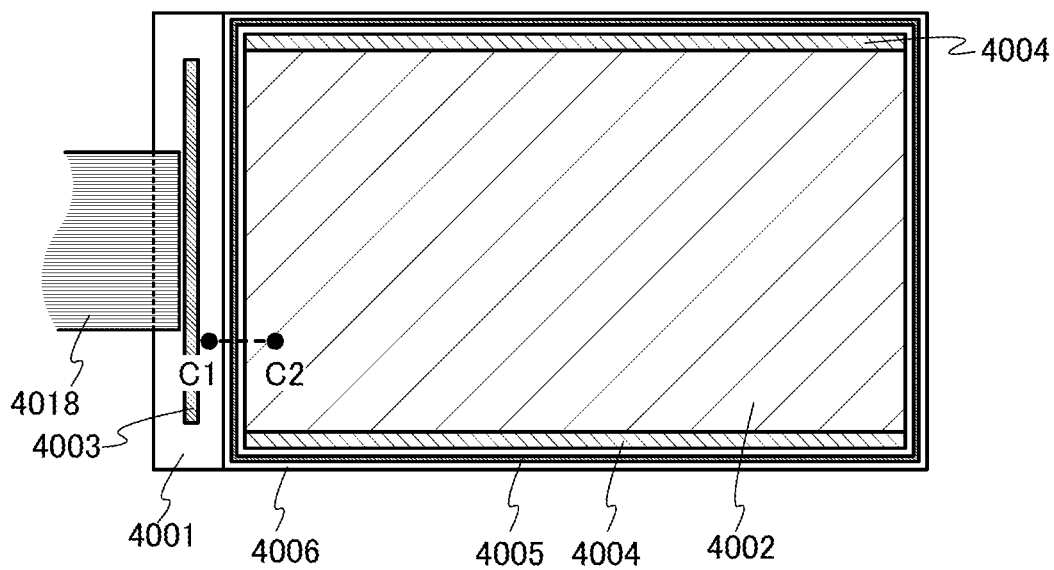
FIG. 35 is a top view of a liquid crystal display device.

The appearance of a semiconductor display device of one embodiment of the present invention is described with reference to FIG. 35. FIG. 35 is a top view of a liquid crystal display device where a substrate 4001 and a substrate 4006 are bonded to each other with a sealant 4005. FIG. 36 corresponds to a cross-sectional view taken along dashed line C1-C2 in FIG. 35.

The sealant 4005 is provided to surround a pixel portion 4002 and a pair of driver circuits 4004 provided over the substrate 4001. The substrate 4006 is provided over the pixel portion 4002 and the driver circuits 4004. Thus, the pixel portion 4002 and the driver circuits 4004 are sealed by the substrate 4001, the sealant 4005, and the substrate 4006.

A driver circuit 4003 is mounted in a region that is different from the region surrounded by the sealant 4005 over the substrate 4001.

A plurality of transistors are included in the pixel portion 4002 and the driver circuits 4004 provided over the substrate 4001. FIG. 36 illustrates a transistor 4010 included in the pixel portion 4002. An insulating film 4020 that can be formed using a variety of insulating films including a nitride insulating film is provided over the transistor 4010. The transistor 4010 is connected to a pixel electrode 4021 over the insulating film 4020 in an opening portion provided in the insulating film 4020.

A resin film 4059 is provided on the substrate 4006, and a common electrode 4060 is provided on the resin film 4059. A liquid crystal layer 4028 between the pixel electrode 4021 and the common electrode 4060 is provided between the substrates 4001 and 4006. A liquid crystal element 4023 includes the pixel electrode 4021, the common electrode 4060, and the liquid crystal layer 4028.

The transmittance of the liquid crystal element 4023 changes when the alignment of liquid crystal molecules included in the liquid crystal layer 4028 changes in accordance with the level of a voltage applied between the pixel electrode 4021 and the common electrode 4060. Accordingly, when the transmittance of the liquid crystal element 4023 is controlled by the potential of a video signal supplied to the pixel electrode 4021, gray-scale images can be displayed.

As illustrated in FIG. 36, in one embodiment of the present invention, the insulating film 4020 is removed at an end portion of the panel. A conductive film 4050 is formed in the region where the insulating film 4020 is removed. The conductive film 4050 and a conductive film serving as a source or a drain of the transistor 4010 can be formed by etching one conductive film.

A resin film 4062 in which conductive particles 4061 having conductivity are dispersed is provided between the substrate 4001 and the substrate 4006. The conductive film 4050 is electrically connected to the common electrode 4060 through the conductive particles 4061. In other words, the common electrode 4060 and the conductive film 4050 are electrically connected to each other through the conductive particle 4061 at the end portion of the panel. The resin film 4062 can be formed using a thermosetting resin or an ultraviolet curable resin. As the conductive particle 4061, a particle of a spherical organic resin coated with thin-film metal of Au, Ni, Co, or the like can be used, for example.

An alignment film is not illustrated in FIG. 36. In the case of providing alignment films on the pixel electrode 4021 and the common electrode 4060, the alignment film on the common electrode 4060 is partly removed and the alignment film on the conductive film 4050 is partly removed; thus, electrical connection can be obtained among the common electrode 4060, the conductive particle 4061, and the conductive film 4050.

Note that in the liquid crystal display device of one embodiment of the present invention, a color image may be displayed by using a color filter or by sequentially turning on a plurality of light sources emitting light with different hues.

Video signals from the driver circuit 4003 and a variety of control signals and potentials from an FPC 4018 are supplied to the driver circuits 4004 or the pixel portion 4002 through lead wirings 4030 and 4031.

This embodiment can be implemented in appropriate combination with any of the structures described in the other embodiments and the like in this specification and the like.

Embodiment 8

In this embodiment, an oxide semiconductor layer that can be used as any of the semiconductor layers of the transistors described in the above embodiments is described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide whose composition is in the neighborhood of the above composition is preferably used.

When an oxide semiconductor film included in the semiconductor layer contains a large amount of hydrogen, hydrogen and the oxide semiconductor are bonded to each other, so that part of hydrogen serves as a donor and causes an electron (carrier). As a result, the threshold voltage of the transistor is shifted in a negative direction. Thus, it is preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is reduced by the dehydration treatment (dehydrogenation treatment) in some cases. Thus, it is preferable that oxygen be added to the oxide semiconductor film to fill oxygen vacancies increased by the dehydration treatment (dehydrogenation treatment). In this specification and the like, supplying oxygen to an oxide semiconductor film is expressed as oxygen adding treatment, and treatment for making the oxygen content of an oxide semiconductor film be in excess of that in the stoichiometric composition is expressed as treatment for making an oxygen-excess state in some cases.

In this manner, hydrogen or moisture is removed from the oxide semiconductor film by dehydration treatment (dehydrogenation treatment) and oxygen vacancies are filled by oxygen adding treatment, so that the oxide semiconductor film can be an intrinsic (i-type) oxide semiconductor film or a substantially intrinsic (i-type) oxide semiconductor film that is extremely close to an i-type oxide semiconductor film. Note that the substantially intrinsic oxide semiconductor film means an oxide semiconductor film that contains extremely few (close to zero) carriers derived from a donor and has a carrier density of lower than or equal to $1 \times 10^{17}/cm^3$, lower than or equal to $1 \times 10^{16}/cm^3$, lower than or equal to $1 \times 10^{15}/cm^3$, lower than or equal to $1 \times 10^{14}/cm^3$, m, or lower than or equal to $1 \times 10^{13}/cm^3$.

In this manner, the transistor including an intrinsic (i-type) or substantially i-type oxide semiconductor film can have extremely favorable off-state current characteristics. For example, the drain current when the transistor including an oxide semiconductor film is off can be less than or equal to $1 \times 10^{-18}$ A, preferably less than or equal to $1 \times 10^{-21}$ A, and more preferably less than or equal to $1 \times 10^{-24}$ A at room temperature (approximately 25° C.); or less than or equal to $1 \times 10^{-15}$ A, preferably less than or equal to $1 \times 10^{-18}$ A, more preferably less than or equal to $1 \times 10^{-21}$ A at 85° C. The off state of a transistor refers to a state where gate voltage is much lower than the threshold voltage in an n-channel transistor. Specifically, when the gate voltage is lower than the threshold voltage by 1 V or more, 2 V or more, or 3 V or more, the transistor is off.

The structure of the oxide semiconductor film is described below.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (also referred to as a formation surface) or a top surface of the CAAC-OS film, and is provided in parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS or a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to deposit an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that an angle formed between two straight lines is −10° to 10°, and accordingly includes the case where the angle is −5° to 5°. The term "substantially parallel" indicates that an angle formed between two straight lines is −30° to 30°. In addition, the term "perpendicular" indicates that an angle formed between two straight lines is 80° to 100°, and accordingly includes the case where the angle is 85° to 95°. The term "substantially perpendicular" indicates that an angle formed between two straight lines is 60° to 120°.

In this specification, trigonal and rhombohedral crystal systems are included in a hexagonal crystal system.

This embodiment can be implemented in appropriate combination with any of the structures described in the other embodiments and the like in this specification and the like.

Embodiment 9

<Structure Example of Electronic Device Using Semiconductor Device>

The semiconductor device of one embodiment of the present invention can be used for display devices, personal computers, or image reproducing devices provided with recording media (typically, devices that include displays, and can reproduce the content of recording media such as digital versatile discs (DVDs) and display the reproduced images). In addition, examples of electronic devices in which the semiconductor device of one embodiment of the present invention can be used include cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. Specific examples of these electronic devices are illustrated in FIGS. 37A to 37F.

Figure 37A:
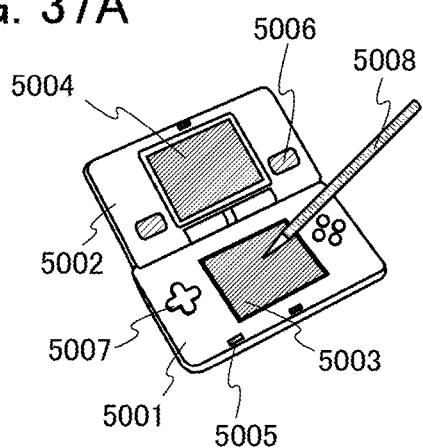
FIGS. 37A to 37F illustrate electronic devices.

FIG. 37A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for the display portion 5003, the display portion 5004, or an integrated circuit in another portion. Note that although the portable game machine in FIG. 37A has the two display portions 5003 and 5004, the number of display portions included in the portable game machine is not limited thereto.

Figure 37B:
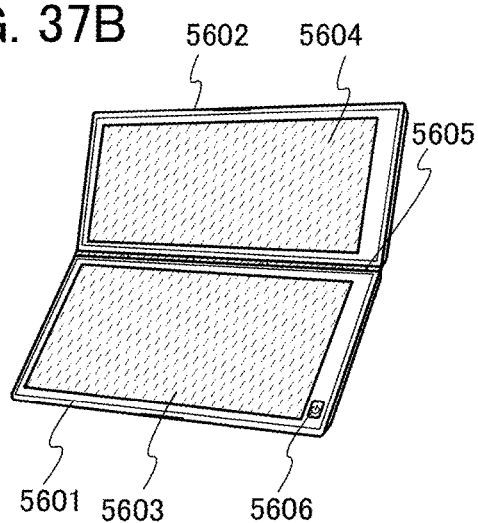

FIG. 37B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. The semiconductor device of one embodiment of the present invention can be used for the first display portion 5603, the second display portion 5604, or an integrated circuit in another portion.

Figure 37C:
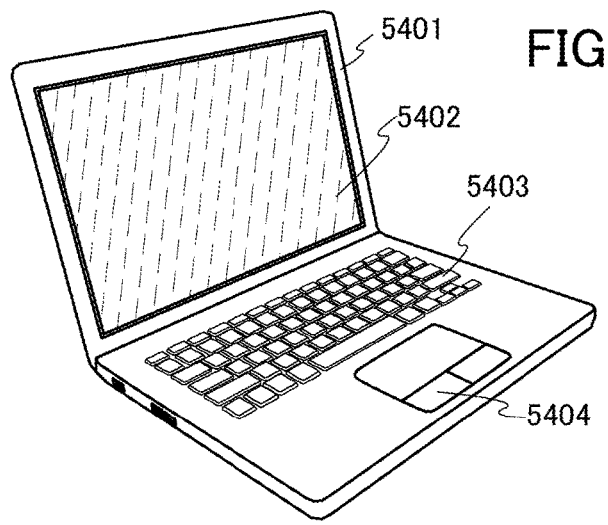

FIG. 37C illustrates a laptop personal computer, which includes a housing 5401, a display portion 5402, a keyboard 5403, a pointing device 5404, and the like. The semiconductor device of one embodiment of the present invention can be used for the display portion 5402 or an integrated circuit in another portion.

Figure 37D:
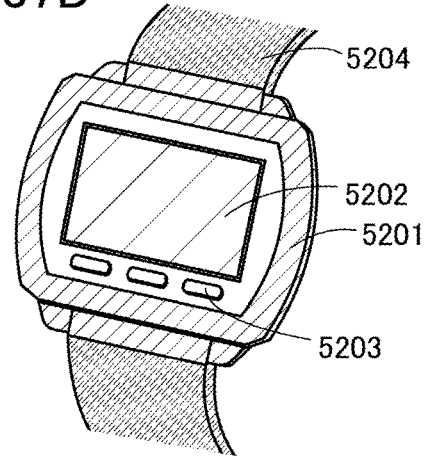

FIG. 37D illustrates a wristwatch, which includes a housing 5201, a display portion 5202, an operation button 5203, a bracelet 5204, and the like. The semiconductor device of one embodiment of the present invention can be used for the display portion 5202 or an integrated circuit in another portion.

Figure 37E:
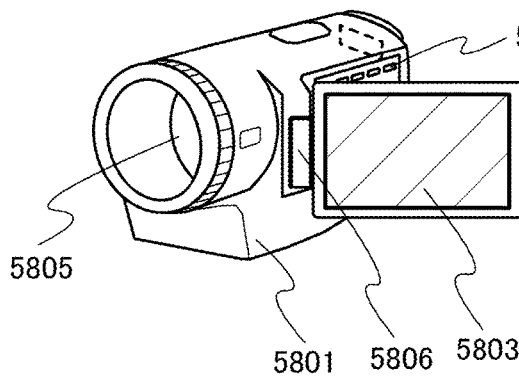

FIG. 37E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 is connected to the second housing 5802 with the joint 5806, and the angle between the first housing 5801 and the second housing 5802 can be changed at the joint 5806. Images on the display portion 5803 may be switched in accordance with the angle at the joint 5806 between the first housing 5801 and the second housing 5802. The semiconductor device of one embodiment of the present invention can be used for the display portion 5803 or an integrated circuit in another portion.

Figure 37F:
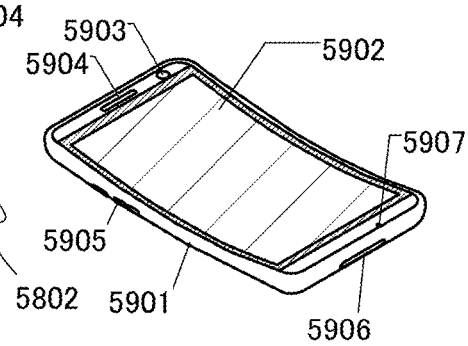

FIG. 37F illustrates a cellular phone. In the cellular phone, a display portion 5902, a microphone 5907, a speaker 5904, a camera 5903, an external connection portion 5906, and an operation button 5905 are provided in a housing 5901. The semiconductor device of one embodiment of the present invention can be used for the display portion 5902 or an integrated circuit in another portion. When the semiconductor device of one embodiment of the present invention is provided over a flexible substrate, the semiconductor device can be used as the display portion 5902 having a curved surface, as illustrated in FIG. 37F.

Note that what is described (or part thereof) in one embodiment can be applied to, combined with, or replaced with different contents in the embodiment and/or what is described (or part thereof) in another embodiment or other embodiments.

Note that in each embodiment, what is described in the embodiment is contents described with reference to a variety of diagrams or contents described with text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed and part of the range is removed, whereby one embodiment of the invention can be constituted excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

REFERENCE NUMERALS

22: insulating film, 26: insulating film, 27: insulating film, 28: nitride insulating film, 29: insulating film, 31: substrate, 40: conductive film, 41: oxide semiconductor film, 41a: oxide semiconductor film, 41b: oxide semiconductor film, 41c: oxide semiconductor film, 42: metal oxide film, 43: conductive film, 44: conductive film, 45: conductive film, 46: substrate, 47: shielding film, 48: coloring layer, 50: resin film, 51: alignment film, 52: alignment film, 53: liquid crystal layer, 55: pixel, 56: transistor, 57: capacitor, 58: opening, 59: conductive film, 60: liquid crystal element, 61: conductive film, 62: opening, 70: semiconductor display device, 71: pixel portion, 72: driver circuit, 73: driver circuit, 75: shift register, 76: shift register, 77: switching circuit, 95: transistor, 96: transistor, 97: capacitor, 98: light-emitting element, 100: circuit, 101A: switch, 101An: transistor, 101Ap: transistor, 101B: switch, 101Bn: transistor, 101Bp: transistor, 102A: switch, 102An: transistor, 102Ap: transistor, 102B: switch, 102Bn: transistor, 102Bp: transistor, 103: inverter, 103A: NAND circuit, 104: inverter, 104A: NAND circuit, 105: switch, 105n: transistor, 106: switch, 106p: transistor, 107: switch, 111: wiring, 112: wiring, 113: wiring, 114: wiring, 115: wiring, 116: wiring, 117: wiring, 200: circuit, 201: clocked inverter, 202: clocked inverter, 203: inverter, 204: inverter, 205: NAND circuit, 206: NAND circuit, 207: NAND circuit, 208: NAND circuit, 211: wiring, 212: wiring, 220: circuit, 221: switch, 222: switch, 300: circuit, 301: switch, 301n: transistor, 301p: transistor, 302: switch, 302n: transistor, 302p: transistor, 303: inverter, 304: switch, 304n: transistor, 305: switch, 305p: transistor, 310: circuit, 311: switch, 311n: transistor, 311p: transistor, 312: switch, 312n: transistor, 312p: transistor, 313: inverter, 314: switch, 314n: transistor, 315: switch, 315p: transistor, 320: circuit, 321: wiring, 322: wiring, 323: wiring, 324: wiring, 325: wiring, 331: wiring, 332: wiring, 333: wiring, 334: wiring, 360: shift register, 361: circuit, 371: wiring, 372: wiring, 373: wiring, 4001: substrate, 4002: pixel portion, 4003: driver circuit, 4004: driver circuit, 4005: sealant, 4006: substrate, 4010: transistor, 4018: FPC, 4020: insulating film, 4021: pixel electrode, 4023: liquid crystal element, 4028: liquid crystal layer, 4030: wiring, 4050: conductive film, 4059: resin film, 4060: common electrode, 4061: conductive particle, 4062: resin film, 5001: housing, 5002: housing, 5003: display portion, 5004: display portion, 5005: microphone, 5006: speaker, 5007: operation key, 5008: stylus, 5201: housing, 5202: display portion, 5203: operation button, 5204: bracelet, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint, 5901: housing, 5902: display portion, 5903: camera, 5904: speaker, 5905: button, 5906: external connection portion, 5907: microphone This application is based on Japanese Patent Application serial no. 2014-055824 filed with Japan Patent Office on Mar. 19, 2014, the entire contents of which are hereby incorporated by reference.

The invention claimed is:

1. A semiconductor device comprising a shift register,
    wherein the shift register comprises a plurality of stages,
    wherein one of the plurality of stages comprises a first switch, a second switch, a third switch, a fourth switch, a first transistor, and a sequential circuit,
    wherein the first switch and the second switch are electrically connected to each other in parallel between a first wiring and a second wiring,
    wherein the third switch, the fourth switch, and the first transistor are electrically connected to one another in series between a third wiring and the second wiring,
    wherein a clock signal is input to the first wiring,
    wherein a potential corresponding to one of a high level and a low level of the clock signal is input to the third wiring,
    wherein on/off of the first switch and the third switch is controlled in accordance with a first signal,
    wherein on/off of the second switch and the fourth switch is controlled in accordance with a second signal, and
    wherein the sequential circuit holds the first signal or the second signal in accordance with a third signal of the second wiring.

2. The semiconductor device according to claim 1,
    wherein the first signal is an output signal from a previous stage of the one stage, and
    wherein the second signal is an output signal from a subsequent stage of the one stage.

3. The semiconductor device according to claim 1,
    wherein the first signal is input to the third switch via a first inverter, and
    wherein the second signal is input to the fourth switch via a second inverter.

4. The semiconductor device according to claim 1,
    wherein the first signal is input to the third switch via a first NAND circuit, and wherein the second signal is input to the fourth switch via a second NAND circuit.

5. The semiconductor device according to claim 1, wherein when the first wiring and the second wiring are in conduction, the third wiring and the second wiring are in non-conduction.

6. The semiconductor device according to claim 1, further comprising a second transistor,
wherein one terminal of the third switch is electrically connected to one of a source and a drain of the first transistor, and
wherein the other of the source and the drain of the first transistor is electrically connected to one of a source and a drain of the second transistor.

7. A semiconductor device comprising a shift register,
wherein the shift register comprises a plurality of stages,
wherein one of the plurality of stages comprises a first switch, a second switch, a third switch, a fourth switch, a first transistor, a second transistor, and a sequential circuit,
wherein the first switch and the second switch are electrically connected to each other in parallel between a first wiring and a second wiring,
wherein the third switch, the fourth switch, and the first transistor are electrically connected to one another in series between a third wiring and the second wiring,
wherein a fourth wiring and the second wiring are connected via the second transistor,
wherein a gate of the first transistor is electrically connected to a gate of the second transistor,
wherein a clock signal is input to the first wiring,
wherein a potential corresponding to one of a high level and a low level of the clock signal is input to the third wiring,
wherein a potential corresponding to the other of the high level and the low level of the clock signal is input to the fourth wiring,
wherein on/off of the first switch and the third switch is controlled in accordance with a first signal,
wherein on/off of the second switch and the fourth switch is controlled in accordance with a second signal, and
wherein the sequential circuit holds the first signal or the second signal in accordance with a third signal of the second wiring.

8. The semiconductor device according to claim 7,
wherein the first signal is an output signal from a previous stage of the one stage, and
wherein the second signal is an output signal from a subsequent stage of the one stage.

9. The semiconductor device according to claim 7,
wherein the first signal is input to the third switch via a first inverter, and
wherein the second signal is input to the fourth switch via a second inverter.

10. The semiconductor device according to claim 7,
wherein the first signal is input to the third switch via a first NAND circuit, and
wherein the second signal is input to the fourth switch via a second NAND circuit.

11. The semiconductor device according to claim 7, wherein when the first wiring and the second wiring are in conduction, the third wiring and the second wiring are in non-conduction.

12. A semiconductor device comprising a stage,
wherein the stage comprises a first switch, a second switch, a third switch, and a fourth switch, a first transistor,
wherein the first switch and the second switch are electrically connected to each other in parallel between a first wiring and a second wiring,
wherein the third switch, the fourth switch, and the first transistor are electrically connected to one another in series between a third wiring and the second wiring,
wherein a control terminal of the first switch is electrically and directly connected to a fourth wiring and a control terminal of the third switch is electrically connected to the fourth wiring via a first inverter, and
wherein a control terminal of the second switch is electrically and directly connected to a fifth wiring and a control terminal of the fourth switch is electrically connected to the fifth wiring via a second inverter.

13. The semiconductor device according to claim 12,
wherein a clock signal is input to the first wiring, and
wherein a potential corresponding to one of a high level and a low level of the clock signal is input to the third wiring.

14. The semiconductor device according to claim 12,
wherein the fourth wiring outputs a first signal as an output signal from a previous stage of the stage, and
wherein the fifth wiring outputs a second signal as an output signal from a subsequent stage of the stage.

15. The semiconductor device according to claim 12, wherein when the first wiring and the second wiring are in conduction, the third wiring and the second wiring are in non-conduction.

16. The semiconductor device according to claim 12, further comprising a second transistor,
wherein one terminal of the third switch is electrically connected to one of a source and a drain of the first transistor, and
wherein the other of the source and the drain of the first transistor is electrically connected to one of a source and a drain of the second transistor.

* * * * *